(12) United States Patent  (10) Patent No.: US 7,511,997 B2
Toda  (45) Date of Patent: Mar. 31, 2009

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/360,536

(22) Filed: Feb. 24, 2006

(65) Prior Publication Data

US 2006/0209593 A1    Sep. 21, 2006

(30) Foreign Application Priority Data

Mar. 18, 2005 (JP) ............................ 2005-079443

(51) Int. Cl.
  *G11C 11/34*  (2006.01)
(52) U.S. Cl. ................................. 365/185.03
(58) Field of Classification Search ............. 365/185.03
  See application file for complete search history.

(56) References Cited

U.S. PATENT DOCUMENTS

| | | | |
|---|---|---|---|
| 6,288,935 | B1 | 9/2001 | Shibata et al. |
| 6,807,096 | B2 | 10/2004 | Toda |
| 6,847,555 | B2 * | 1/2005 | Toda ..................... 365/185.21 |
| 2001/0005328 | A1 * | 6/2001 | Tsunesada ............. 365/185.03 |
| 2004/0080979 | A1 * | 4/2004 | Park ...................... 365/185.03 |
| 2006/0209593 | A1 | 9/2006 | Toda |

FOREIGN PATENT DOCUMENTS

| | | |
|---|---|---|
| JP | 10-92186 | 4/1998 |
| JP | 2004-206833 | 7/2004 |
| JP | 2004-319007 | 11/2004 |

OTHER PUBLICATIONS

U.S. Appl. No. 11/692,501, filed Mar. 28, 2007, Edahiro, et al.
U.S. Appl. No. 11/561,194, filed Nov. 17, 2006, Toda.

* cited by examiner

*Primary Examiner*—Amir Zarabian
*Assistant Examiner*—Anthan T Tran
(74) *Attorney, Agent, or Firm*—Oblon, Spivak, McClelland, Maier & Neustadt, P.C.

(57) ABSTRACT

A semiconductor memory device includes a memory cell array with memory cells arranged therein, each memory cell being settable to have one of plural physical quantity levels, simultaneously selected two memory cells constituting a pair cell serving as a data storage unit, wherein each memory cell is set to have one in N (where N is an integer equal to three or more) physical quantity levels, and each pair cell is set to have different physical quantity levels in two memory cells therein, thereby storing M-value data defined by $M=2^n$ (where M>N and "n" is an integer equal to two or more), the M-value data being defined by such M combination states that differences of the physical quantity levels in the two memory cells are different from each other.

14 Claims, 54 Drawing Sheets

Level Relationships
Viewed Based on Word Line Level

Level Relationships
Viewed Based on Vss

Level Relationships
Viewed Based on Word Line Level $\beta = 2 \times \Delta \quad \delta = 0 \quad \gamma = \Delta$

FIG. 13

| | Data State A<br>C-cell — T-cell<br>L2    L0 | Data State B<br>C-cell — T-cell<br>L2    L1 | Data State C<br>C-cell — T-cell<br>L1    L2 | Data State D<br>C-cell — T-cell<br>L0    L2 |
|---|---|---|---|---|
| t1 | 1 | 1 | 0 | 0 |
| t2T | 1 | 0 | 0 | 0 |
| t2C | 1 | 1 | 1 | 0 |
| | (1, 1) | (1, 0) | (0, 1) | (0, 0) |

Level Relationships
Viewed Based on Word Line Level

Level Relationships
Viewed Based on Word Line Level

FIG. 21  Level Relationships Viewed Based on Vss

Level Relationships
Viewed Based on Word Line Level

Level Relationships Viewed Based on Vss

Level Relationships
Viewed Based on Word Line Level

FIG. 27 Level Relationships Viewed Based on Vss

|    | t1 |   | t2T |   | t2C |   |
|----|----|----|-----|----|-----|----|
| HB | 0  | 1  | 0   | 1  | 0   | 1  |
| LB |    |    | 0   | 1  | 0 1 0 1 | |

|    | vp0(1) | vp0(2) |
|----|--------|--------|
| HB | 1      |        |
| LB |        | 0      |

↓ T-cell array Verify-erase    ↓ C-cell array Verify-erase

| | vp1 | | vp2 | |
|---|---|---|---|---|
| HB | 0 | 1 | 0 | 1 |
| LB | | | 0 1 0 1 | |

Verify – erase System

Verify – write System

FIG. 47

| | vp1 | vp2 | vp3 | vp4 |
|---|---|---|---|---|
| HB | 0 | 1 | 0 | 1 |
| MB | | 0 1 | 0 1 | 0 1 |
| LB | | 0 1 | 0 1 0 1 | 0 1 0 1 |

FIG. 49

| (HB, LB) | t1 | t2T | t2C |
|---|---|---|---|
| (1, 1) | 1 | 0 | 1 |
| (0, 1) | 0 | 0 | 1 |
| (1, 0) | 1 | 1 | 1 |
| (0, 0) | 0 | 0 | 0 |

FIG. 51

| (HB, MB, LB) | t1 | t2T | t2C | t3T | t3C | t4T | t4C |
|---|---|---|---|---|---|---|---|
| (1, 1, 0) | 1 | 0 | 1 | 0 | 1 | 0 | 1 |
| (0, 1, 0) | 0 | 0 | 1 | 0 | 1 | 0 | 1 |
| (1, 1, 1) | 1 | 1 | 1 | 0 | 1 | 0 | 1 |
| (0, 1, 1) | 0 | 0 | 0 | 0 | 1 | 0 | 1 |
| (1, 0, 1) | 1 | 1 | 1 | 1 | 1 | 0 | 1 |
| (0, 0, 1) | 0 | 0 | 0 | 0 | 0 | 0 | 1 |
| (1, 0, 0) | 1 | 1 | 1 | 1 | 1 | 1 | 1 |
| (0, 0, 0) | 0 | 0 | 0 | 0 | 0 | 0 | 0 |

FIG. 55

|  | Three Levels/cell<br>—Four Values/Pair<br>cell (Part 3) | Five Levels/cell<br>—Eight Values/Pair<br>cell (Part 3) |
|---|---|---|
|  | CLK, /CLK<br>Effective Period | CLK, /CLK<br>Effective Period |
| HB | t1 | t1 |
| MB | — | t3T + t3C |
| LB | t2T + t2C | t2T + t2C + t4T + t4C |

FIG. 56

|  | vp1 | vp2 |
|---|---|---|
| HB | 0      1 | 0      1 |
| LB | 0  1  0  1 | 0  1  0  1 |

FIG. 57

| | vp1 | vp2 | vp3 | vp4 |
|---|---|---|---|---|
| HB | 0 1 | 0 1 | 0 1 | 0 1 |
| MB | | 0 1 0 1 | 0 1 0 1 | 0 1 0 1 |
| LB | | | 0 1 0 1 | 0 1 0 1 0 1 0 1 |

SEMICONDUCTOR MEMORY DEVICE

CROSS-REFERENCE TO RELATED APPLICATION

This application is based on and claims the benefit of priority from the prior Japanese Patent Application No. 2005-079443, filed on Mar. 18, 2005, the entire contents of which are incorporated herein by reference.

BACKGROUND OF THE INVENTION

1. Field of the Invention

This invention relates to a semiconductor memory device, EEPROM, which is formed with electrically rewritable and non-volatile memory cells arranged.

2. Description of Related Art

EEPROM flash memories are roughly classified into two types, i.e., NAND-type and NOR-type. A NAND-type flash memory uses a NAND string (i.e., NAND cell unit) with plural cells connected in series as sharing sources and drains with the neighboring cells. Due to this fact, the NAND-type flash memory has a higher cell density than a NOR-type flash memory. In addition, since NAND-type flash memory is able to be written into plural cells at a time by FN tunneling, power consumption thereof is small. In consideration of these characteristics, the NAND-type flash memory is generally applied to a file memory with a large scale capacitance.

On the other hand, NOR-type flash memory is characterized in that it is high-speed accessible, while the power consumption is large because hot electron injection is used for data writing. Therefore, the NOR-type flash memory is mainly applied to mobile devices.

Recent mobile devices are going to treat image data and the like with large data quantities. Accordingly, it is required of a flash memory to have high-speed accessibility and a large capacitance like a file memory. As described above, a conventional NAND-type flash memory, cell current of which is small due to its NAND string structure, is not suitable for high-speed random accessing. To apply a NAND-type flash memory to a high-speed system with a buffer memory such as a DRAM or the like, such a method is used as, for example, to read out one page data to a page buffer, then serially transfer and output the read out data, thereby improving a data transmission rate.

Even if the above-described method is used, the performance improvement of the conventional NAND flash memory is limited. The reason of this can be said as follows. It is impossible to use a reference level for high-speed sensing because the cell current of the NAND-type flash memory is about $1/100$ to $1/10$ of that of the NOR-type flash memory. The sense amplifier used in the conventional NAND flash memory is configured to sense cell data by sensing whether the data charge in the latch is discharged or not in response to the on/off state of a selected cell. Therefore, it takes about a few or several micro seconds for data reading. In contrast to this, in the NOR-type flash memory, the cell dada read may be done in 10 to 100 [nsec].

One approach for increasing the cell current of the NAND-type flash memory is to make the cell size (i.e., channel width) large. However, this approach will dilute a property of the NAND-type flash memory as the unit cell area is small.

It has already been provided to use a multi-value data storage scheme in order to make a flash memory able to store a large data quantity. It has also been provided a method for shortening read time by reducing the number of data read steps in a case that multi-value storage scheme is used (see, e.g., Unexamined Japanese Patent Application Publication No. 2001-93288).

Further, it has already been provided a memory device, in which two memory cells coupled to a bit line pair and simultaneously selected constitute a pair cell, and the pair cell stores multi-value data defined by a combination of different threshold voltages (for example, Unexamined Japanese Patent Application Publication No. 2004-319007).

SUMMARY OF THE INVENTION

According to an aspect of the present invention, there is provided a semiconductor memory device including a memory cell array with memory cells arranged therein, each memory cell being settable to have one of plural physical quantity levels, simultaneously selected two memory cells constituting a pair cell serving as a data storage unit, wherein each memory cell is set to have one in N (where N is an integer equal to three or more) physical quantity levels, and each pair cell is set to have different physical quantity levels in two memory cells therein, thereby storing M-value data defined by $M=2^n$ (where M>N and "n" is an integer equal to two or more), the M-value data being defined by such M combination states that differences of the physical quantity levels in the two memory cells are different from each other.

According to another aspect of the present invention, there is provided a semiconductor memory device including a memory cell array with a plurality of electrically rewritable and non-volatile memory cells arranged therein, each memory cell being settable to have one of plural threshold levels, simultaneously selected two memory cells constituting a pair cell serving as a data storage unit; and a plurality of sense units coupled to the respective pair cells simultaneously selected in the memory cell array, wherein each pair cell is written into such a state that two memory cells therein have different threshold levels from each other to store M-value data defined by $M=2^n$ (where "n" is an integer equal to two or more), the M-value data being defined by such M combination states that differences of the threshold levels in the two memory cells are different from each other;

main page addresses and sub-page addresses are set in the memory cell array, the main page addresses being set for selecting a set of pair cells corresponding to the number of sense units, the sub-page addresses being set for selecting n-bit data in each main address; and n-bit data in the M-value data are assigned in such a manner that the sub-page addresses are accessible independently from each other in a main page address at a read time.

BRIEF DESCRIPTION OF THE DRAWINGS

FIG. 13 shows data transition states through read steps.

FIG. 47 shows data transition states in the write mode.

FIG. 49 shows data transition states in the read mode.

FIG. 51 shows data transition states in the read mode.

FIG. 55 is a diagram for explaining the read operation in the three levels/cell-four values/pair cell scheme (part 3) and the five levels/cell-eight values/pair cell scheme (part 3).

FIG. 56 shows data transition states in data write mode in the three levels/cell-four values/pair cell scheme (part 3).

FIG. 57 shows data transition states in data write mode in the five levels/cell-eight values/pair cell scheme (part 3).

DETAILED DESCRIPTION OF THE EMBODIMENTS

Illustrative embodiments of this invention will be explained with reference to the accompanying drawings below.

In a flash memory in accordance with an embodiment, one memory cell stores N (where N is 3 or more) physical quantity levels (i.e., data levels), and two memory cells coupled to a pair of bit lines and simultaneously selected constitute a pair cell serving as a data storage unit for storing multi-value data. In detail, each pair cell stores M-value data, where $M=2^n$ (n is an integer equal to 2 or more), in such a manner that two memory cells thereof store different physical quantity levels and the M-value data is defined by combination states of the different physical quantity levels.

By use of the above-described combination of the pair cell scheme and the multi-value storage scheme, it is able to achieve a NAND memory system with a high-speed performance while bit density thereof is maintained at a high level. Especially, it is preferable in a data read mode to use a current detecting-type differential amplifier for detecting a difference of cell currents flowing in the pair of bit lines, to which the pair cell is coupled. This sense scheme achieves high-speed data read, and may secure a sufficient data margin even if gaps between data levels are set to be small.

[Memory Chip Configuration]

Figure 1:
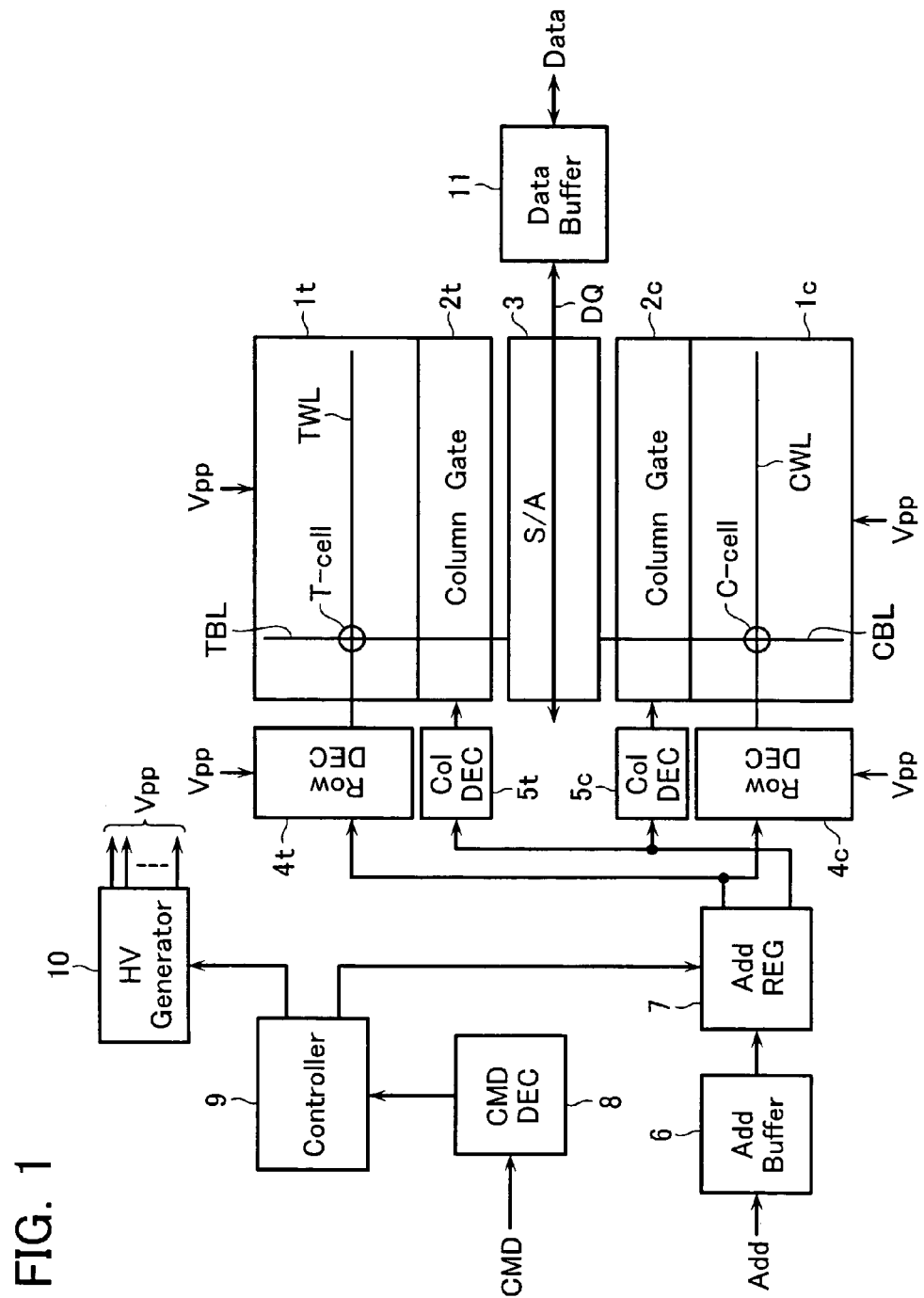
FIG. 1 shows a functional block of a NAND flash memory in accordance with an embodiment of the invention.

FIG. 1 shows a configuration of a NAND-type flash memory according to an embodiment. A memory cell array 1 is formed of two cell arrays 1t and 1c which share a sense amplifier circuit 3 with each other. The corresponding two bit lines, TBL and CBL, which are simultaneously selected, constitute a pair. That is, an open bit line scheme is used in this embodiment.

Two memory cells (i.e., a true cell, T-cell, and a complementary cell, C-cell) selected by the two bit lines TBL, CBL and two word lines TWL, CWL, which are simultaneously selected from the cell arrays 1t, 1c respectively, constitute a pair-cell or "cell-pair" (complementary cells) for storing different level data from each other.

The reason of why the open-bit line scheme is used in this embodiment is in the fact that it is, as described later, required to apply different voltages to the word lines TWL, CWL simultaneously selected during data read and data write. The bit lines TBL, CBL are selected by column gates 2t, 2c to be connected to the sense amplifier circuit 3, respectively. Data communication between a data line DL disposed in the sense amp circuit region and an external input/output terminal is performed via a data buffer 11.

The column gates 2t, 2c, which are disposed between the cell arrays 1t, 1c and the sense amplifier circuit 3, are controlled by column decoders 5t, 5c, respectively. The word lines of the cell arrays 1t, 1c are controlled by row decoders 4t, 4c, respectively.

Address signals Add are supplied to the row decoders 4t, 4c and column decoders 5t, 5c via an address buffer 6 and an address register 7.

Command data CMD is decoded in a command decoder 8 to be supplied to a controller 9. The controller 9 is prepared to perform sequential controls for data read, write and erase.

It is necessary to generate some kinds of high voltages Vpp (e.g., write pulse voltage Vpgm, verify voltage Vr, pass voltages Vpass, Vread and the like) which are to be supplied to cell arrays 1t, 1c and row decoders 4t, 4c corresponding to operation modes. For this purpose, a high voltage generation circuit 10 is prepared and controlled by the controller 9 to generate these high voltages Vpp.

Figure 2:
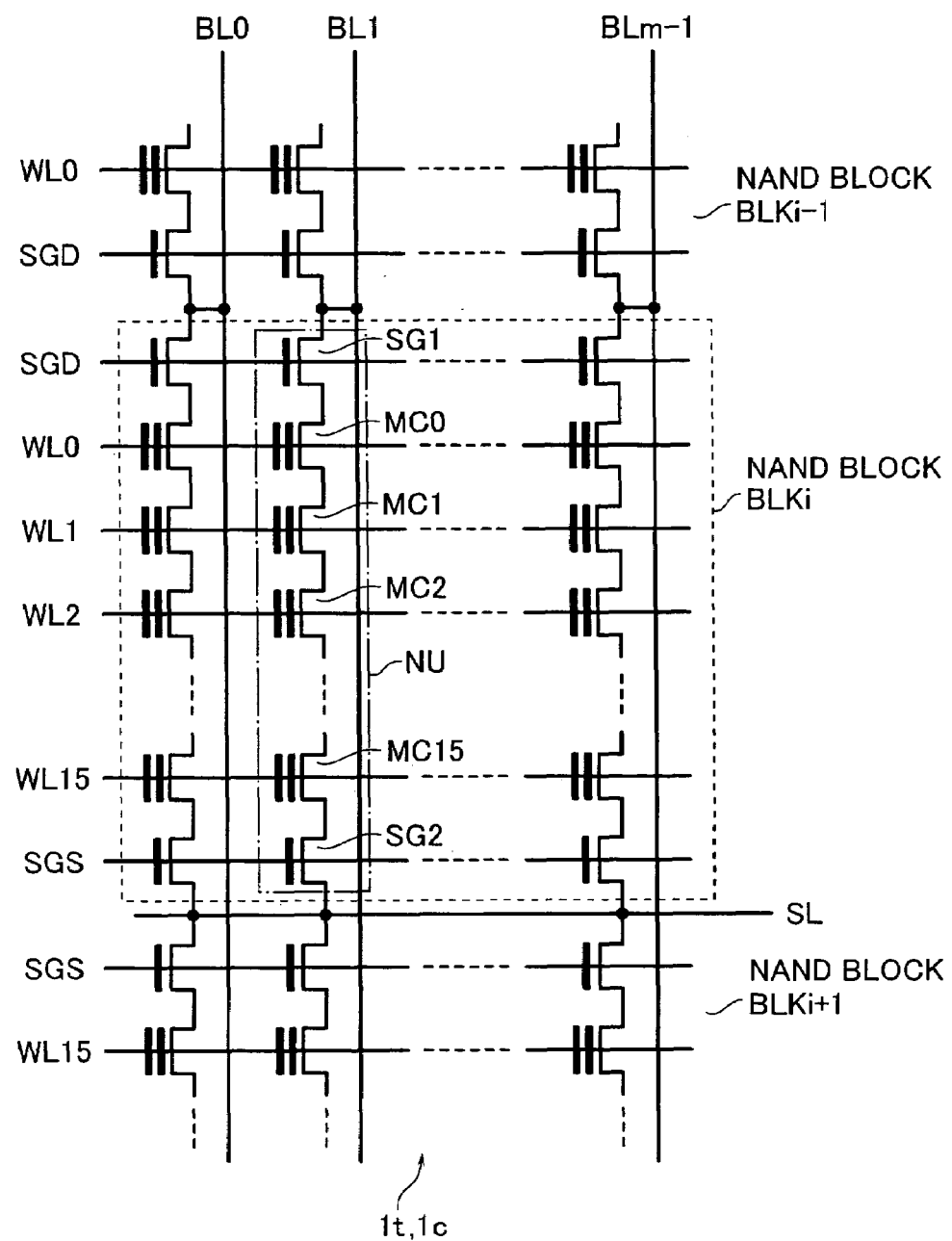
FIG. 2 shows the cell array of the flash memory.

FIG. 2 shows an internal configuration of each cell array 1t, 1c. Memory cells MC are disposed at the respective crossing points of bit lines BL and word lines WL which are disposed as being crossed each other. Each memory cell MC has a MOS transistor structure with a floating gate and a control gate stacked thereabove, and stores data defined by a charge storage state on the floating gate.

In this embodiment, sixteen memory cells MC0 to MC15 are connected in series to constitute a NAND string (i.e., NAND cell unit) NU. One end of the NAND cell unit NU is connected to bit line BL through a select gate transistor SG1, and the other to common source line SL through another select gate transistor SG2.

Control gates of the respective memory cells MC0 to MC15 are connected to word lines WL0 to WL15, respectively. Gates of the select gate transistors SG1, SG2 are connected to select gate lines SGD, SGS respectively, which are disposed in parallel with the word lines WL. Generally, a range of memory cells arranged along a word line WL makes up a page serving as a unit for data write and read. A range of plural NAND cell units arranged along word lines becomes a block BLKi serving as a unit for data erase at a time. Plural blocks are disposed in the direction of the bit lines BL generally. As shown in FIG. 1, two memory cells, true cell T-cell and complementary cell C-cell, which are simultaneously selected from the cell arrays 1t, 1c, constitute a pair-cell.

Figure 3:
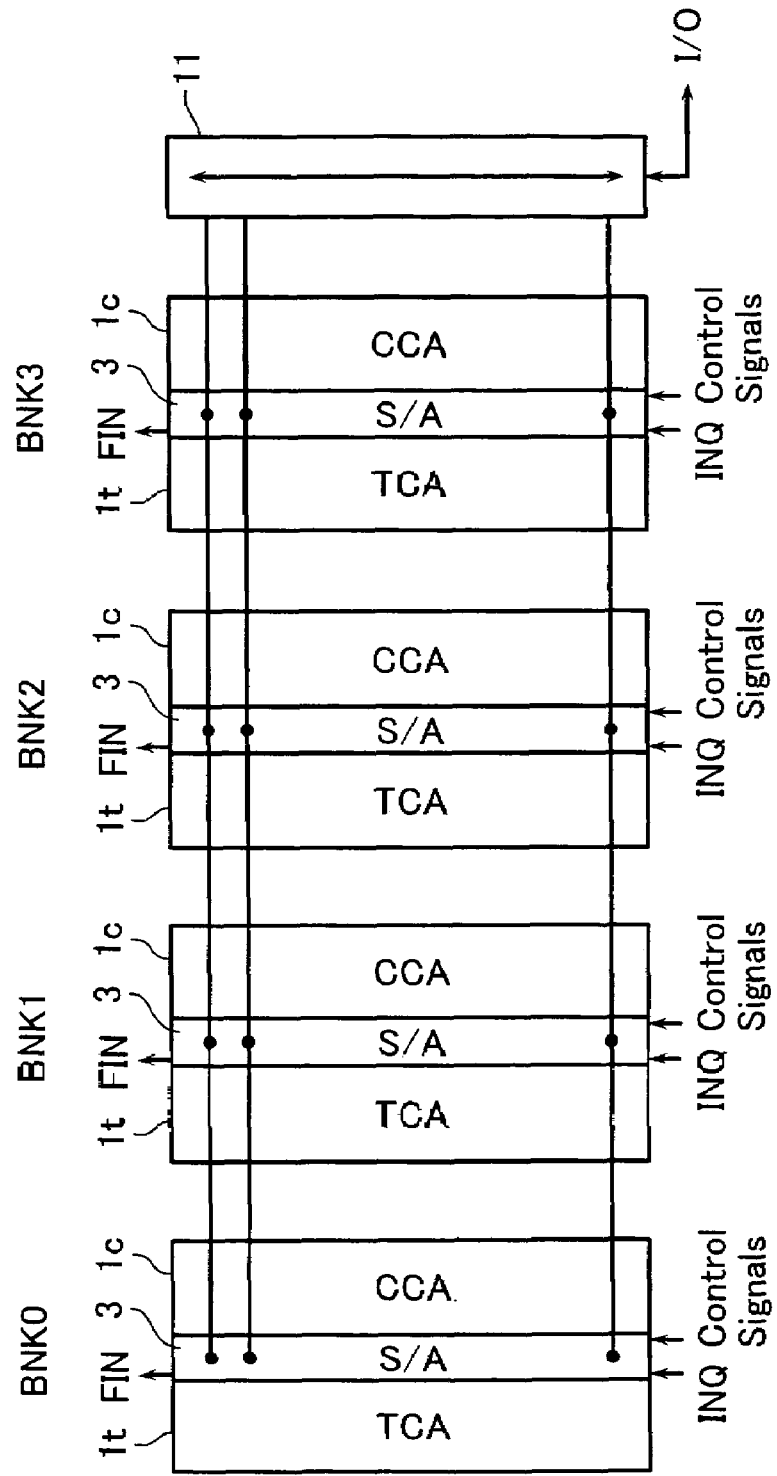
FIG. 3 shows a layout example of plural banks.

FIG. 1 shows only one sense amplifier circuit 3 and two cell arrays 1t, 1c sharing it. In practice, as shown in FIG. 3, one sense amplifier circuit 3 for performing one page data and two cell arrays 1t, 1c sharing it serve as a unit, which is so-called a "page bank", and plural page banks (four page banks BNK0-BNK3 in the example shown in FIG. 3) are arranged to share data lines DQ, and /DQ. With this configuration, it becomes possible to interleave between page banks, and to do continuously page access.

Figure 4:
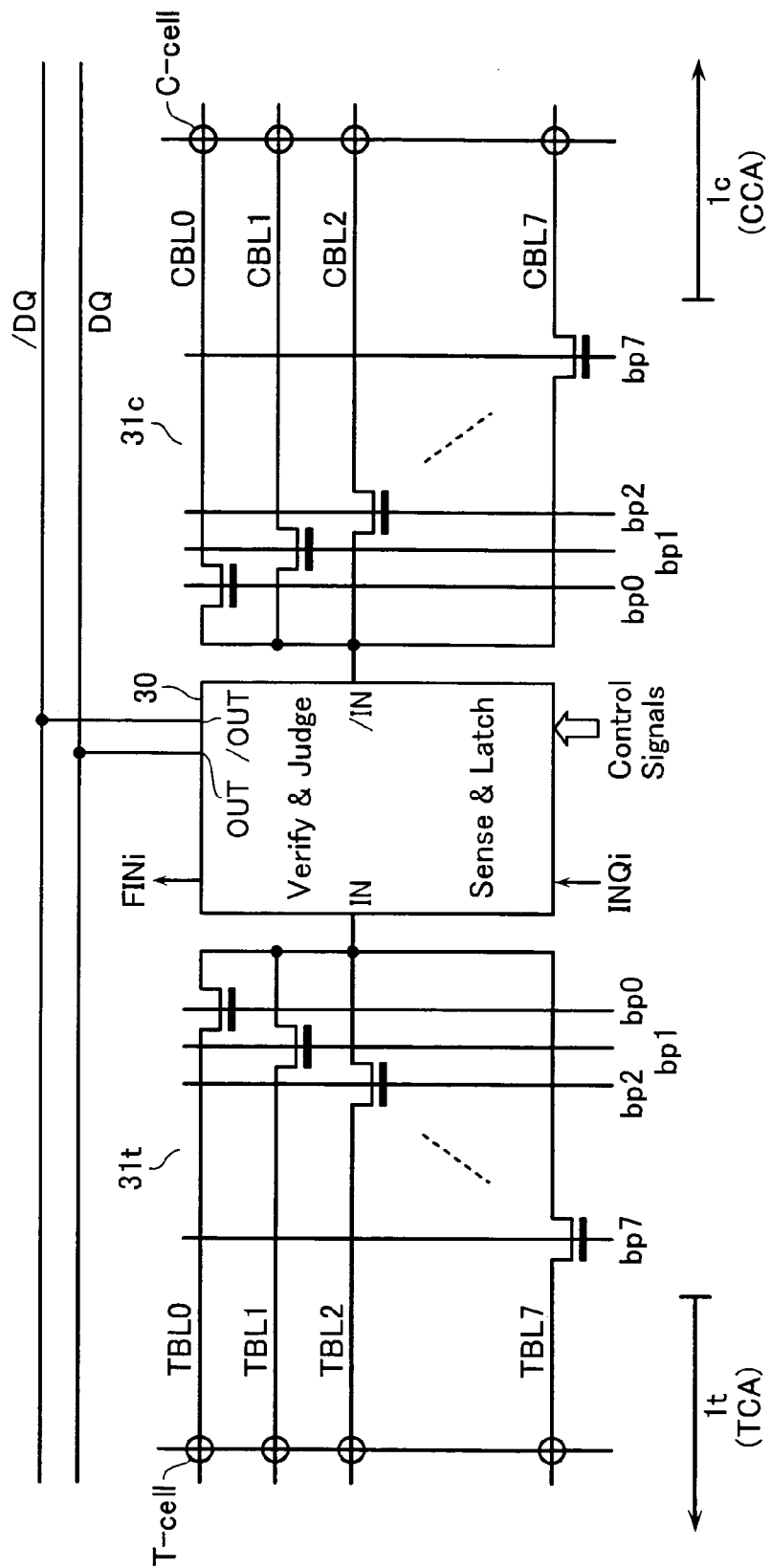
FIG. 4 shows a selection circuit between the sense amplifier unit and bit line pair.

FIG. 4 shows a sense unit 30 in the sense amplifier circuit 3 and selecting circuits 31t, 31c for selecting a pair of bit lines. The sense unit 30 has, as described later, a sense-latch system for performing data sense and latch, and a verify-result judge system for performing write or erase verify-judgment.

The bit line select circuits 31t and 31c select a pair bit lines in TBL0-7 and CBL0-7, and couple them to the sense unit 30 in response to select signals bp0-bp7. That is, with these select circuits 31t and 31c, one in eight bit line pairs may be selected. The select signals bp0-bp7 serves as part of page address signals.

Various control signals are input into the sense unit 30. INQi and FINi are input and output signals, respectively, used for verify-judging in write and erase modes. The sense-latch system is selectively coupled to DQ, /DQ lines serving as global data lines. The data lines DQ, /DQ are disposed common to the entire page banks, and serves for data transferring between a selected page bank and themselves.

The verify-judging circuit in each sense init will be formed, as described later, satisfying a condition as follows: input/output signals INQi/FINi are dealt with in such a way that output signal FINi of a sense unit becomes input signal INQi+1 of the following sense unit. At a verify-write or erase time, when the entire page bank write or erase operations are completed, the final output signal FIN(="H") will be output as a pass flag.

Each pair of data lines DQ and /DQ is selected in the output buffer 11, so that read data will be output to the external terminals I/O, and signal processing such as bit width conversion will be performed in the output buffer 11.

Figure 5:
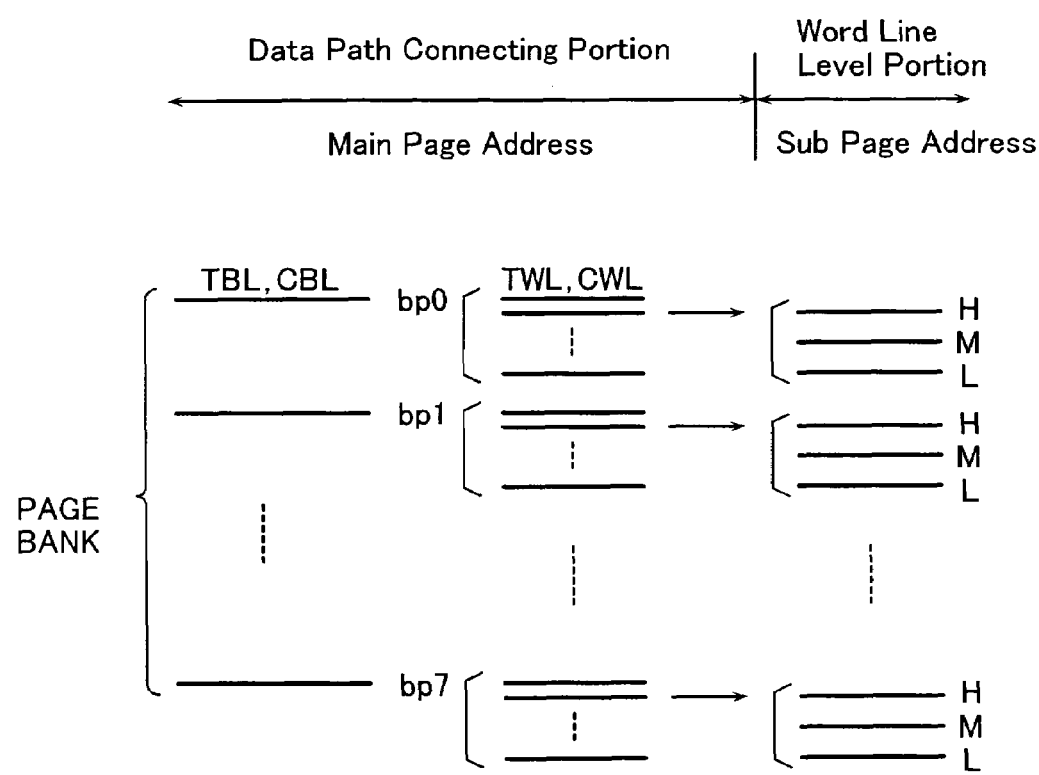
FIG. 5 shows a page address configuration.

Erase verify, write or read is performed for the entire memory cells in each page in a page bank. The address structure for making the above-described page accessing possible is shown in FIG. 5.

The address is defined by a data path connecting portion defining which pair cell is to be coupled to the sense unit and a word line level portion defining how to set a selected word line level. The data path connecting portion is a main page address portion for selecting bit line pairs TBL, CBL in correspondence with sense unit numbers in a page bank and selecting a pair of word lines TWL and CWL. A set of pair cells selected with the main page address constitute a page serving as a data write/read unit.

The word line level portion is a sub-page address portion set in the main page address. This sub-page address portion designates a combination of levels of a pair of word lines TWL and CWL, thereby designating bit information of multi-value data (i.e., two bits, higher and lower bits, in four-value storage scheme, or three bits, higher, middle and lower bits, in eight-value storage scheme).

Page data are simultaneously read out. Whether the page data are transferred as it is as multi-bit data or subjected to high-speed random access will be determined in accordance with the system application. It is possible to access another page bank while a page bank data is transferred, and this becomes possible to perform a bank interleave operation thereby doing continuous data transfer.

At a write time, it is in need of setting a history of multi-value data level. Therefore, it is put restrictions on the sub-page address selection order in a main page address. That is, it must be kept such an order that the higher bit is written, following it the middle bit is written, and the lower bit is finally written. If this selection order is kept, there is no need of continuously writing the higher, middle and lower bits. For example, it is permitted that a read operation interrupts the write operation.

With respect to data read, in accordance with the multi-value data bit assignment scheme, there is a case where there are restrictions on the sub-page address selection order and another case where sub-page data is read optionally (i.e. independently from other sub-page addresses).

In the present invention, two memory cells, each of which is able to store plural data levels in a non-volatile manner, are combined to be a pair cell. Suppose, in this case, that one cell is able to store N-levels (N-values), and multi-value data is defined by the combination states between different levels, the number of states being as follows: M=2(N−1)+1. Except such a case that two cell stores the same levels as each other, there are states of M=2(N−1).

For example, in case of N=2, M=2. In this case, there is not significant to use the pair cell scheme. When N=3, M=4. In this case, it is possible to obtain four-value/pair cell. When N=5, M=8. In this case, it is possible to store eight-value/pair cell.

It is preferable in a view point of data processing that multi-value data is defined by the number of states expressed by a power of 2. To store multi-value data defined by a power of 2, the number of levels of a cell is to be set as: N=3, 5, 7, . . . .

In the embodiments described below, there will be mainly explained cases of three levels/cell-four values/pair cell and five levels/cell-eight value/pair cell. Further, in the embodiments described below, as physical quantity (amount) levels, which are used as data levels in a cell, threshold levels will be used.

[Three Levels/Cell-Four Values/Pair Cell Scheme (Part 1)]

Figure 6:
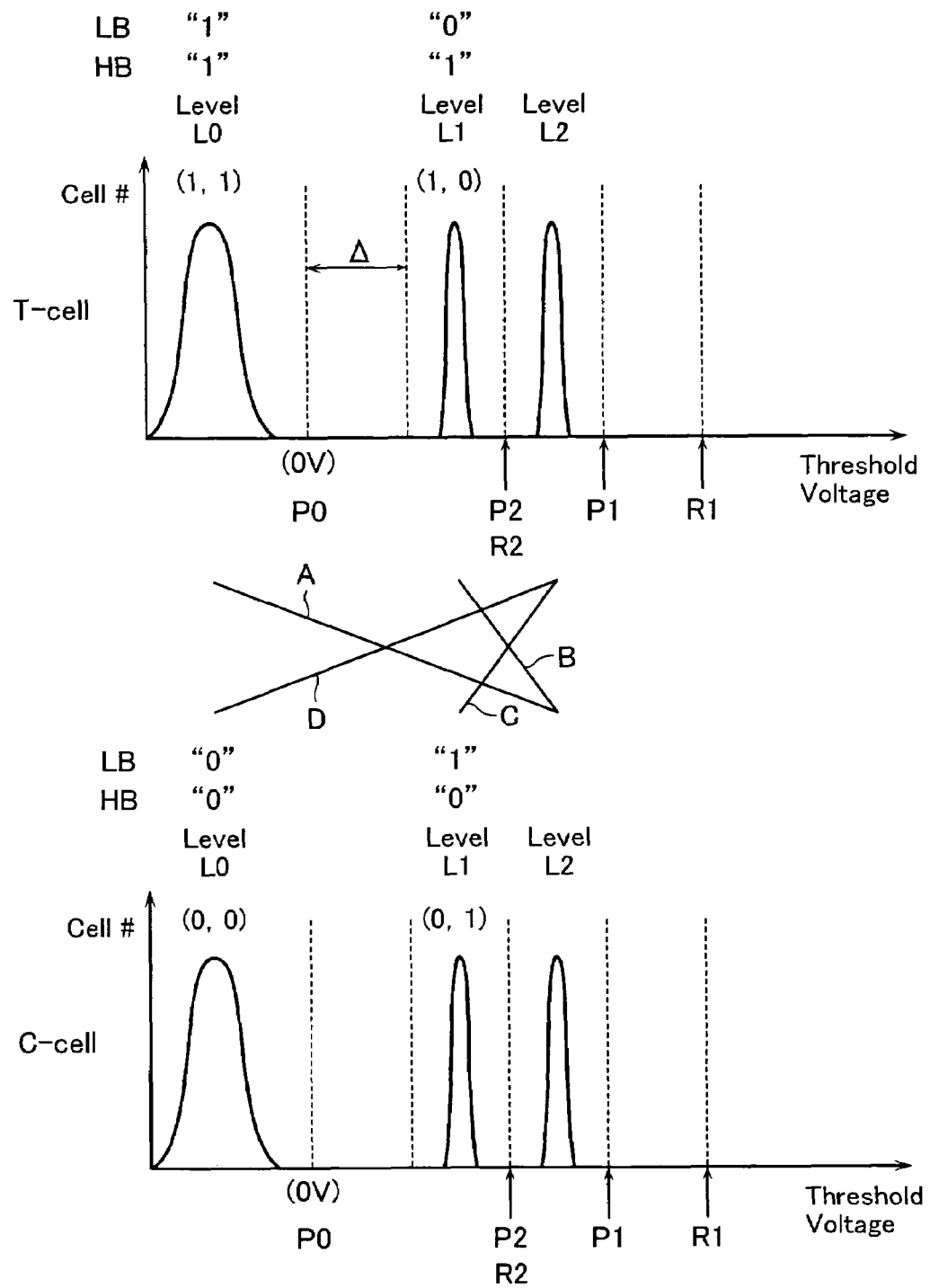
FIG. 6 shows a data bit assignment of a three levels/cell-four values/pair cell scheme (part 1).

FIG. 6 shows an example of data threshold distributions and data bit assignment, in which each of two cells, T-cell and C-cell, in a pair cell is set to be in one state of three threshold levels L0, L1 and L2, and combinations thereof are defined as four-value data.

Level L0 is, as described later, an erase state with a negative threshold voltage; and L1 and L2 are write states with positive threshold voltages.

4-value data is defined by data state A (i.e., combination of the highest level L2 of C-cell and the lowest level L0 of T-cell), data state B (i.e., combination of the highest level L2 of C-cell and the middle level L1 of T-cell), data state D (i.e., combination of the highest level L2 of T-cell and the lowest level L0 of C-cell), and data state C (i.e., combination of the highest level L2 of T-cell and the middle level L1 of C-cell).

Three combinations between the same levels are excluded from data states because it is impossible to distinguish therebetween. Further, the combination of levels L0 and L1 also is excluded from the data states because it becomes the same as the combination of levels L1 and l2.

Suppose that data A and B defined as based on the higher level L2 of C-cell are sensed as positive logic data; and data C and D defined as based on the higher level L2 of T-cell are sensed as negative logic data. Further, suppose that 4-value data is expressed as (HB, LB), where HB is an upper bit; and LB is a lower bit. In the example shown in FIG. 6, data bits are assigned to four combination data A, B, C and D for each pair cell as follows: A=(1,1), B=(1,0), C=(0,1) and D=(0,0).

As described above, the lowest data level L0 is an erased threshold level, which is distributed from Vss toward negative voltage direction and is impossible to be defined by a fine and narrow distribution. As explained in detail later, in an erase verify mode, cells are driven by Vss applied to word lined thereof, and the cell current is compared with a reference current of a reference cell. If the cell current is detected as being larger than the reference current, erase completion is judged. Therefore, the erased threshold distribution is not narrowed actively.

By contrast, levels L1 and L2 are subjected to such an operation that the threshold distributions are narrowed in write-verify modes thereof, so that it is possible to set a constant threshold distribution narrower than that of level L0.

Supposing the above-described cell level states, it will be explained conditions that 4-value data storage is made possible.

Figure 7:
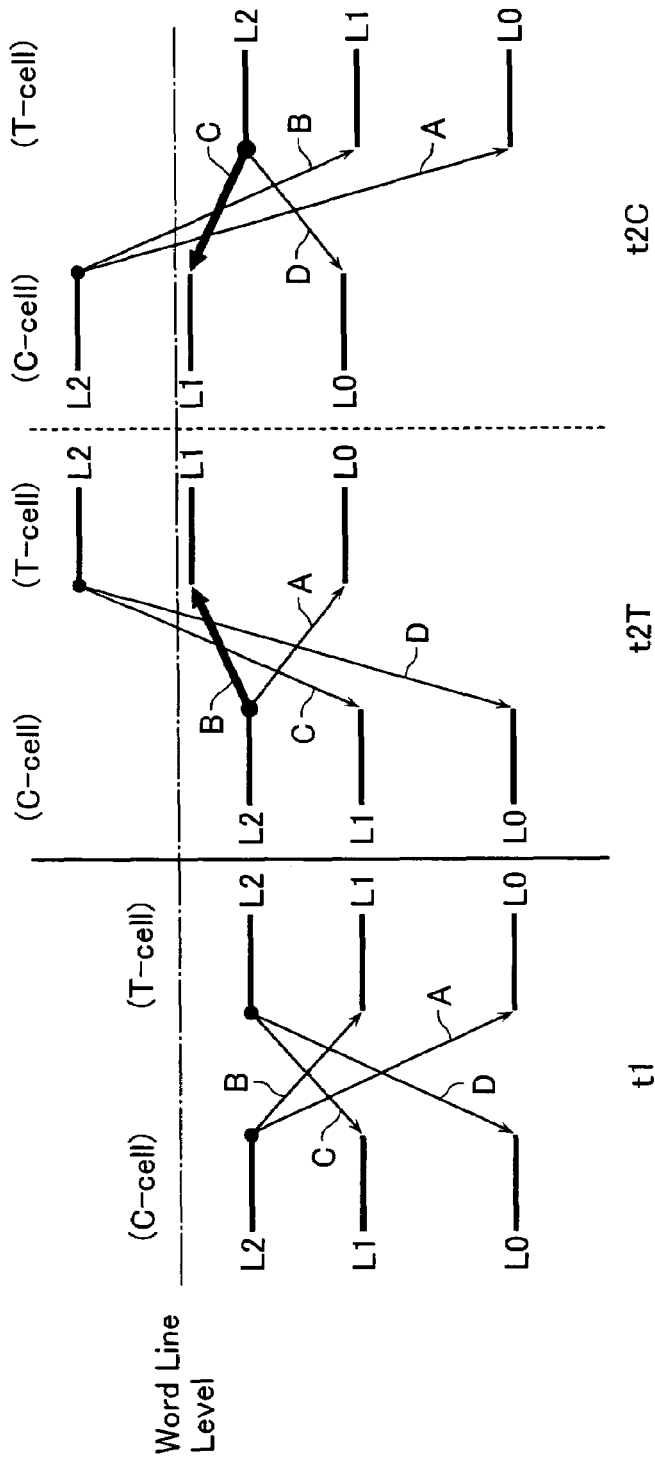
FIG. 7 shows 4-value level relationships based on the read word line level in the 4-value/pair cell scheme (part 1).

FIG. 7 shows level relationships of pair cell, T-cell and C-cell, within three cycles (or steps) t1, t2T and t2C that are required for data reading. FIG. 7 shows a fact that 4-value data may be detected with applying relative biases to levels L0-L2 of T-cell and C-cell on the assumption that a read voltage (word line level) applied to selected word lines TWL and CWL is constant during the three cycles.

Figure 8:
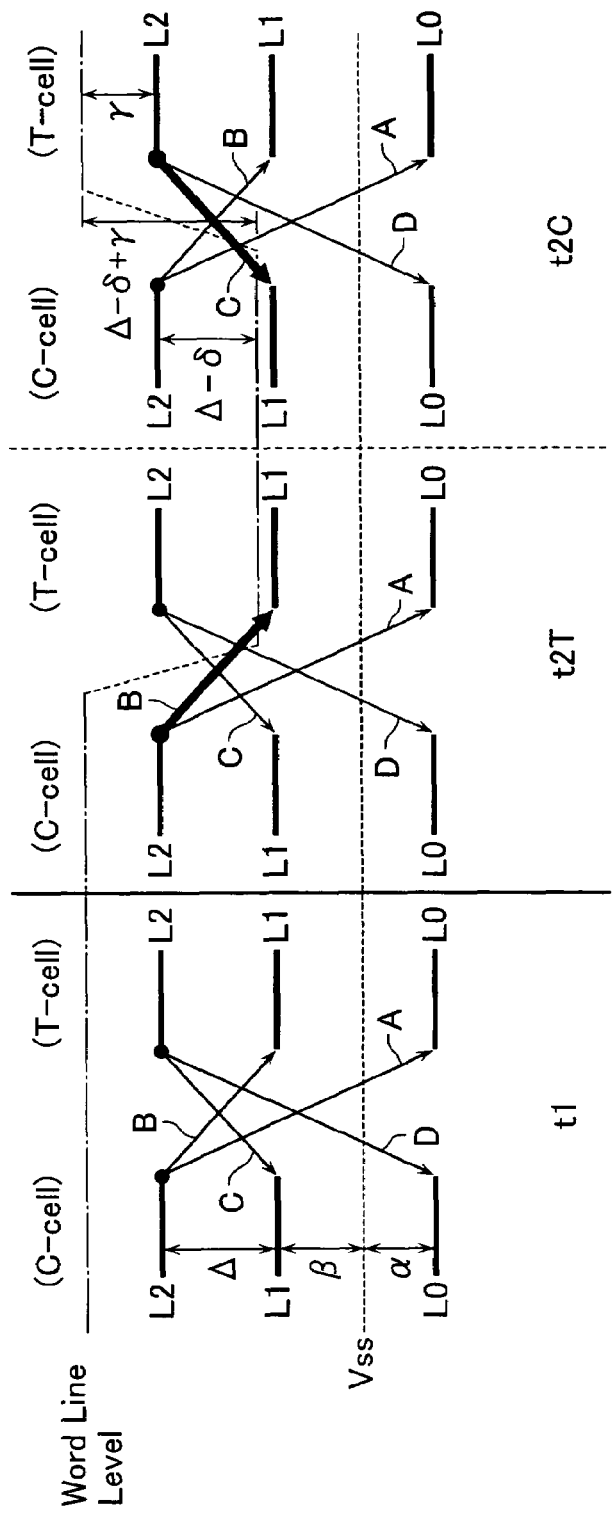
FIG. 8 shows 4-value level relationships based on Vss level.

By contrast, FIG. 8 shows a fact that 4-value data may be detected with word line levels changed during the three cycles. FIG. 8 shows an example near to a practical data read operation.

Suppose that each of data states A, B, C and D is detected as "1" when C-cell's level is higher than T-cell's level. At cycle t1, both of data A and B are sensed as "1" while the lower bit data is shrunk. Similarly, both of data C and D are sensed as "0" while the lower bit data is shrunk.

These data shrinking states may be broken off at cycles t2T and t2C. At the cycle t2T, apparently boosting the level of T-cell (i.e., step down the word line level of T-cell to be lower than that of C-cell in a certain level), data state B may be sensed as "0"; and data state A as "1". As s result, "1" data shrinking state of data A and B is broken off.

At the cycle t2C, apparently boosting the level of C-cell (i.e., step down the word line level of C-cell to be lower than that of T-cell in a certain level), data state D may be sensed as "0"; and data state C as "1". As s result, "0" data shrinking state of data C and D is broken off.

As described above, cycle t1 is one for detecting the upper bit data state of a pair cell while cycles t2T and t2C are for detecting the lower bit data states of a pair cell, the upper bit data of which are "1" and "0", respectively. Therefore, it is not material whichever cycles t2T and t2C is advanced.

To clear in detail the word line setting conditions, on which 4-value data is detectable, as shown in FIG. 8, suppose that voltage difference between level L0 and Vss is $\alpha$; voltage difference between level L1 and Vss is $\beta$; voltage difference between levels L1 and L2 is $\Delta$; voltage difference between the highest level L2 and higher-level side word line level is $\gamma$; and voltage difference between the highest level L2 and lower-level side word line level is $\Delta-\delta$. In this case, the amplitude of word line level swing is $\Delta-\delta+\gamma$.

Figure 9:
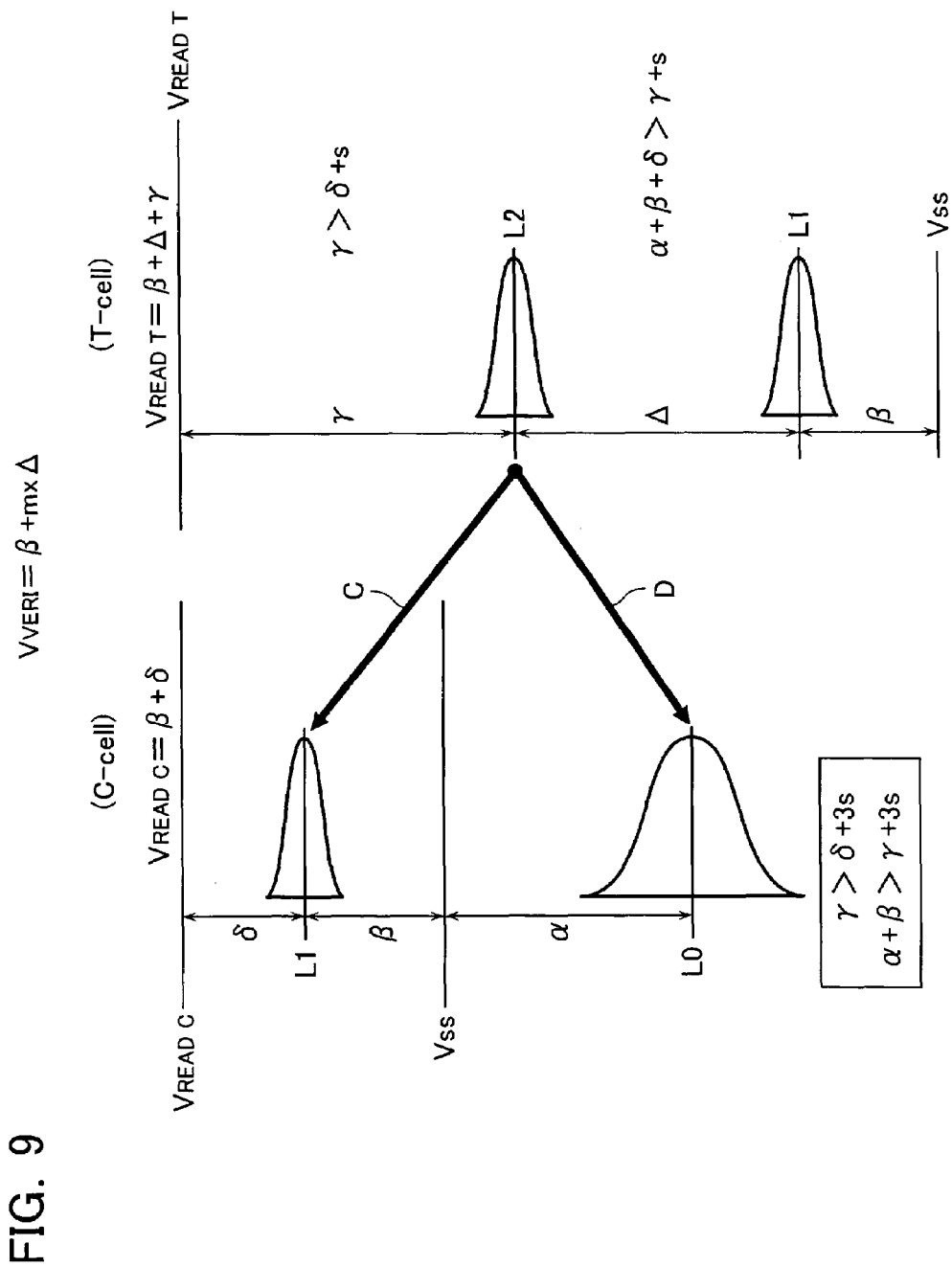
FIG. 9 is a diagram for explaining the state distinguishing condition of the pair cell.

FIG. 9 shows level relationships in consideration of the threshold distributions of the erase level (level L0) and written levels L1 and L2 on the condition that data states C and D are detectable therebetween at the cycle t2C. Here, the word line level is set to be constant as similar to FIG. 7. Suppose that a word line level at a write-verify time (i.e., write-verify voltage). $V_{VERI}$ is set as follows: $V_{VERI}=\beta+m\times\Delta$ (m=0, 1, 2, . . . ).

A word line level at an erase-verify time (i.e., erase-verify voltage) is Vss, and no operations are used for narrowing the erase threshold distribution. Since the value of $\alpha$ is not secured, it is in need of setting the read condition such as to remove the influence thereof to be as less as possible.

Suppose that the reference current source at the write-verify time has an equivalent threshold voltage Vref; and the sense amplifier has an equivalent voltage, ±s, in correspondence with an insensitive range of the sense amplifier, and in consideration of the error detection due to the insensitive range of the sense amplifier, it will be secured only such a case that $\alpha$, which determines the level L0, is equal to (Vref−s) or more.

Other levels L1 and L2 are detected based on comparing the write-verify voltage $V_{VERI}$ at the write-verify time and the reference voltage Vref. Therefore, threshold distribution thereof is equal to or more than $V_{VERI}-(Vref+s)$ and equal to or less than $V_{VERI}-(Vref-s)$. That is, the distribution is set from (Vref−s) to (Vref+s) under the verify level $V_{VERI}$. Note here that there is not shown the difference between the verify-voltage $V_{VERI}$ and levels L1, L2 in FIG. 9.

It is in need of distinguishing between levels L0 and L1 of C-cell based on the level L2 of T-cell, it is required of this case to satisfy the following expressions (1) and (2).

$$\gamma > \delta + s \quad (1)$$

$$\alpha + \beta + \delta > \gamma + s \quad (2)$$

In this case, word line levels $V_{READC}$ of C-cell and $V_{READT}$ of T-cell are shown as follows: $V_{READC}=\beta+\delta$; and $V_{READT}=\beta+\Delta+\gamma$. Further, it is in need of considering the threshold distribution with respect to the practical relationships between data levels. In consideration of the distribution minimum $\gamma+(Vref-s)$ at $\gamma$ side and the distribution maximum $\delta+(Vref+s)$ at $\delta$ side, the expression (1) is rewritten into the following expression (3).

$$\gamma > \delta + 3s \quad (3)$$

With respect to the expression (2), substitute the distribution minimum $\alpha+(Vref-s)$ and distribution maximum $\gamma+(Vref+s)$ for $\alpha$ and $\gamma$, respectively, and it is rewritten into the following expression (4).

$$\alpha + \beta > \gamma + 3s \quad (4)$$

Based on the above-described conditions, more simplified level setting method will be examined below. The level setting conditions in the expressions (3) and (4), in which the threshold distribution is considered, will be summarized more simply as the following expression (5) on the assumption that the levels may be separated with margin $\Delta$, and using $\alpha=0$, $\beta=2\times\Delta$ and $\gamma=\Delta$.

$$\Delta > 3s \quad (5)$$

Figure 10:
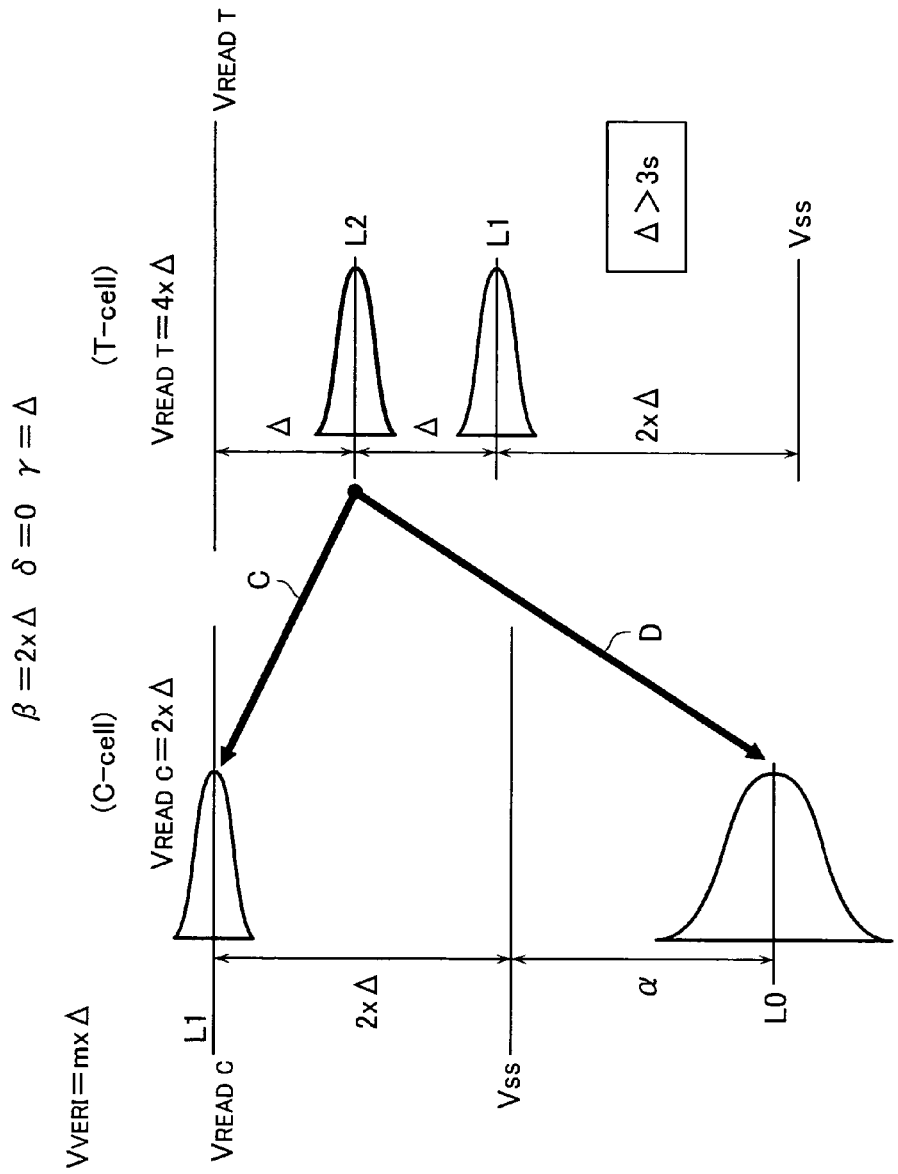
FIG. 10 is a diagram for explaining the more simplified state distinguishing condition.

FIG. 10 shows level relationships for data state judging on the above-described condition in correspondence with FIG. 9. Word line levels at write-verify and erase-verify times and read time are summarized as $m\times\Delta$ ($m=0, 1, 2, 3, \ldots$), so that word line drive circuits may be formed to generate a multiple of $\Delta$.

Figure 11:
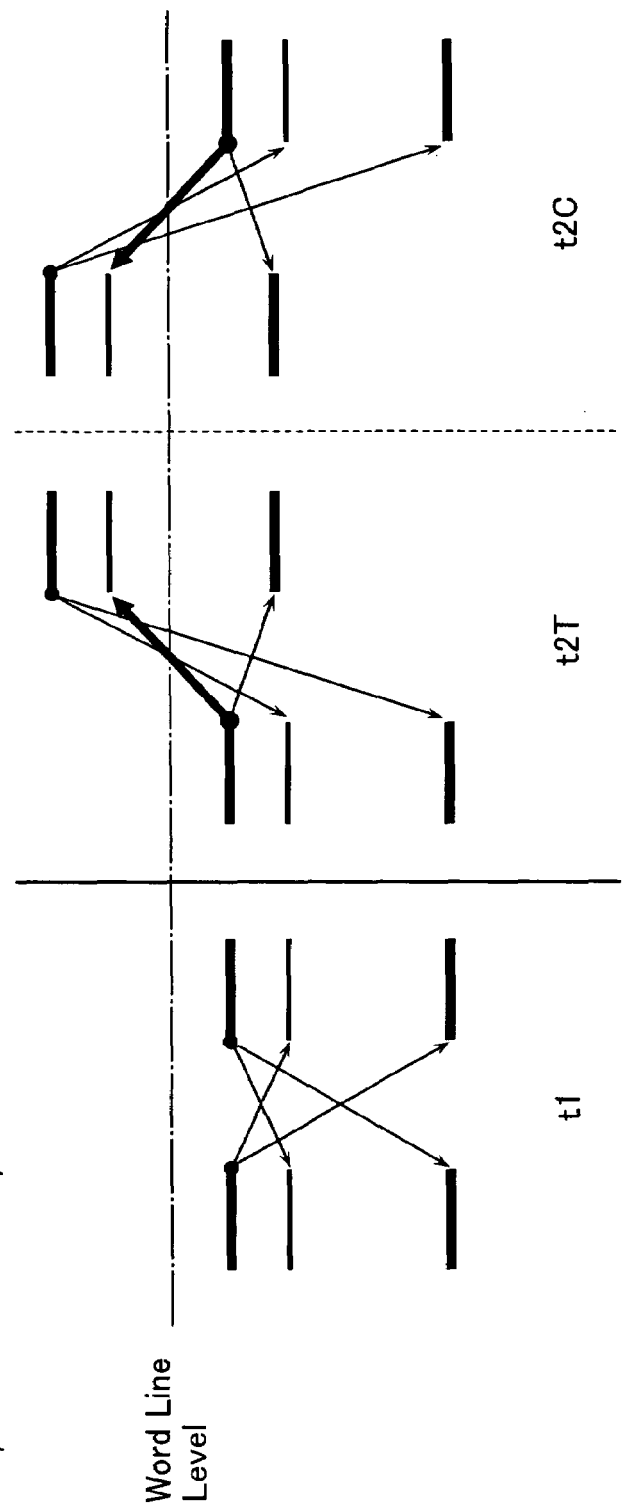
FIG. 11 shows 4-value level relationships with the above-described state distinguishing condition in correspondence with FIG. 7.
Figure 12:
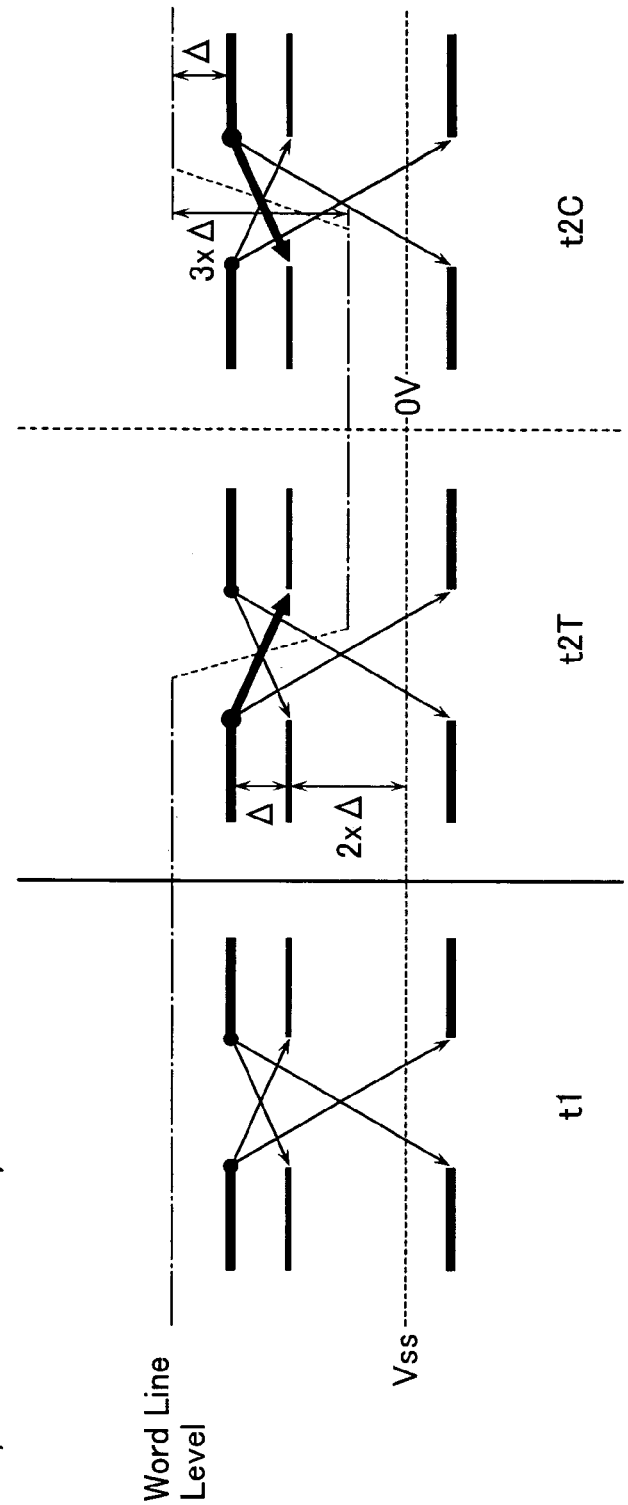
FIG. 12 shows 4-value level relationships with the above-described state distinguishing condition in correspondence with FIG. 8.

FIGS. 11 and 12 show the level relationships with the above-described conditions in correspondence with FIGS. 7 and 8, respectively.

As explained above, the data distributions of three levels/cell-four values/pair cell may be set as shown in FIG. 6. In FIG. 6, P0 (=Vss=0V) is an erase-verify voltage; P1 is a write-verify voltage at when level L2 is written; P2 is a write-verify voltage at when level L1 is written; R1 is a word line level (read voltage) at read step t1; R2 is a read voltage set for T-cell or C-cell at read steps t2T or t2C.

FIG. 13 shows that 4-value data (1,1), (1,0), (0,1) and (0,0) may be distinguished from each other based of the data transitions in three read cycles t1, t2T and t2C.

[Five Levels/Cell-Eight Values/Pair Cell Scheme (Part 1)]

Figure 14:
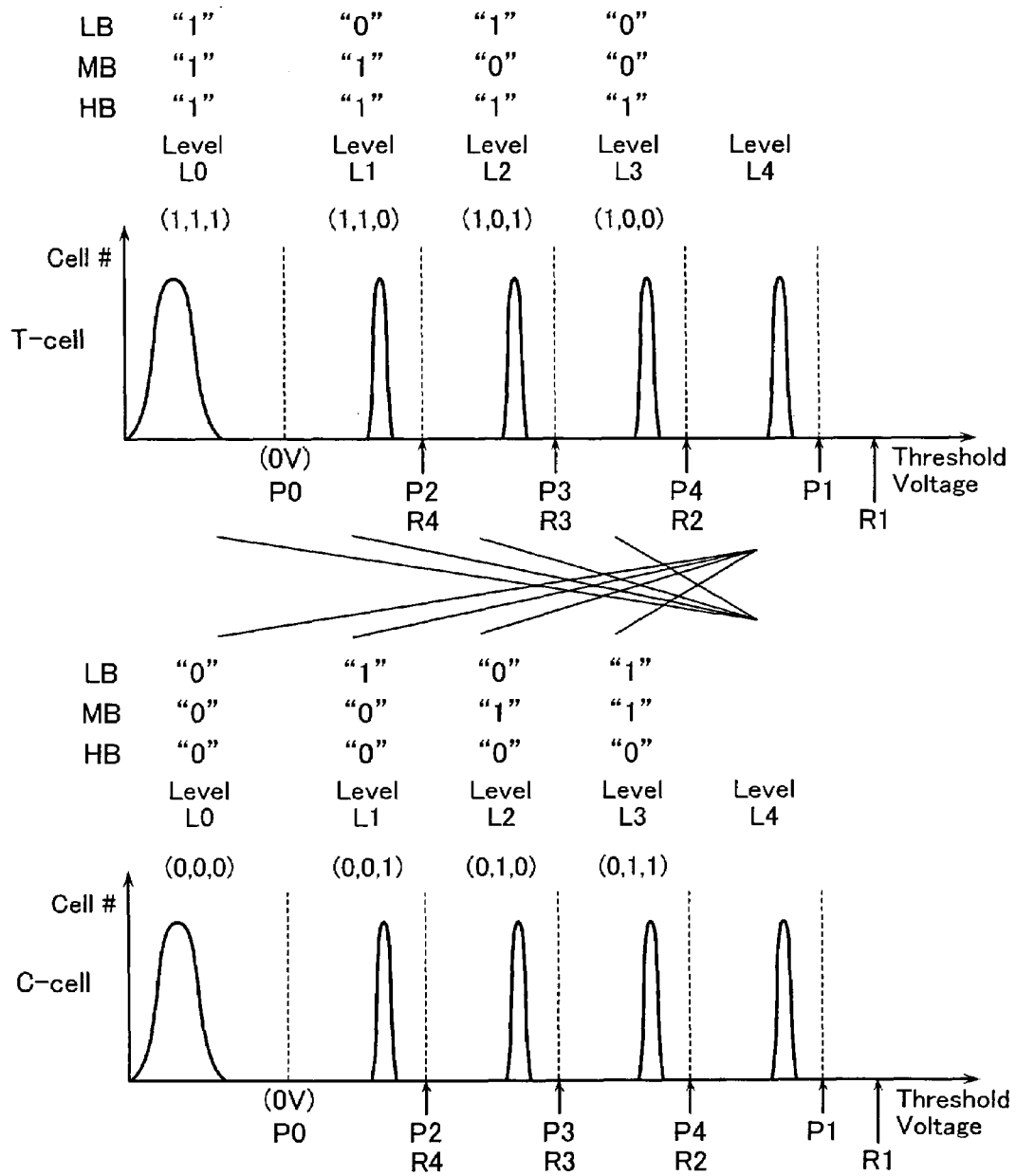
FIG. 14 shows a data bit assignment of a five levels/cell-eight values/pair cell scheme (part 1).

FIG. 14 shows an example of data threshold distributions and data bit assignment, in which each of two cells, T-cell and C-cell, in a pair cell is set to be in one state of five physical amount levels (i.e., threshold levels) L0, L1, L2, L3 and L4, and combinations thereof are defined as eight-value data.

The selection condition of level combinations for obtaining 8-value data is the same as that in case of above-described three levels/cell-four values/pair cell scheme. Eight combinations are used as follows: four combinations between the highest level L4 of T-cell in a pair cell and three levels L0-L3 of C-cell; and four combinations between the highest level L4 of C-cell in a pair cell and three levels L0-L3 of T-cell.

Figure 15:
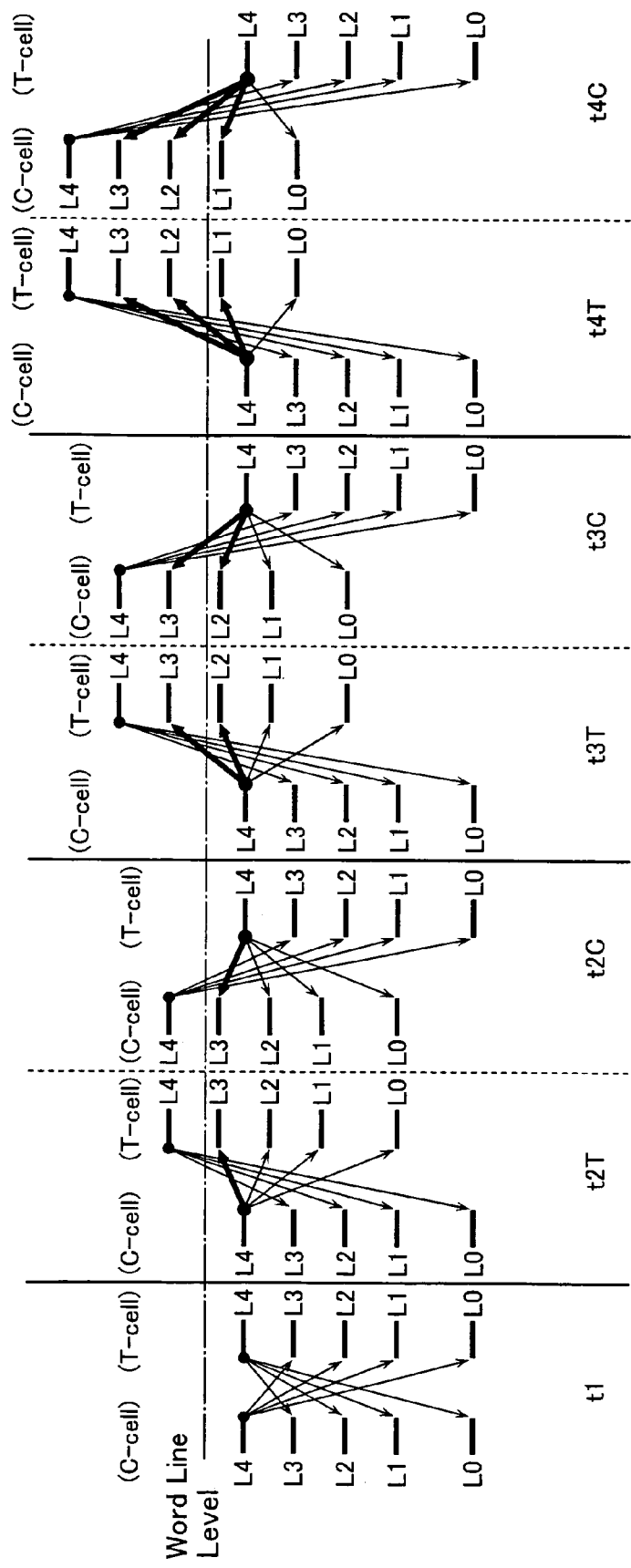
FIG. 15 shows 8-value level relationships based on the read word line level in the 8-value/pair cell scheme (part 1).

FIG. 15 shows level relationships between pair cell, T-cell and C-cell, during seven read cycles t1, t2T, t2C, t3T, t3C, t4T and t4C, which are required of eight-value data read operation, in correspondence with FIG. 7. FIG. 15 shows a fact that 8-value data may be detected with applying relative biases to levels L0-L4 of T-cell and C-cell on the assumption that a read voltage (word line level) applied to selected word lines TWL and CWL is constant during the seven cycles.

Figure 16:
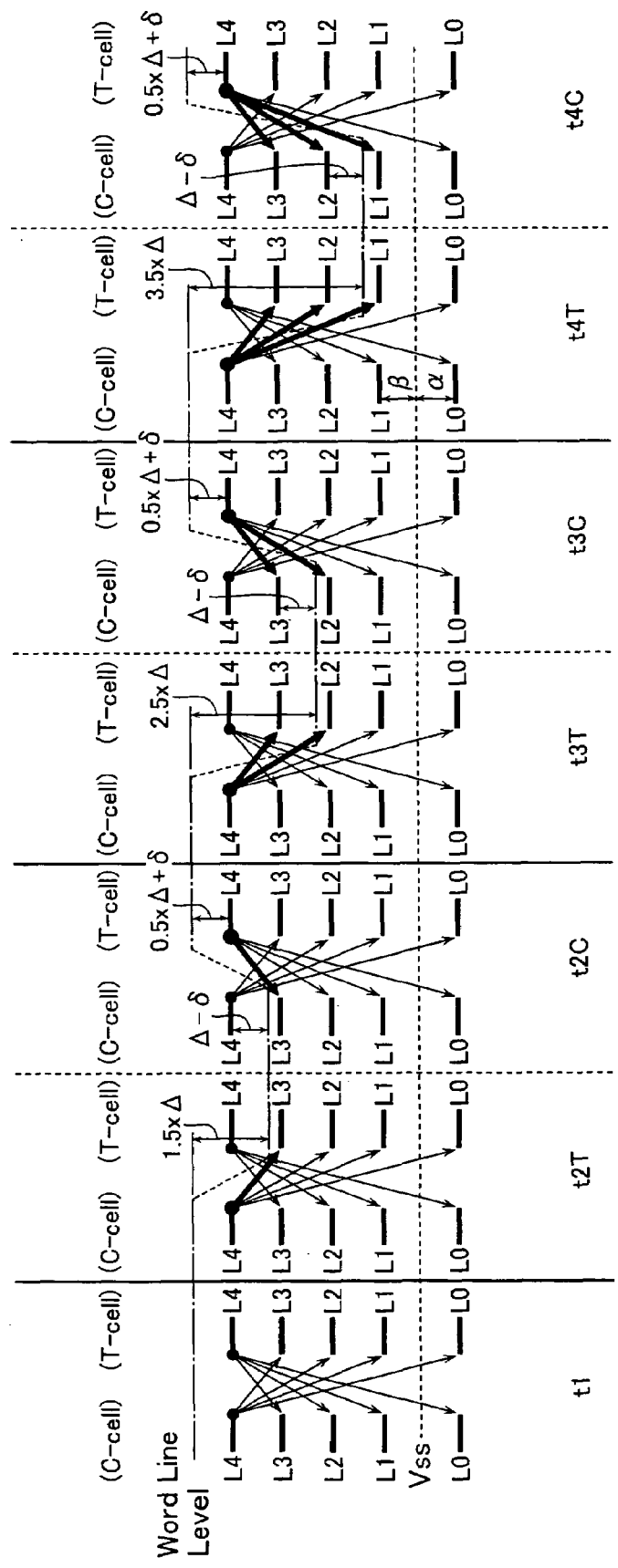
FIG. 16 shows 8-value level relationships based on Vss level.

By contrast, FIG. 16 shows a fact that 8-value data may be detected with word line levels changed during the seven cycles as similar to FIG. 8.

Suppose that each of eight-value data is detected as "1" when C-cell' level is higher than T-cell' level. At cycle t1, level L4 of C-cell is higher than four data states L0-L3 of T-cell, so that the four data states of T-cell are sensed as "1" based on the level L4 of C-cell. This data "1" is higher bit data, and other middle and lower bit data are shrunk. Similarly, four data states of C-cell based on the highest level L4 of T-cell are sensed as higher bit="0", and other middle and lower bit data are shrunk.

These data shrinking states may be broken off at the successive cycles. At the cycle t2T, apparently boost the level of T-cell (i.e., step down the word line level of T-cell to be lower than that of C-cell in a certain level), "1" data shrinking states may be broken off in part. That is, the second level L3 of T-cell may be distinguished from the remaining lower levels L0-L2.

At the cycle t2C, apparently boost the level of C-cell (i.e., step down the word line level of C-cell to be lower than that of T-cell in a certain level), "0" data shrinking states may be broken off in part. That is, the second level L3 of C-cell may be distinguished from the remaining lower levels L0-L2.

At the cycle t3T, apparently boost more the level of T-cell, the remaining "1" data shrinking states may be broken off in part. That is, the third level L2 of T-cell becomes detectable because polarity thereof is reversed to the remaining lower levels. Similarly, at the cycle t3C, apparently boost more the level of C-cell, the remaining "0" data shrinking states may be broken off in part.

At the cycle t4T, apparently boost more the level of T-cell, the remaining "1" data shrinking states may be completely broken off. That is, the forth level L1 and the lowest level L0 of T-cell may be distinguished from each other based on the highest level L4 of C-cell. At the cycle t4C, apparently boost more the level of C-cell, the remaining "0" data shrinking states may be completely broken off.

The word line level relationships shown in FIG. 16 may be obtained by the same consideration as the above-described three levels/cell-four values/pair cell scheme. In consideration of the threshold distributions of erased level (the lowest level) L0 and written levels L1-L4, pair cell data detection conditions will be examined below.

Figure 17:
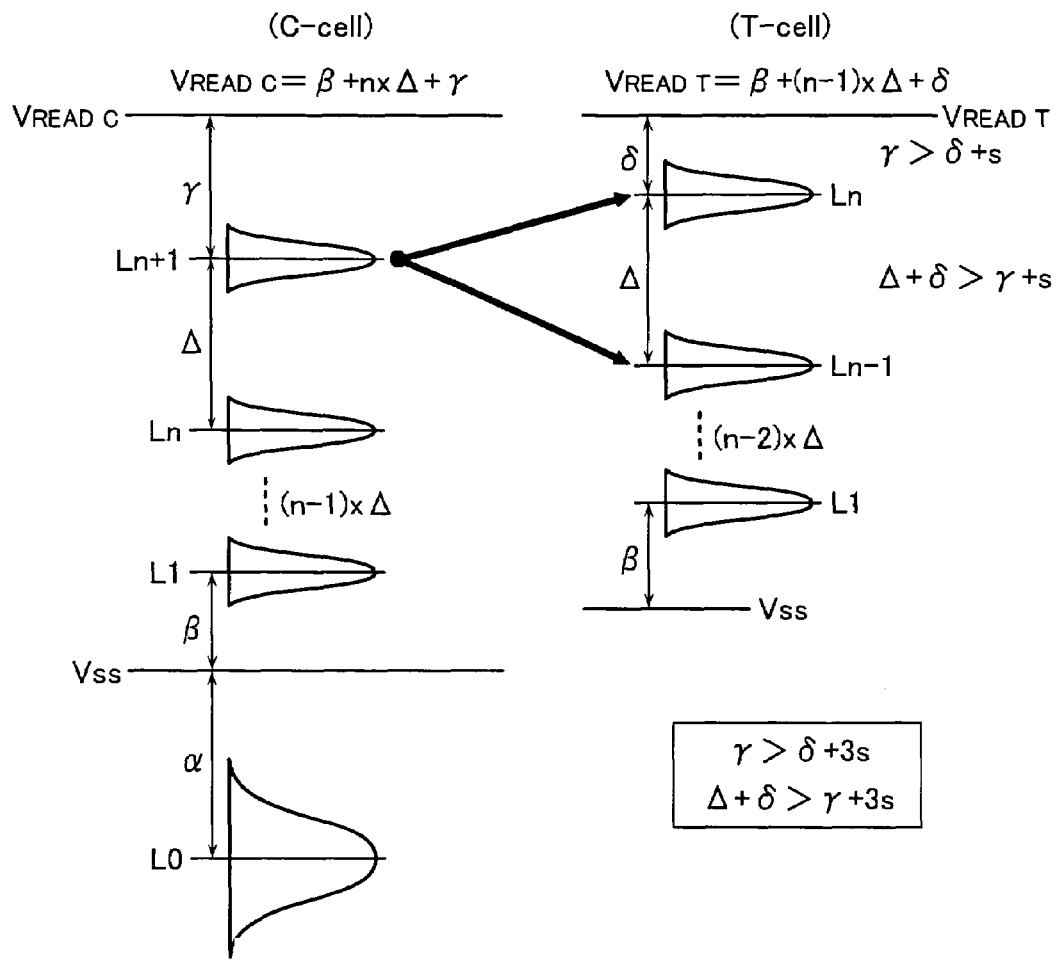
FIG. 17 is a diagram for explaining the state distinguishing condition of the pair cell.

FIG. 17 is for explaining the detection condition at the cycle t2T shown in FIGS. 15 and 16 in such a case that the highest level is generalized as Ln+1. In detail, it will be explained the condition of distinguishing the second level Ln of T-cell from the remaining lower levels.

In FIG. 17, voltage difference between erased threshold voltage (level) L0 and erase-verify voltage Vss is $\alpha$; voltage difference between written level L1 and Vss is $\beta$; difference between word line read voltage $V_{READT}$ of T-cell and level Ln is $\delta$; each voltage difference between adjacent levels is $\Delta$; difference between word line read voltage $V_{READC}$ of C-cell and level Nn+1 is $\gamma$. In this case, the amplitude of word line level swing is $\Delta-\delta+\gamma$. The word line level at the write-verify time is shown as follows: $V_{VERI}=\beta+m\times\Delta$ ($m=1, 2, 3, \ldots$).

A word line level at the erase-verify time (i.e., erase-verify voltage) is Vss, and no operations are used for narrowing the erase threshold distribution. As similar to the above-described example, it is in need of setting the read condition such as to remove the influence of α to be as less as possible.

Levels Ln and Ln−1 of T-cell are to be distinguished from each other based on the level Ln+1 of C-cell. Therefore, it is required of these levels to satisfy the following expressions (6) and (7).

$$\gamma > \delta + s \quad (6)$$

$$\Delta + \delta > \gamma + s \quad (7)$$

In this case, word line levels $V_{READC}$ of C-cell and $V_{READT}$ of T-cell are shown as follows: $V_{READC} = \beta + n \times \Delta + \gamma$; and $V_{READT} = \beta + (n-1) \times \Delta + \delta$. Further, it is in need of considering the threshold distribution with respect to the practical relationships between data levels. In consideration of the distribution minimum γ+(Vref−s) at r side and the distribution maximum δ+(Vref+s) at δ side, the expression (6) is rewritten as the following expression (8).

$$\gamma > \delta + 3s \quad (8)$$

With respect to the expression (7), substitute the distribution minimum Δ+δ+(Vref−s) and distribution maximum γ+(Vref+s) for Δ+δ and γ, respectively, and it is rewritten as the following expression (9).

$$\Delta + \delta > \gamma + 3s \quad (9)$$

To detect the voltage difference Δ between levels on the condition of the expressions (8) and (9), in which the threshold distributions are considered, an optimum condition becomes as follows: γ−δ=0.5×Δ. If β=Δ, and δ=0, the expressions (8) and (9) will be summarized more simply as the following expression (10).

$$0.5 \times \Delta > 3s \quad (10)$$

Figure 18:
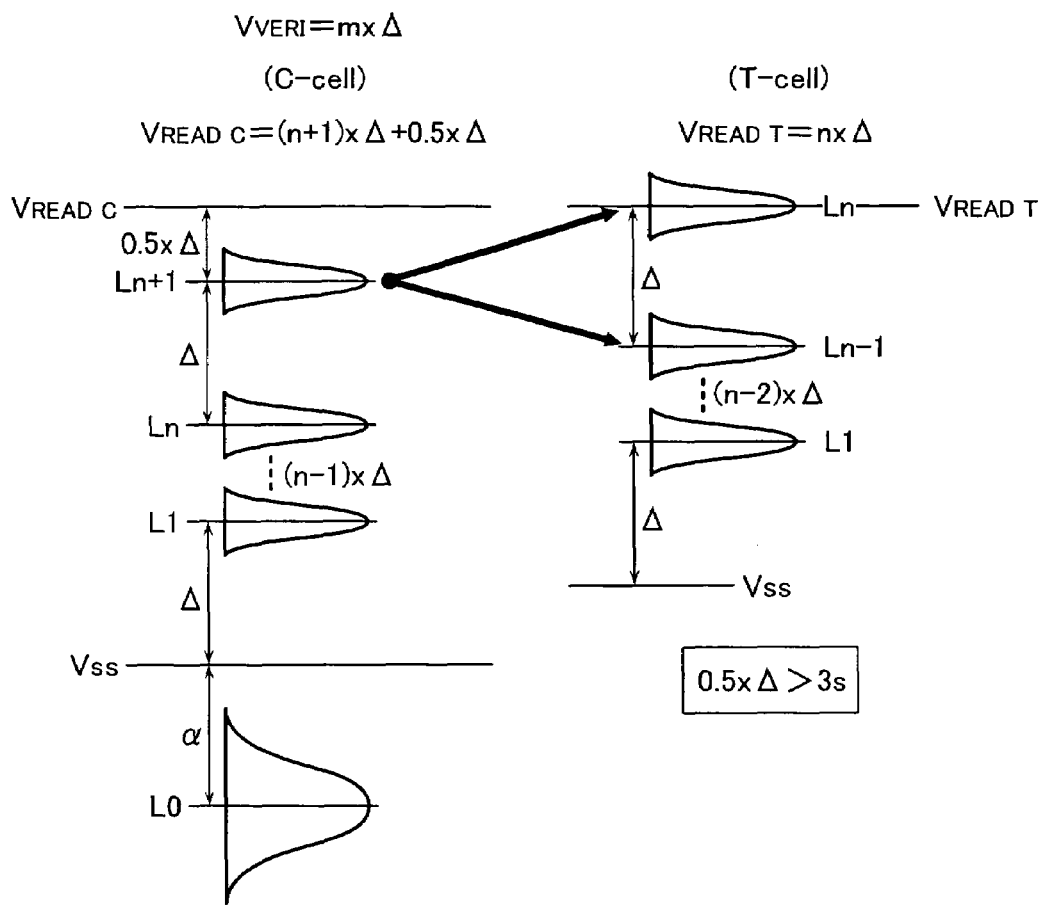
FIG. 18 is a diagram for explaining the more simplified state distinguishing condition.

FIG. 18 shows level relationships for data state judging on the above-described condition. Word line levels at write-verify and erase-verify times and read time are summarized as m×Δ (m=0, 1, 2, 3, . . . ) and 0.5×Δ, so that word line drive circuits may be formed to generate a multiple of 0.5×Δ. Δ is selected to be able to sufficiently separate threshold distributions from each other and significantly larger than the insensitive range of the sense amplifier.

When distinguishing between levels L1 and L0 (for example, cycle t4T or t4C in FIG. 15) under the above-described condition, not only Δ but also the difference between the erases level L0 and Vss are concerned with it. Therefore, it will be examined whether it is problematic or not.

Figure 19:
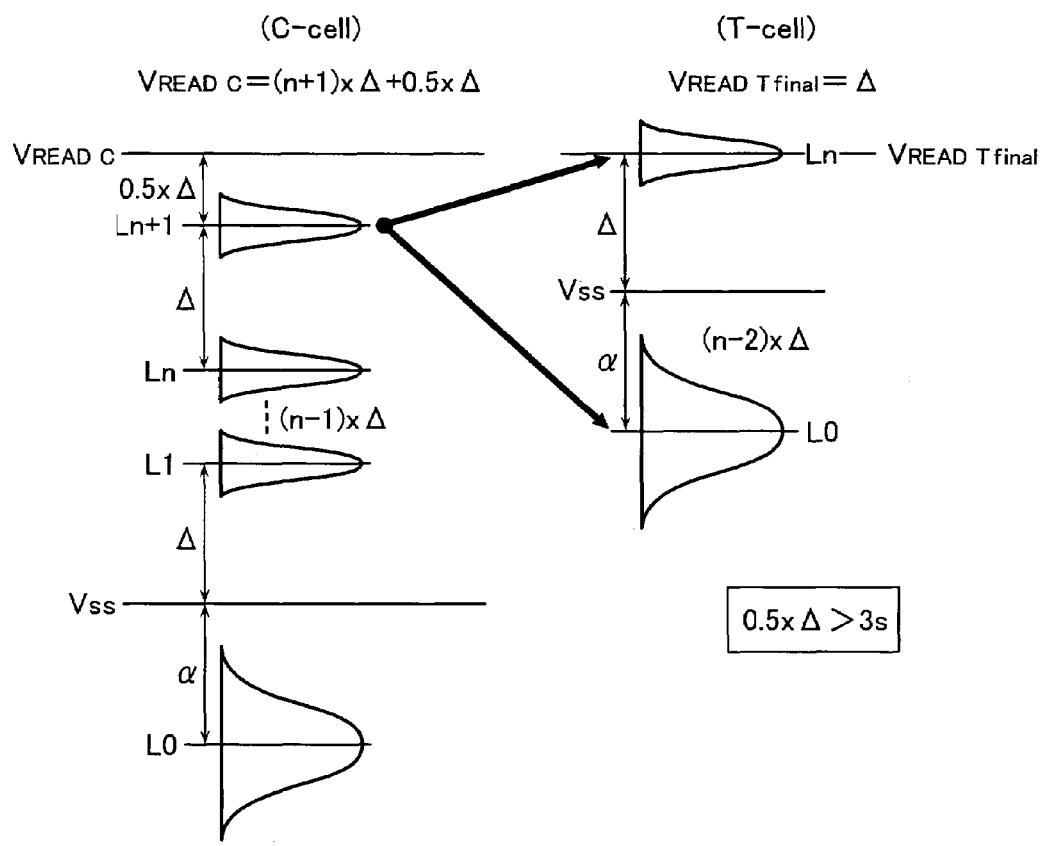
FIG. 19 is a diagram for explaining level relationships at the final read step.

FIG. 19 shows level relationships at when distinguishing the lowest level L0 from the remaining higher levels in T-cell based on the highest level Ln+1 of C-cell. The condition of that the level L0 is detectable is as follows: Δ+α>0.5×Δ+s. Substitute the minimum value Vref+s for α, and the above-described expression is rewritten as follows: 0.5Δ>2s−Vref. Since this condition is satisfied when the expression (10) is satisfied, the above-described level detection is made possible without problems.

8-value data is expressed as (HB,MB,LB), where HB is a higher bit; MB is a middle bit; and LB is a lower bit. In FIG. 14, combination states between levels of T-cell and C-cell and data bit assignment are shown by direct lines in correspondence with the above-described 8-value data.

The highest level L4 is a basic level. Bit data is positive logic when C-cell is in the basic level L4. That is, Combinations of levels L0, L1, L2 and L3 of T-cell and level L4 of C-cell are expressed as (1,1,1), (1,1,0), (1,0,1) and (1,0,0), respectively. By contrast, bit data is negative logic when T-cell is in the basic level L4. That is, combinations of levels L0, L1, L2 and L3 of C-cell and level L4 of T-cell are expressed as (0,0,0), (0,0,1), (0,1,0) and (0,1,1), respectively.

The higher bit HB, middle bit MB and lower bit LB will be detected in this order through the plural read cycles as shown in FIGS. 15 and 16. At the beginning of the read cycles, bit data is shrunk, and the data shrinking states are successively broken off in accordance with the read cycle-advance.

P0 (Vss=0V) is an erase-verify voltage; P1 is a write-verify voltage at when level L4 is written; similarly, P2, P3 and P4 are write-verify voltages at when level L1, L2 and L3 are written, respectively; R1 is a read voltage at read step t1; R2, R3 and R4 are read voltages set for one cell of a pair cell at read cycles t2T or t2C, t3T or t3C, t4T or t4C, respectively.

At the first cycle t1 in the above-described seven read cycles, the higher bit HB is detected. At the following cycles t2T and t2C, the middle bit MB and part of the lower bit LB are detected. The remaining lower bits LB are detected at the following cycles t3T, t3C, t4T and t4C.

The higher bit HB, middle bit MB and lower bit LB are required to be sensed in this order. The cycles t2T and t2C are for detecting the middle bit of a pair cell, the higher bits of which are "1" and "0", respectively, and the order does not matter. As similarly, the order of cycles t3T and t3C for detecting the lower bit does mot matter; and the order of cycles t4T and t4C also does not matter.

[Four Levels/Cell-Four Values/Pair Cell Scheme]

In both of the above-described three levels/cell-four values/pair cell and five-levels/cell-eight values/pair cell schemes, data states are set in such a way that the highest level of one of two cells in a pair cell is set as a base level, and combinations between the base level and plural other levels of another cell, which are lower than the base level, are defined as data.

Figure 20:
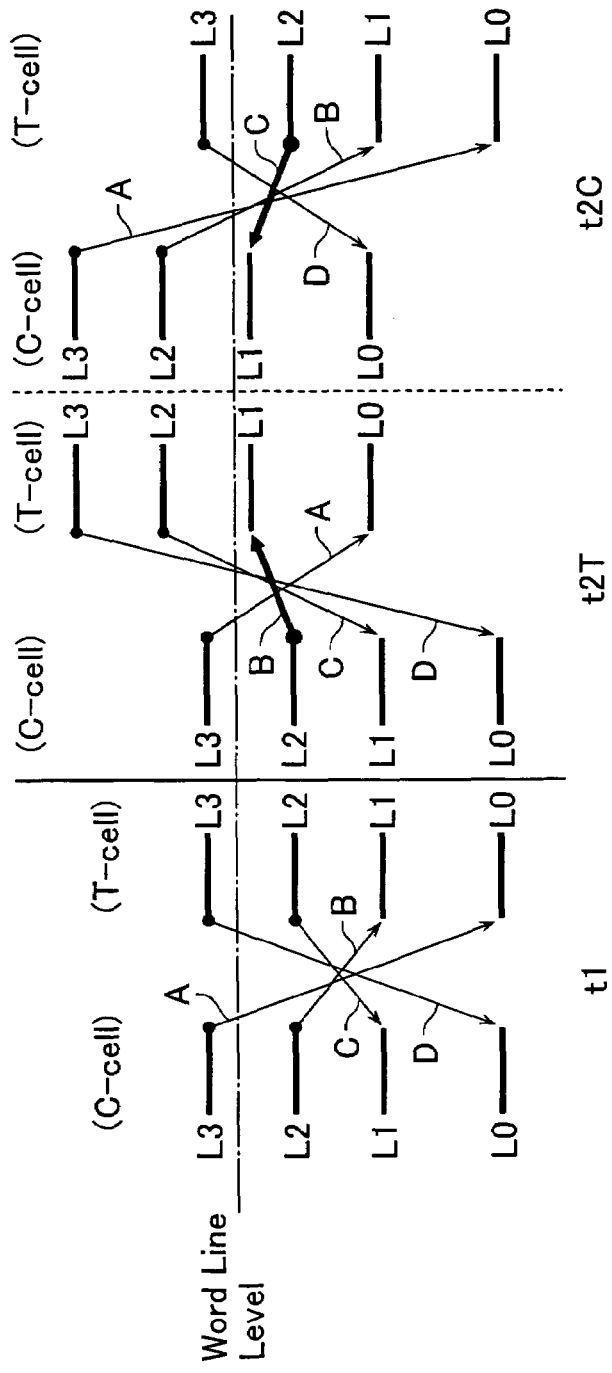
FIG. 20 shows four level relationships based on the read word line level in a four levels/cell-four values/pair cell scheme.

There will be provided other multi-value storage scheme different from the above-described schemes. FIG. 20 shows an example of four levels/cell-four values/pair cell scheme. This scheme has been provided in Unexamined Japanese Patent Application Publication No. 2004-319007, in which a basic level set for the entire bits is not used.

In this example shown in FIG. 20, four-value data is defined as follows with respect to four levels L0-L3, which are settable in a cell: the combination state between level L3 of C-cell and level L0 of T-cell is data A; the combination state between level L2 of C-cell and level L1 of T-cell is data B; the combination between level L1 of C-cell and level L2 of T-cell is data C; and the combination between level L0 of C-cell and level L3 of T-cell is data D. For example, data bit is assigned as follows: A=(1,1), B=(1,0), C=(0,1) and D=(0,0).

Data read is performed with three cycles like the above-described three levels/cell-four values/pair cell. At cycle "t1", a common word line voltage is applied to a pair cell, and cell current difference is detected so that the pair cell state is sensed. At this time, since data A and B, and data C and D are shrunk, these data may not be detected. To break off these data shrinking states, it is required to do cycles "t2T" and "t2C".

At cycle t2T, T-cell's level is apparently boosted to break off "1" data shrinking state so that data A and B are distinguished from each other. At cycle t2C, C-cell's level is apparently boosted to break off "0" data shrinking state so that data C and D are distinguished from each other.

Figure 21:
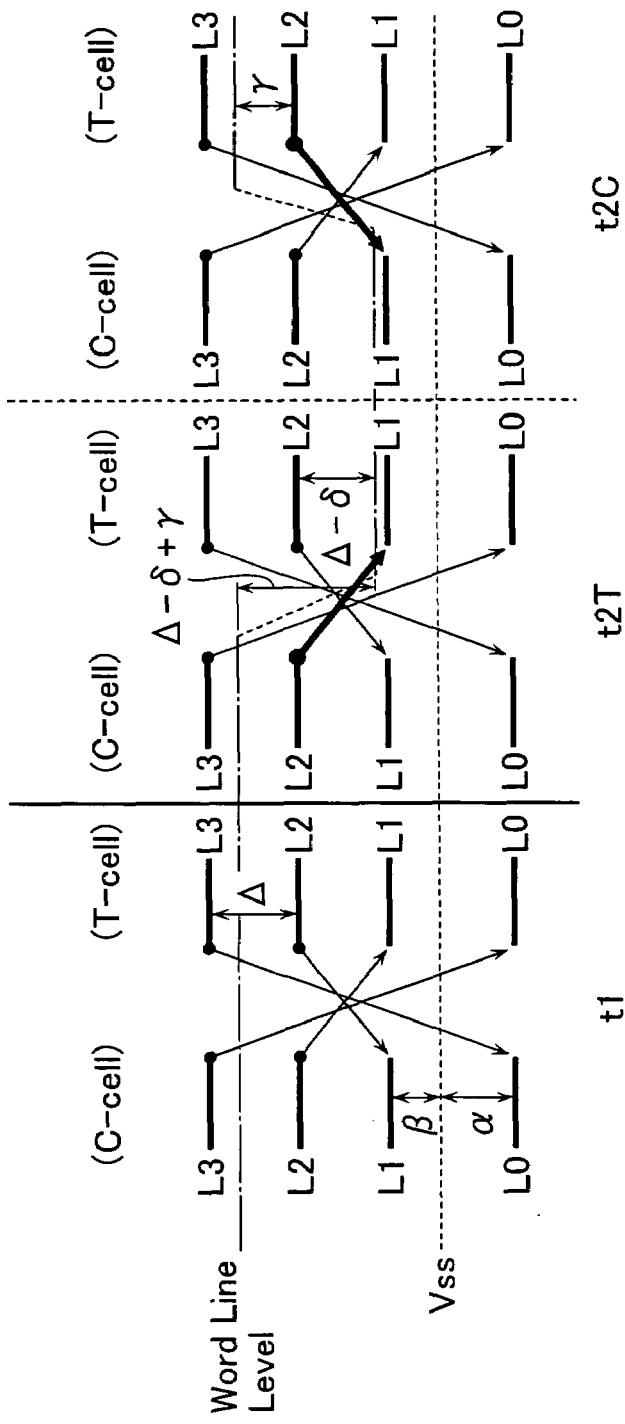
FIG. 21 shows four level relationships based on Vss in the four levels/cell-four values/pair cell scheme.

In detail, when word line read voltage is changed in accordance with the cycles t1, t2T and t2C, level relationships of the cell is shown in FIG. 21.

Figure 22:
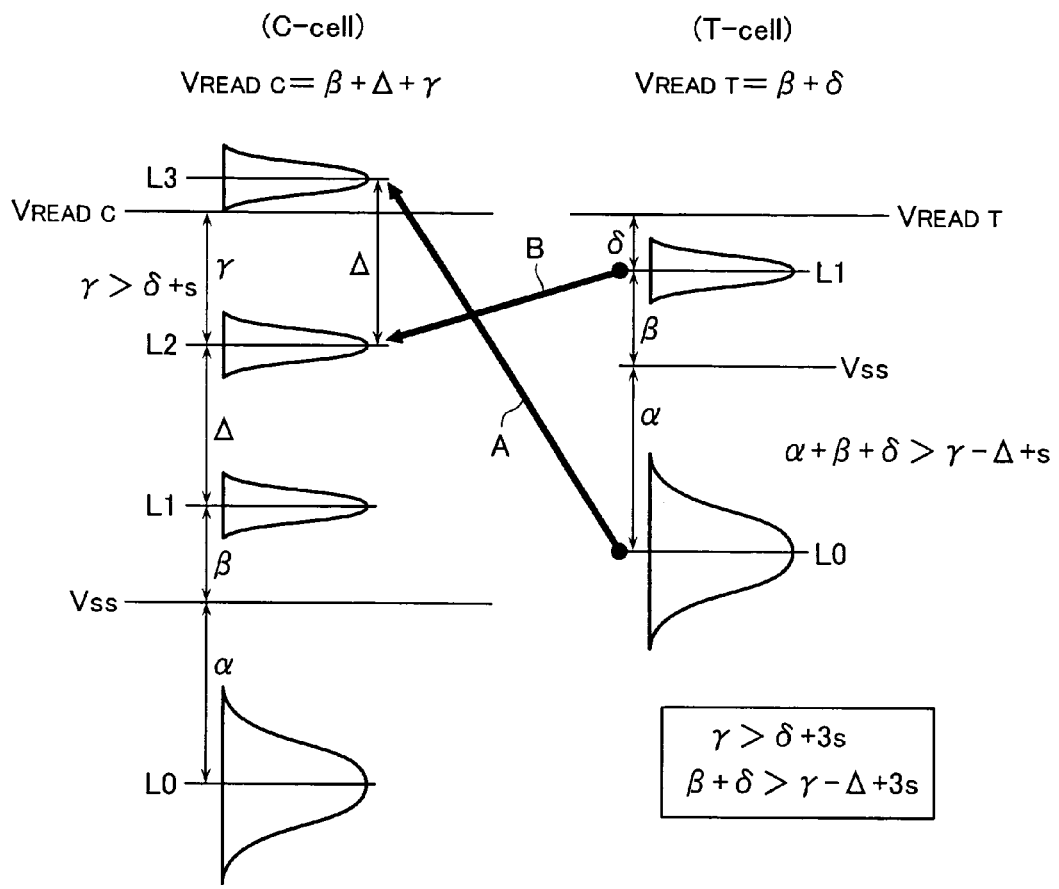
FIG. 22 is a diagram for explaining the state distinguishing condition of the pair cell.

To determine in detail the word line setting conditions, suppose that differences between levels ate defined as α, β, γ, δ and Δ as shown in FIG. 21. On this condition, the amplitude of word line swing is Δ−δ+γ. FIG. 22 shows the level relationships with word line levels $V_{READC}$ and $V_{READT}$ aligned at the cycle t2T, which is required to distinguish data A from data B.

The difference between erased threshold voltage (level L0) and Vss is α; the difference between level L1 (and verify level thereof) and Vss is β; the difference between word line level (read voltage) $V_{READT}$ of T-cell and level L1 is δ; the difference between data levels higher than L1 is Δ; and the difference between word line level (read voltage) $V_{READC}$ of C-cell and level L2 is γ. The verify level $V_{VERI}$ at a write-verify time is as follows: $V_{VERI}$=β+m×Δ.

The step t2T is for distinguishing the combination state A between the level L3 of C-cell and level L0 of T-cell from the combination state B between the level L2 of C-cell and level L1 of T-cell, so that it is in need of satisfying the following expressions (11) and (12).

$$\gamma > \delta + s \tag{11}$$

$$\alpha + \beta + \delta > \gamma - \Delta + s \tag{12}$$

On this condition, read voltages of C-cell and T-cell are expressed as follows, respectively: $V_{READC}$=β+Δ+γ; $V_{READT}$=β+δ. It is in need of considering the threshold distributions for the practical level relationships.

The expression (11) is rewritten with the minimum value γ+(Vref−s) at γ side and the maximum value δ+(Vref+s) at δ side as the following expression (13).

$$\gamma > \delta + 3s \tag{13}$$

The expression (12) is rewritten with the minimum value (Vref−s) of α and the minimum value Δ−(Vref+s) of Δ as the following expression (14).

$$\beta + \delta > \gamma - \Delta + 3s \tag{14}$$

Further, simplify the above-described expressions with a condition of: β=Δ; δ=0; and γ=Δ, the expressions (13) and (14) may be summarized in the following expression (15).

$$\Delta > 3s \tag{15}$$

Figure 23:
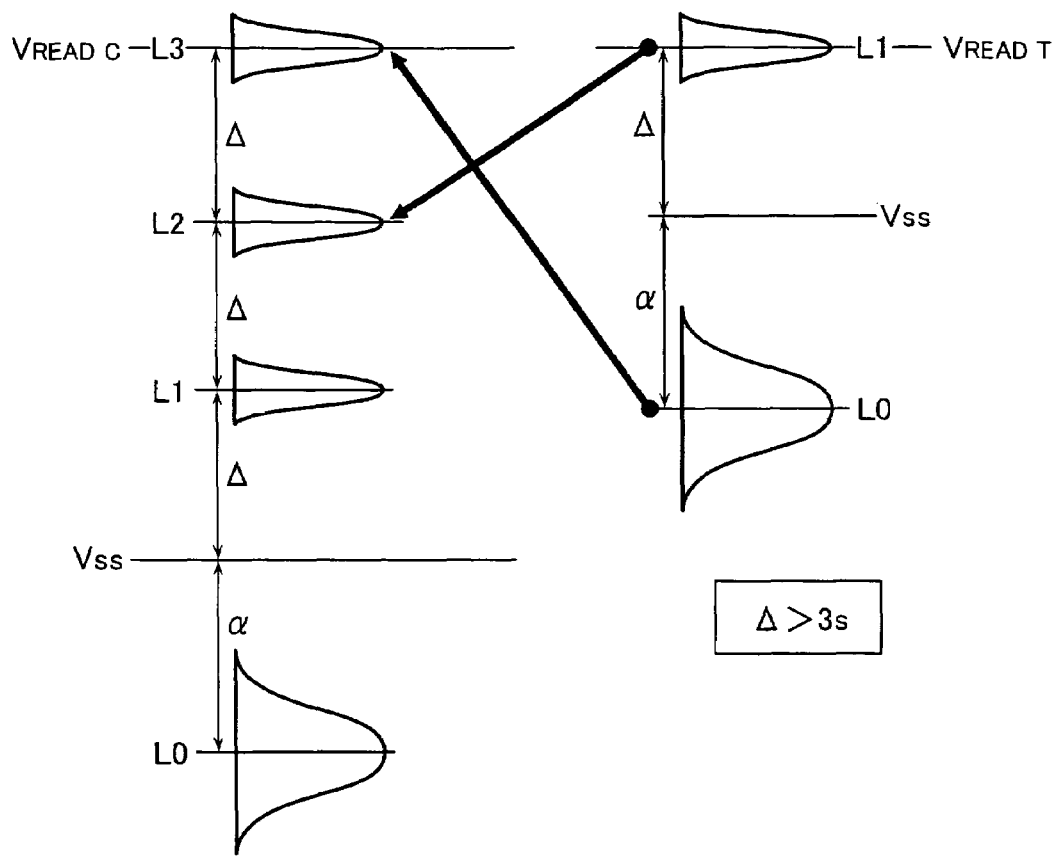
FIG. 23 is a diagram for explaining the more simplified state distinguishing condition.

FIG. 23 shows state judgment condition and level relationships on the above-described condition in correspondence with FIG. 22. The word lone levels at erase- and write-verify times may be summarized as m×Δ, i.e., a multiple of Δ. It is required that Δ is selected to be able to sufficiently separate threshold distributions from each other and significantly larger than the insensitive range of the sense amplifier.

The four levels/cell-four values/pair cell scheme is adaptable on the same condition as the three levels/cell-four values/pair cell. However, the number of cell levels is made plus one in comparison with the three levels/cell-four values/pair cell scheme. Accordingly, it should be appreciated that the three levels/cell-four values/pair cell scheme and five levels/cell-eight values/pair cell scheme are revised ones of the four-levels/cell-four values/pair cell.

In both of the above-described three levels/cell-four values/pair cell and five-levels/cell-eight values/pair cell schemes, data states are set in such a way that the highest level of one of two cells in a pair cell is set as a base level, and combinations between the base level and plural other levels of another cell, which are lower than the base level, are defined as data.

By contrast, it is also possible to set multi-value data combinations with the lowest level of cells set as a basic level. Such an example will be explained below.

[Three Levels/Cell-Four Values/Pair Cell Scheme (Part 2)]

Figure 24:
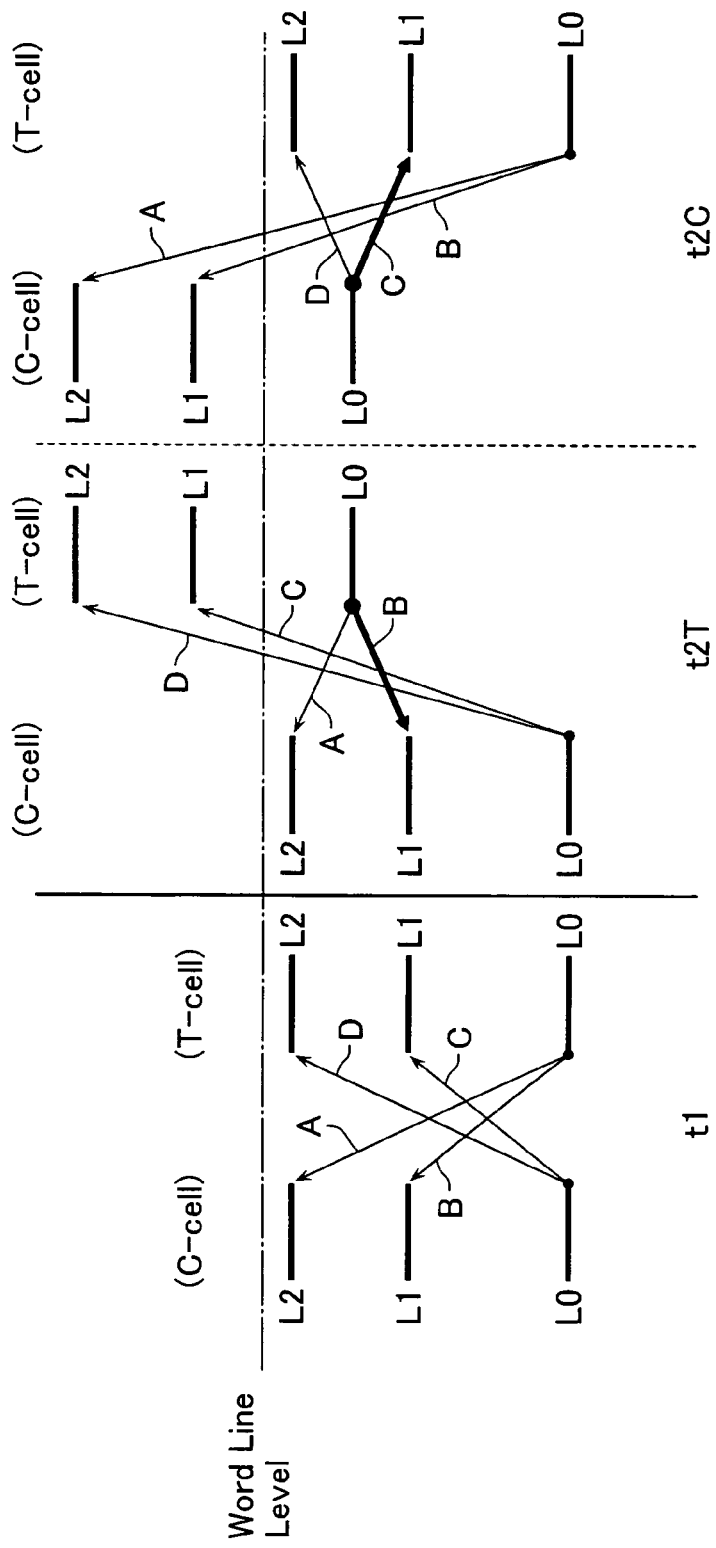
FIG. 24 shows four level relationships based on the read word line level in a three levels/cell-four values/pair cell scheme (part 2).

FIG. 24 shows a pair cell configuration of another three levels/cell-four values/pair cell scheme, in which the lowest level L0 is used as a basic level, in comparison with FIG. 7.

Figure 25:
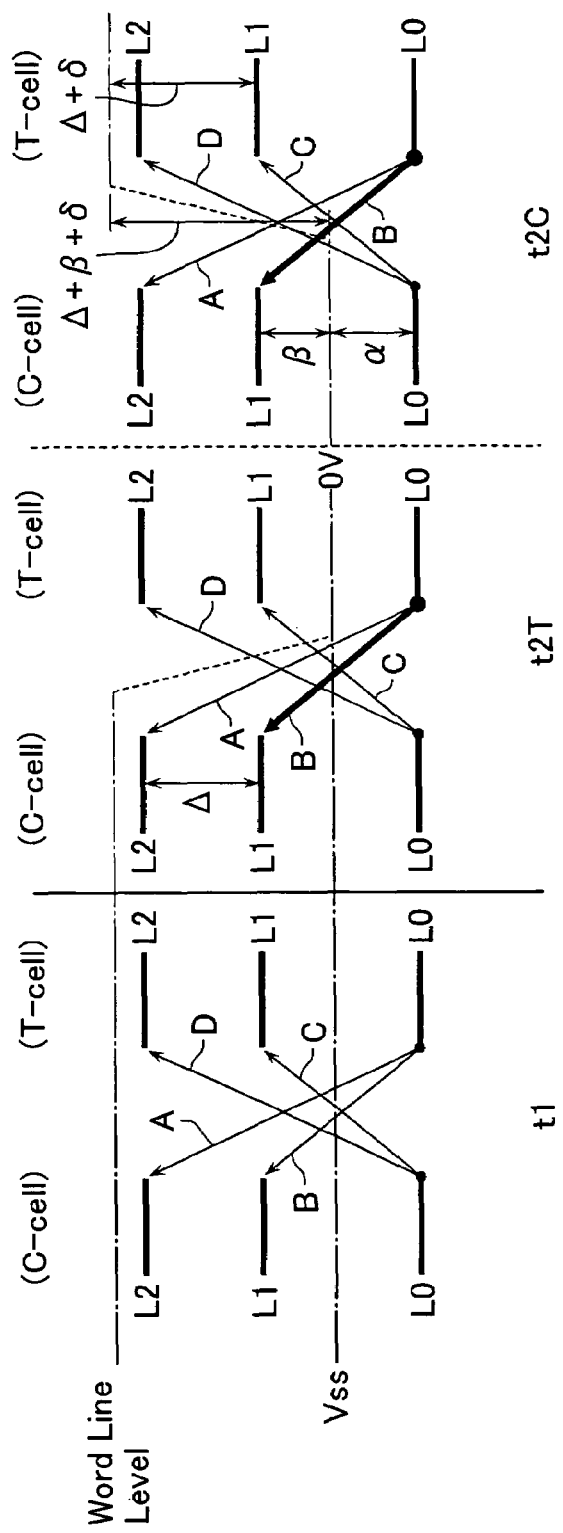
FIG. 25 shows four level relationships based on Vss in the scheme.

In this case, 4-value data may be distinguished through three read cycles t1, t2T and t2C. FIG. 24 shows a case where the word line level is kept constant through the read cycles while cell levels are relatively changed. By contrast, FIG. 25 shows another practical case where the word line level (i.e., read voltage) is changed for every cycles.

In this scheme, suppose that when C-cell's level is higher than T-cell's level, it is defined as "1", and 4-value data may be defined as follows: data A=(1,1) defined by the combination between the lowest level L0 of T-cell and the highest level L2 of C-cell; data B=(1,0) defined by the combination between the lowest level L0 of T-cell and the middle level L1 of C-cell; data C=(0,1) defined by the combination between the lowest level L0 of C-cell and the middle level L1 of T-cell; and data D=(0,0) defined by the lowest level L0 of C-cell and the highest level L2 of T-cell.

At the cycle t1, the pair cell state is detected by comparing cell currents with a common word line voltage applied to the pair cell. Data A and B are sensed as "1" while data C and D are sensed as "0", both of which are shrunk.

At the cycle t2T, T-cell's level is apparently boosted to break off "1" data shrinking state so that data A and B are distinguished from each other. That is, boost the lowest level L0 of T-cell to be near the word line level rather than the middle level, and the cell current relationship is reversed so that data A and B are detected as "1" and "0", respectively.

At the cycle t2C, apparently boost the T-cell's level, and "0" data shrinking state is broken off, whereby data C and D may be distinguished from each other.

In FIG. 25, differences between levels α, β, δ, Δ and γ are shown for the propose of examining the word line level setting condition of this scheme later. The word line amplitude is Δ+β+δ.

[Five Levels/Cell-Eight Values/Pair Cell Scheme (Part 2)]

Figure 26:
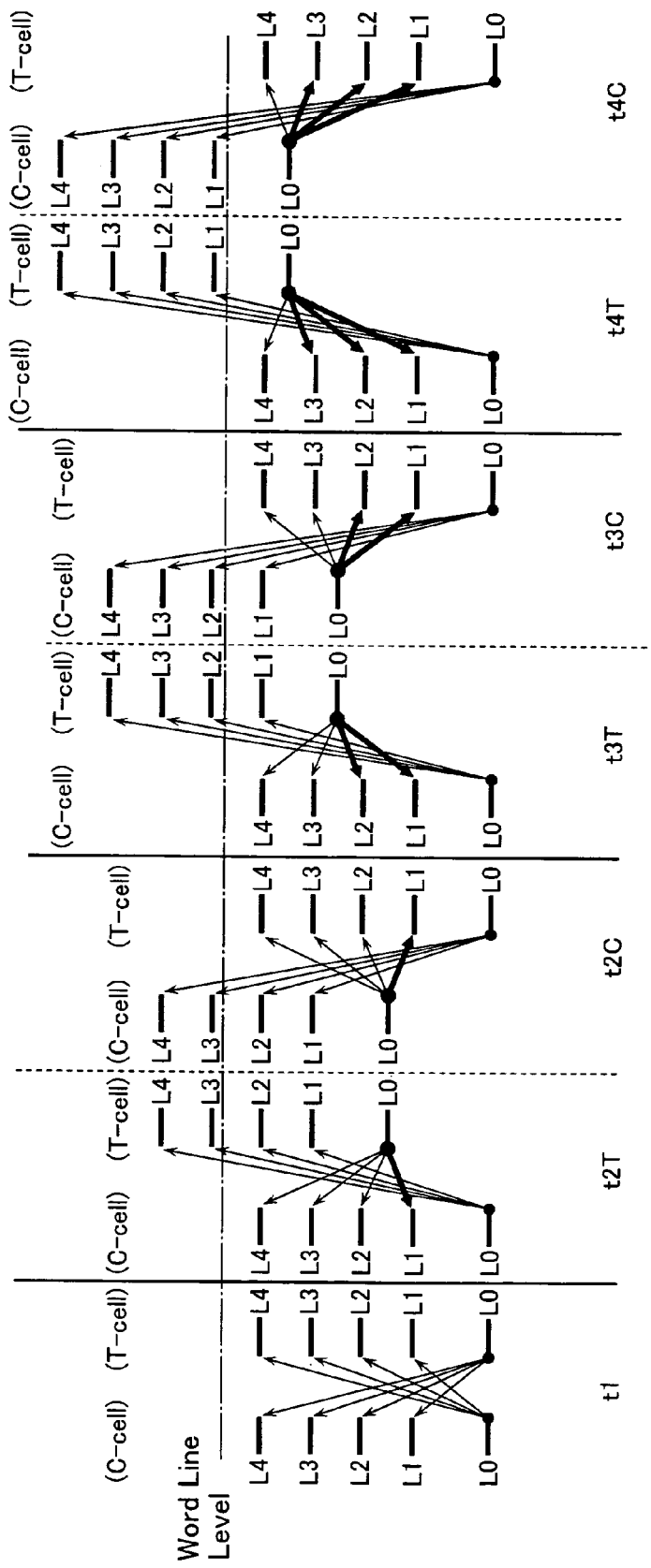
FIG. 26 shows eight level relationships based on the read word line level in a five levels/cell-eight values/pair cell scheme (part 2).
Figure 27:
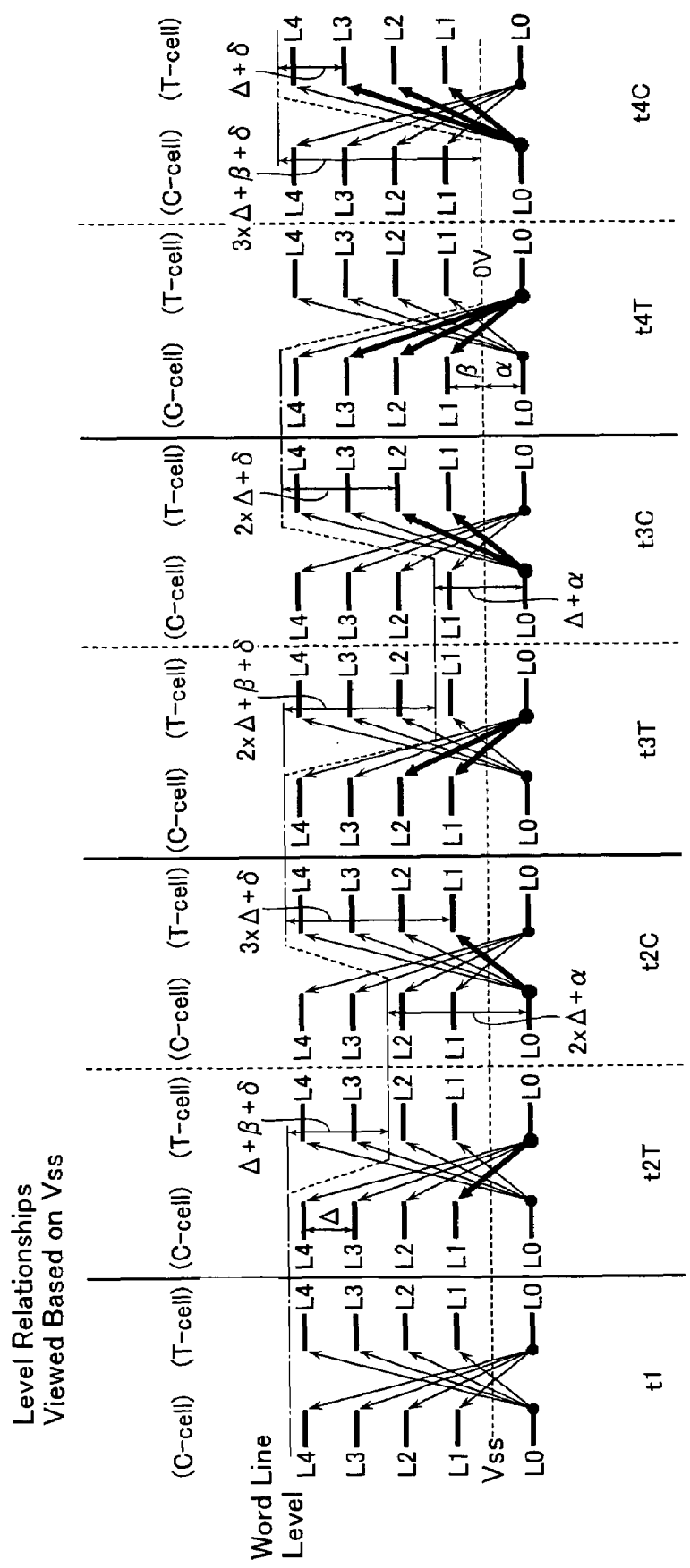
FIG. 27 shows four level relationships based on Vss in the eight values/pair cell scheme.

FIG. 26 shows a pair cell configuration of another five levels/cell-eight values/pair cell scheme, in which the lowest level L0 is used as a basic level, in comparison with FIG. 15. In this case, 8-value data may be distinguished through seven read cycles t1, t2T, t2C, t3T, t3C, t4T and t4C. FIG. 27 shows a case where the word line level is kept constant through the read cycles while cell levels are relatively changed. By contrast, FIG. 27 shows another practical case where the word line level (i.e., read voltage) is changed for every cycles.

At the cycle t1, a common word line is applied to a pair cell, and cell currents thereof are compared with each other so that the data state of the pair cell is detected. At this time, the entire data, which are defined in comparison with the lowest level of C-cell, are detected as "0" while the entire data, which are defined in comparison with the lowest level of T-cell, are detected as "1". These data shrinking states will be successively broken off in the following cycles.

At the cycle t2T, apparently boost the T-cell's level, and the "1" data shrinking state is broken off in part. At the cycle t2C, apparently boost the C-cell's level, and the "0" data shrinking state is broken off in part. Further, T-cell's level is sequentially boosted at the cycles t3T and t4T, the "1" data shrinking state will be completely broken off. Similarly, C-cell's level is sequentially boosted at the cycles t3C an d t4C, the "0" data shrinking state will be completely broken off.

In FIG. 27, differences between levels α, β, δ, Δ and γ are shown as similar to FIG. 25 for the propose of examining the word line level setting condition of this scheme later. The word line amplitude is: $\Delta+\beta+\delta$ at cycles t2T and t2C; $2\times\Delta+\beta+\delta$ at cycles t3T and t3C; and $3\times\Delta+\beta+\delta$ at cycles t4T and t4C.

Figure 28:
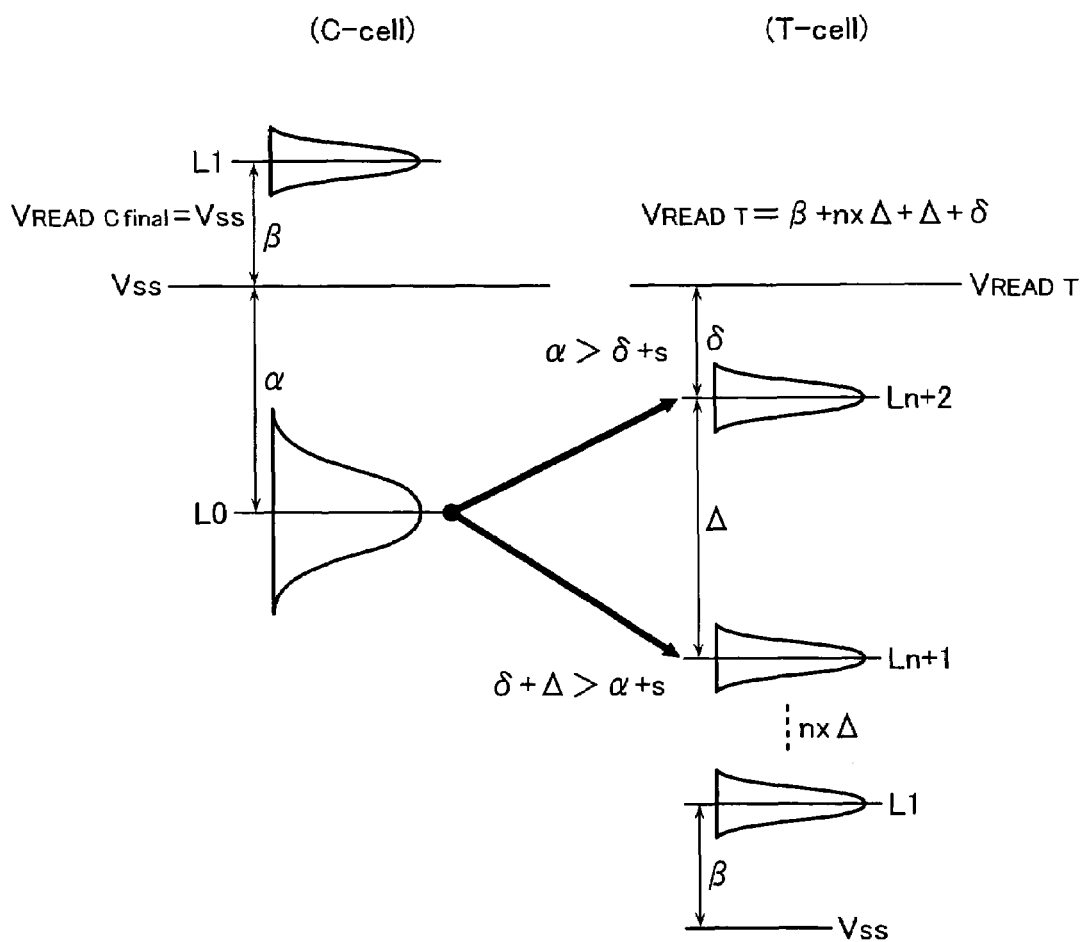
FIG. 28 is a diagram for explaining state distinguishing condition of the above-described two systems.

Next, the level setting conditions will be examined with respect to the above-described three levels/cell-four values/pair cell scheme (part 2) and five levels/cell-eight values/pair cell scheme (part 2). FIG. 28 shows level relationships in the final cycle for distinguishing the highest level Ln+2 from the remaining lower levels with respect to T-cell in comparison with the lowest level L0 of C-cell, in which the word line level is fixed.

The difference between erased threshold voltage (level L0) and Vss is $\alpha$; the difference between level L1 and erase-verify voltage Vss is $\Delta$; the difference between word line level (read voltage) $V_{READT}$ and the highest level Ln+2 is $\delta$; the difference between data levels is $\Delta$. The word line level (verify voltage) $V_{VERI}$ at a write-verify time is as follows: $V_{VERI}=\beta+m\times\Delta$.

To distinguish the highest level Ln+2 from the following level of T-cell in association with the lowest level L0 of C-cell, it is in need of satisfying the following expressions (16) and (17).

$$\gamma>\delta+s \tag{16}$$

$$\Delta+\delta>\alpha+s \tag{17}$$

Here, word line levels of C-cell and T-cell are Vss and $\beta+n\times\Delta+\delta$, respectively. It is in need of considering the threshold distributions for the practical level relationships. The expression (16) is rewritten with the minimum value Vref−s of $\alpha$ and the maximum value $\delta+(Vref+s)$ at $\delta$ side as the following expression (18).

$$0>\delta+3s \tag{18}$$

The expression (17) is rewritten in consideration of the minimum value $\Delta+\delta+(Vref-s)$ of $\Delta+\delta$ and the maximum value $\alpha MAX$ of $\alpha$ as the following expression (19).

$$\Delta+\delta>\alpha MAX+2s-Vref \tag{19}$$

It is difficult to satisfy the condition defined by the expression (19) because $\alpha MAX$ is not controllable, and it is difficult to decide $\delta$ itself.

According to the above-described examination, four values/pair cell (part 1) and eight values/pair cell (part 1), in which the combinations of the multi-value data are defined based on the highest level of each cell, are more preferable than the four values/pair cell (part 2) and eight values/pair cell (part 2), in which the combinations of the multi-value data are defined based on the lowest level of each cell.

[Detail of the Three Levels/Cell-Four Values/Pair Cell Scheme (Part 1)]

Figure 29:
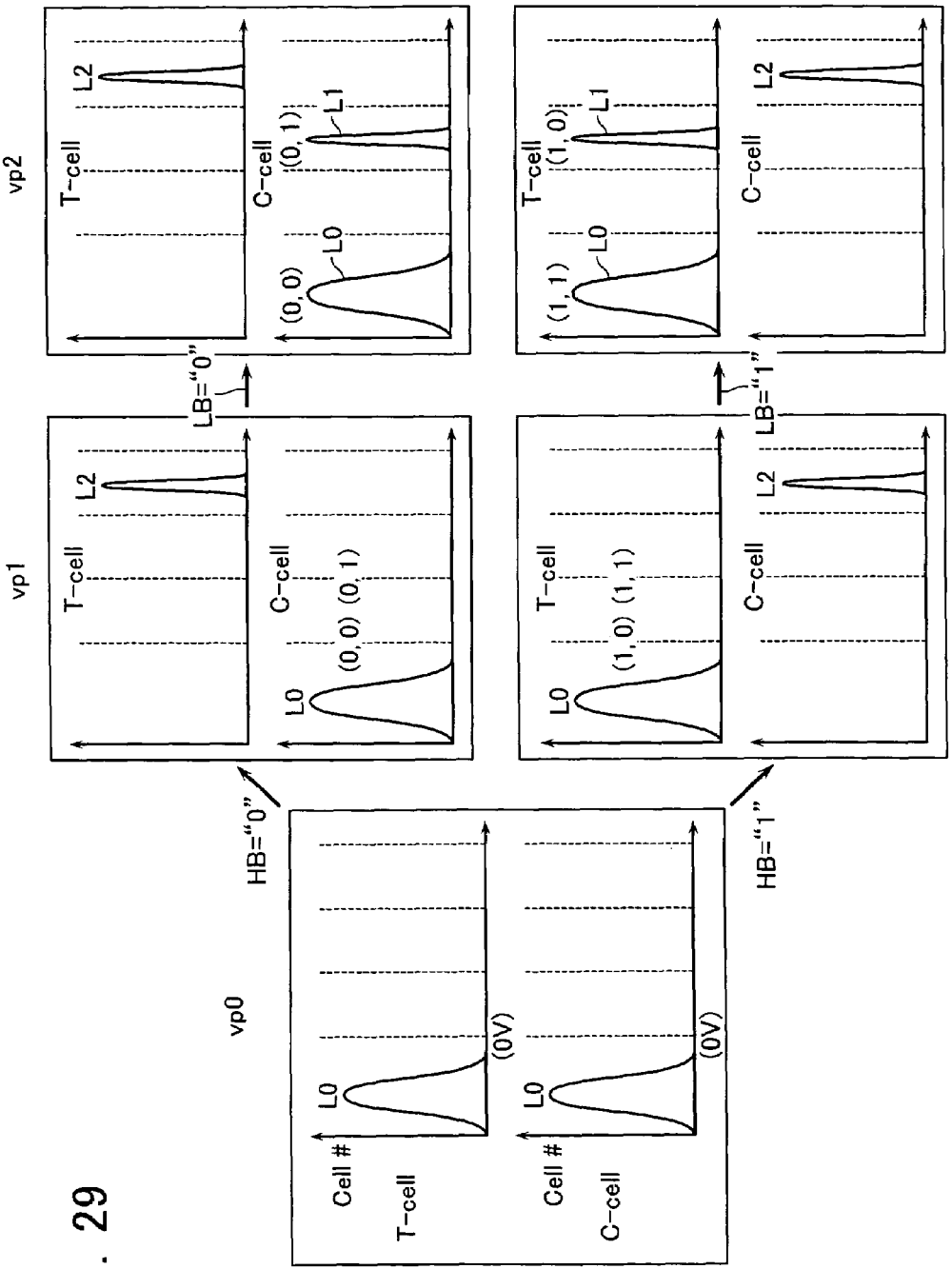
FIG. 29 is a diagram for explaining a write sequence in the three levels/cell-four values/pair cell scheme (part 1).

FIG. 29 shows erase and write sequences of the three levels/cell-four values/pair cell scheme (part 1).

"vp0" is a verify-erase step of pair cells. At this erase step vp0, erase voltage application to cells in a selected block and an erase-verify operation for comparing a cell current with that of reference cell (i.e., a cell, effective threshold voltage of which is Vref) with applying Vss to the word lines in the selected block will be repeated. As a result, the entire cells in the selected block are set to be in the lowest threshold level L0 where the cell current is detected to be in the data "1" state. The detail will be described later.

Verify-write steps "vp1" and "vp2" are for supplying the upper bit HB and the lower bit LB as write data and translating those to cell levels, thereby successively writing data into erased cells.

At the write step vp1, the threshold voltages of C-cell and T-dell are boosted to the highest level L2 serving as a basic level in accordance with "1" and "0" of the upper bit HB, respectively. In detail, the write data bits are loaded in data latches in the sense units 30, to which selected bit lines are coupled, whereby data write is performed.

As described later, write-verify and write pulse application operations will be repeated. After verifying, verify checking is performed for judging whether the write state of the pair cells is sufficient or not. When this write step vp1 ends, the entire pair cells become in a combination state of the basic level L2 and the lowest level (i.e., erased level) L0.

At this stage, data (0,0) and (0,1) are shrunk (i.e., not separated). Data (1,0) and (1,1) also are shrunk.

At the following write step vp2, the threshold voltages of part of T-cells and C-cells are boosted from the erase level L0 to the middle level L1 in accordance with "1" and "0" of the lower bits LB. When this write step vp2 ends, the entire data write operations for the pair cells ends, and each pair cell becomes to be in a state of storing 4-value data (0,0), (1,0), (0,1) or (0,0).

In case that the number of levels of multi-value is more, the same write scheme as above-described is used in such a way that the uppermost level is firstly written, following it lower levels are successively written.

(Sense Unit Configuration)

Figure 30:
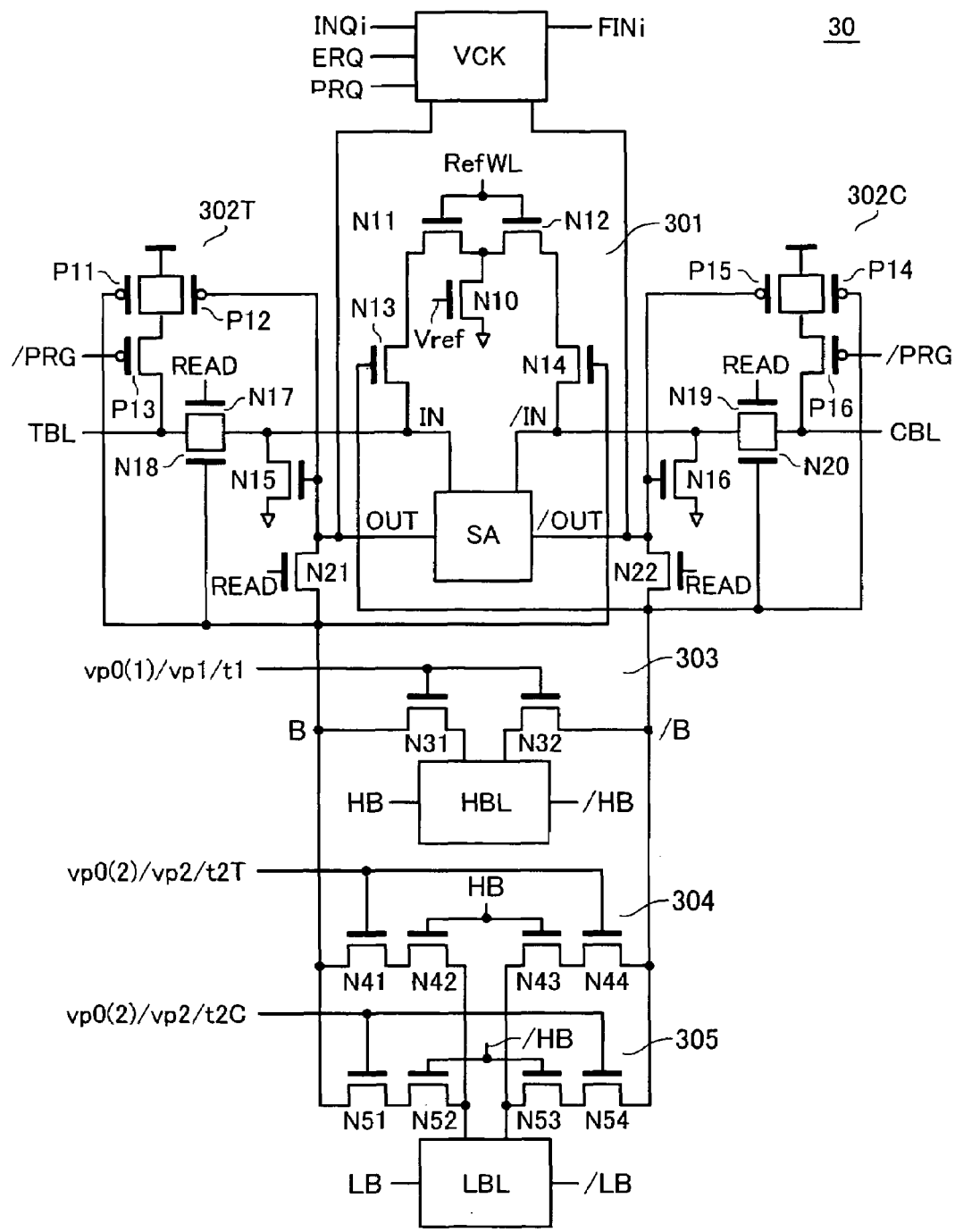
FIG. 30 shows a sense unit used in the 4-value/pair cell scheme (part 1).

FIG. 30 shows an example of the sense unit 30 in this embodiment, which is coupled to a pair of bit lines TBL and CBL. As described with FIG. 4, one sense unit 30 is shared by plural bit line pairs.

The sense unit 30 has a sense-latch system with a current detection type of difference sense amplifier SA and two data latches HBL and LBL, and a verify-result judgment system with a verify check circuit VCK. Two input nodes IN and /IN of the sense amplifier SA are coupled to bit lines TBL and CBL, respectively, in a normal read mode. To supply a reference current to one of the input nodes IN and /IN at a write-verify or erase-verify time, a reference current source 301 is prepared.

Data latches HBL and LBL serve for storing the upper bit HB and lower bit LB respectively, which are write data bits in a write mode or read data bits in a read mode.

At an erase time, data latches HBL and LBL store complementary data without regard to the upper bit HB and lower bit LB for the purpose of sequentially erasing T-cell array 1*t* and C-cell array 1*c*.

Data latches HBL and LBL have common data transferring nodes B and /B, which serve for transferring data between data latches HBL, LBL and sense amplifier SA. Nodes B and /B are coupled to output nodes OUT and /OUT of the sense amplifier SA via NMOS transistors N21 and N22, respectively, which are controlled by a read control signal READ.

Disposed between the nodes B, /B and the data latch HBL is a data transfer circuit 303 with NMOS transistors N31 and N32. This transfer circuit 303 is supplied with timing signals to be turned on at the above-described read step t1, write step vp1 or erase step vp0(1).

Disposed between the nodes B, /B and the data latch LBL are another data transfer circuits 304 with NMOS transistors N41-N44 and still another data transfer circuit 305 with NMOS transistors N51-N54. These transfer circuits 304 and 305 are selected by the upper bit data HB, /HB stored in the data latch HBL and controlled by timing signals in association with read step t2T, t2C, write step vp2 or erase step vp0(2).

The reference current source 301 has an NMOS transistor N10 with a gate, to which a reference voltage Vref is applied.

This transistor N10 serves as a reference cell, which carries a reference current for comparing a cell current to be sensed with it. This NMOS transistor N10 is selectively coupled to one of the input nodes IN and /IN at the write or erase time. That is, the transistor N10 is coupled to the input nodes IN and /IN via NMOS transistors N11 and N12 driven by a reference word line RefWL and NMOS transistors N13 and N14 driven by the data transfer nodes /B and B, respectively.

The input nodes IN and /IN are coupled to the bit lines TBL and CBL via NMOS transistors N17 and N19, respectively, which are driven by the read control signal READ. Disposed in parallel with these NMOS transistors N17 and N19 are NMOS transistors N18 and N20, which are complementarily driven by nodes /B and B, respectively.

Accordingly, NMOS transistors N17 and N19 are turned on at the read time, so that bit lines TBL and CBL are coupled to the input nodes IN and /IN. At this time, the reference source 301 is not coupled to the sense amplifier SA.

At the write time and erase time, NMOS transistors N17 and N19 are kept off. In accordance with data stored in the data latches HBL and LBL at this time, either one of NMOS transistors N18 and N20 is turned on, and either one of NMOS transistors N13 and N14 is turned on in the reference source 301. As a result, one of the bit lines TBL and CBL is coupled to one input node of the sense amplifier SA, and NMOS transistor N10 of the reference source 301 is coupled to the other input node of the sense amplifier SA.

There are pull-up circuits 302T and 302C with PMOS transistors P11-P13 and P14-P16, which are coupled to the bit lines TBL and CBL, respectively. These are used for selectively pulling-up the bit lines TBL and CBL to Vdd in accordance with sensed data. Further, to reset one of the bit lines TBL and CBL, there are prepared NMOS transistors N15 and N16 connected to the bit lines TBL and CBL, respectively.

The reason of why data read may be performed with a high-speed in this embodiment is in a fact that the sense amplifier SA is formed of a current detection type differential amplifier, and a cell current difference of the pair cell is detected in a normal data read mode. The sense amplifier, which is normally used in conventional NAND-type flash memories, is configured to precharge the bit line, and then sense the bit line potential which is discharged in accordance with cell data. Therefore, data detection becomes possible after bit line discharging for a certain period.

However, in the conventional sense amplifier scheme, as the cell current is smaller, or bit line capacitance is larger, it is required of data detection to take longer bit line discharge time for data sensing. Especially, in the multi-value data storage scheme, it is in need of performing plural sense operations. Therefore, it becomes a material subject how to achieve a high-speed data read performance.

The sense amplifier in accordance with this embodiment senses the cell current's difference between T-cell and C-cell constituting a pair cell via bit line pair. To perform write-verify or erase-verify, as described in detail later, the reference current source is used, and the difference between one bit line, to which a to-be-verified cell is coupled, and the reference cell is detected. In this case, it is in need of securing a certain bit line precharge time for sensing the cell current's difference because load capacitances of the differential input nodes are significantly different from each other.

However, at the normal read time, the cell current difference of a pair cell is detected without using the reference current source, so that the load capacitances of he differential input nodes of the sense amplifier are balanced. Therefore, The relationship of which cell current is larger or smaller is determined from the beginning of the data read (cell driving), so that even if the sense amplifier is activated early in the data read time, it may be prevented from being erratically sensed. As a result, it is possible to sense data in a very short time. This is material to achieve a high-speed performance in the multi-value data storage scheme.

Further, the current detecting type of differential sense-amplifier is able to certainly detect a small difference between cell currents. This means that even if the differences between threshold voltages of multi-value data are set to be small, the data may be certainly sensed. In other words, the sense amplifier scheme in accordance with this embodiment may secure a sufficient data margin in such a case where there are used many levels in the multi-value data.

Figure 31:
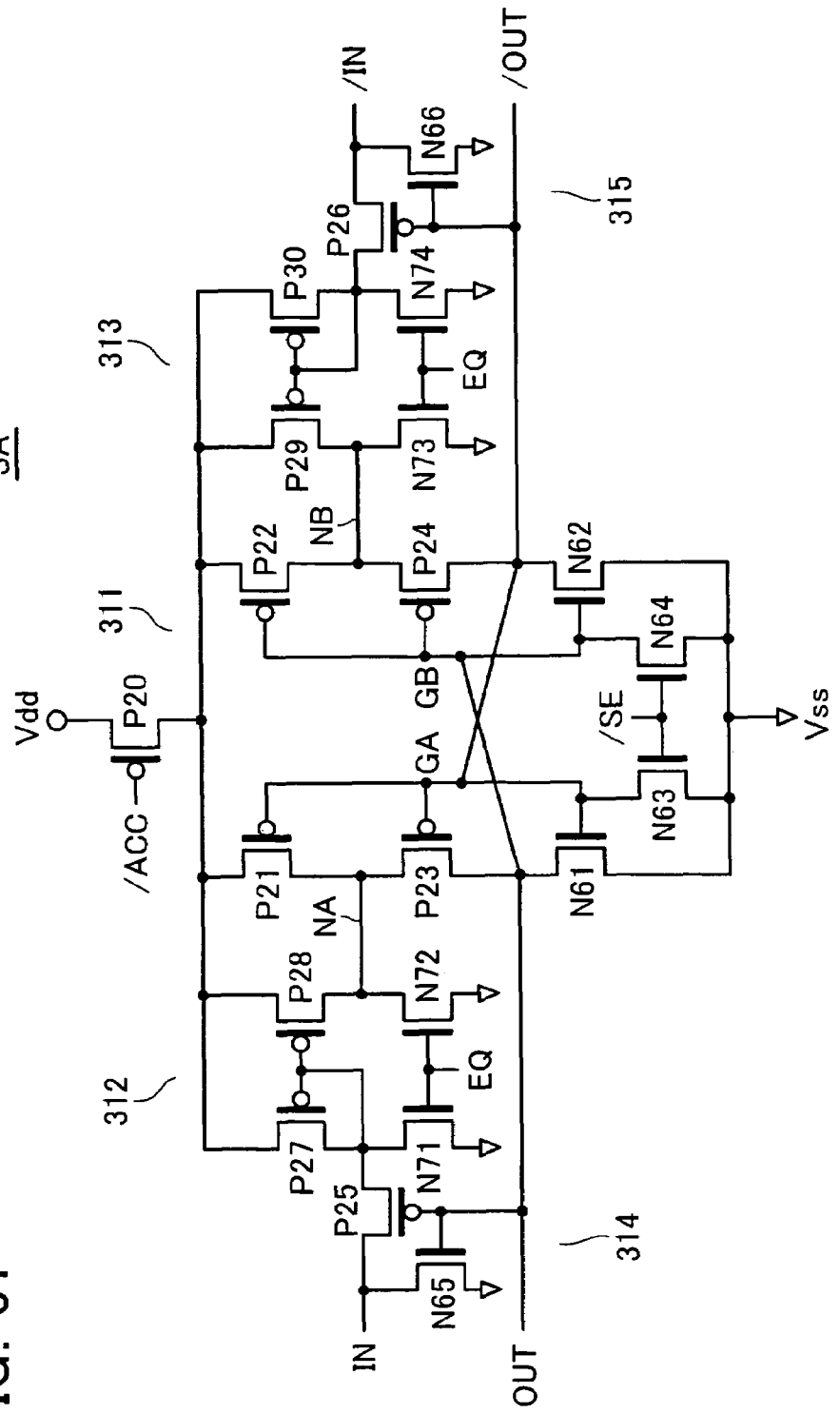
FIG. 31 shows a sense amplifier used in the sense unit.

FIG. 31 shows a detailed configuration example of the above-described sense amplifier SA. This sense amplifier SA has a kind of a flip-flop 311, which is not a normal one.

A common drain of PMOS transistor P23 and NMOS transistor N61, which are directly connected in series with a common gate GA, is connected to one output node OUT. A common drain of PMOS transistor P24 and NMOS transistor N62, which are directly connected in series with a common gate GB, is connected to the other output node /OUT. These common gates GA and GB are cross-coupled to the output nodes /OUT and OUT, respectively.

PMOS transistors P23 and P24 are coupled to the power supply node Vdd via PMOS transistors P21 and P22, respectively and via PMOS transistor P20 serving as a power switch device. Gates of PMOS transistors P21 and P22 are coupled to the common gates GA and GB, respectively.

Sources of NMOS transistors N61 and N62 are coupled to the ground potential node Vss. The common gates GA and GB are coupled to the ground potential node Vss via NMOS transistors N63 and N64, respectively.

Connection node NA between PMOS transistors P21 and P32, and connection node NB between PMOS transistors P22 and P24 serve as cell current input nodes. In the example shown in FIG. 31, current mirror circuit 312 with PMOS transistors P27 and P28 is disposed between one input node IN at the bit line TBL side and the node NA; and current mirror circuit 313 with PMOS transistors P29 and P30 is disposed between the other input node /IN at the bit line CBL side and the node NB. With these current mirror circuits, replica currents of cell currents are supplied to the nodes NA and NB.

Disposed between drains of PMOS transistors P27, P28, P29 and P30 and the ground potential node Vss are NMOS transistors N71, N72, N73 and N74, respectively, which are driven by initializing signal EQ. With these NMOS transistors, nodes NA and NB may be initialized to be Vss in response to the initializing signal EQ="H" before starting the sense operation.

At the input nodes IN and /IN, there are disposed feed-back circuits 314 and 315, respectively, for controlling these nodes in accordance with sensed result. That is, disposed between the input node IN and node NA, and between the input node /IN and node NB are PMOS transistors P25 and P26, gates of which are controlled by the output nodes OUT and /OUT, respectively. Further connected to the input nodes IN and /IN are NMOS transistors N66 and N66, gates of which are controlled by the output nodes OUT and /OUT, with sources thereof connected to the ground potential node Vss.

The operation of this sense amplifier SA will be explained below. In a normal read operation, the reference current source 301 shown in FIG. 30 is not used. In a non-active state with /ACC="H" and /SE="H", NMOS transistors N63 and N64 are "ON", and output nodes OUT, /OUT and common gate nodes GA, GB are set to be Vss.

When a pair of word lines TWL and CWL in two cell arrays are selected, and a pair of bit lines TBL and CBL are coupled to input nodes IN and /IN, respectively, the sense amplifier SA is activated with /ACC="L", and a little late /SE="L". At this time, cell currents of T-cell and C-cell of a selected pair cell are supplied to nodes NA and NB.

Just after the sense amplifier activation, NMOS transistors N61 and N63 are "OFF", but nodes OUT(=GB) and /OUT (=GA) are charged up with power supply current and cell currents overlapped thereon. Potential difference is generated between output nodes OUT and /OUT (i.e., between nodes GA and GB), flip-flop 313 is subjected to such a positive feedback that the difference voltage between output nodes OUT and /OUT is amplified, whereby the difference voltage will be increased rapidly.

For example, suppose that output OUT(=GB) is lower than output /OUT(=GA), in accordance with the feedback from /SE, NMOS transistor N61 becomes "ON"; NMOS transistor N63 "OFF"; PMOS transistors P22 and P24 "ON"; and PMOS transistors P21 and P23 "OFF", so that the output nodes OUT and /OUT become Vss and Vdd, respectively.

In accordance with the above-described current detection scheme, the cell current difference of the pair cell may be sensed in a short time. When one of the output nodes OUT and /OUT becomes Vss; and the other Vdd, one of NMOS transistors N65 and n66 becomes ON, whereby one of the input nodes IN and /IN is feed-back controlled to be Vss. This is because that it is required of the bit lines to be controlled in accordance with verify-read result at a write-verify time.

As described above, this sense amplifier SA is able to sense the cell current difference of the pair cell in a short time with the positive feedback, thereby making possible to perform a high-speed data read operation. Further, the flip-flop flows no through current, there will be provided low power consumption characteristic.

Figure 32:
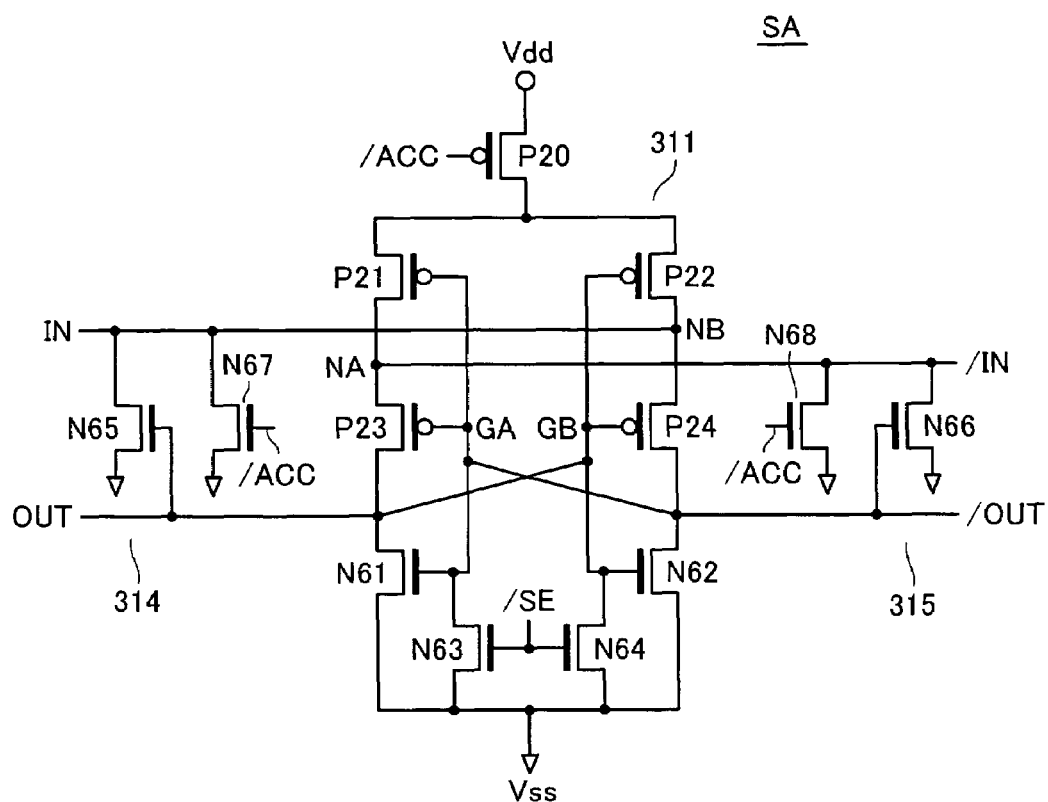
FIG. 32 shows another sense amplifier configuration.

FIG. 32 shows a more simplified sense amplifier SA with the same flip-flop 311 as that shown in FIG. 31. In this circuit, current mirror circuits 312, 313 used in FIG. 31 are omitted. In a case where replicated currents are supplied to nodes NA and NB with current mirror circuits, cell currents are added to the power supply current. By contrast, in a case where cell currents are directly supplied to the nodes NA and NB, it will become subtraction. Therefore, input nodes IN and /IN are coupled to nodes NB and NA, respectively. The connection is reverse to that in FIG. 31.

Connected to the nodes NA and NB are reset NMOS transistors N68 and N67, respectively, which are turned on complementarily to the power switch PMOS transistor P20. With these reset transistors, nodes NA and NB are set to be Vss before sensing. Feedback circuits 314 and 315 are formed of only NMOS transistors N65 and N66, respectively. With these feedback circuits, when output nodes OUT and /OUT are secured to be "H" and "L", one of the input nodes IN and /IN is set to be "L"=Vss.

Figure 33:
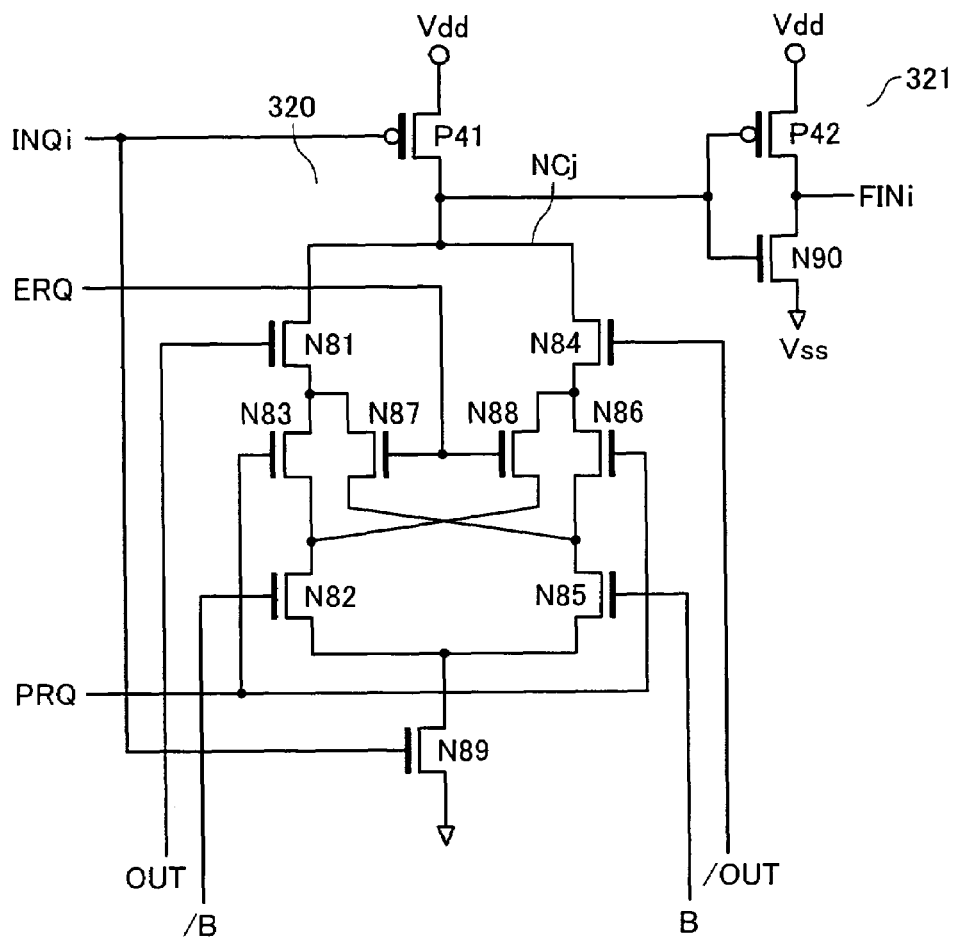
FIG. 33 shows a verify check circuit used in the sense unit.

FIG. 33 shows a detailed configuration of the verify-check circuit VCK. This circuit has a data comparator circuit 320, which detects whether the verify-read data at the output nodes OUT and /OUT of the sense amplifier SA is identical with the expectance data held in data latch HBL or LBL at a write or erase verify time.

Expected cell states at the erase-verify time and the write-verify time are different from each other. That is, the erase-verify is for verifying that the cell threshold voltage is sufficiently lowered while the write-verify is for verifying that the cell threshold voltage is increased to a certain level. Explaining in detail, the erase-verify ends at when it is detected that data are inverted in logic at nodes B and /OUT, or at nodes /B and OUT while the write-verify ends at when it is detected that data are identical in logic with each other at nodes B and /OUT, or at nodes /B and OUT.

Therefore; four current passages are disposed between PMOS transistor P41 and NMOS transistor N89, which are turned on or off complementally in response to a check input signal INQi.

A first passage formed of NMOS transistors N81 and N82, gates of which are coupled to nodes OUT and /B, respectively, and NMOS transistor N83 disposed therebetween and controlled by a check signal PRQ at a write-verify time; and a second passage formed of NMOS transistors N84 and N85, gates of which are coupled to nodes /OUT and B, and MOS transistor N86 disposed therebetween and controlled by the check signal PRQ at the write-verify time constitute a data comparator in a data write mode.

A third passage formed of NMOS transistors N81 and N85, and NMOS transistor N87 disposed therebetween and controlled by a check signal ERQ at an erase-verify time; and a fourth passage formed of NMOS transistors N84 and N82, and MOS transistor N88 disposed therebetween and controlled by the check signal PRO at the erase-verify time constitute a data comparator in a data erase mode.

Drain node NCi of PMOS transistor P41, the source of which is coupled to the power supply voltage Vdd, is precharged to be in a "H" level during INQi="L". When INQi="H" is input, and verify-read data becomes expectance data, the node NCi will be discharged to be in an "L" level. In response to this level transition of the node NCi, an inverter 312 outputs FINi="H".

Figure 34:
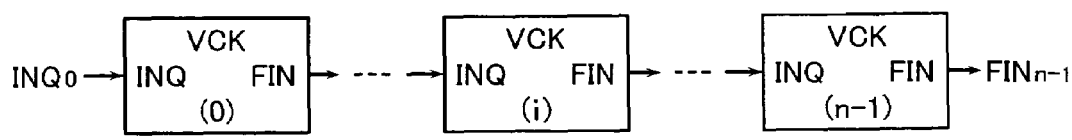
FIG. 34 shows a verify-judgment circuit.

As shown in FIG. 34, the verify-check circuits in the entire sense units, to which data of a page are read simultaneously, are coupled in such a dominos manner that a check output FIQi becomes the following check input INQi+1. At a verify-judge time, check signal INQ="H" is input to the first state verify-check circuit VCK0. If there is an incompletely written or erased cell, the final check output signal FINn−1 is "L". When the entire cells of one page are written and erase is sufficiently performed, there is provided FINn−1="H", that serves as a pass flag signal designating the write or erase completion.

Next, data read, verify-erase and verify-write will be explained below with reference to the above described sense unit.

(Data Read)

Figures 35, 36, 37:
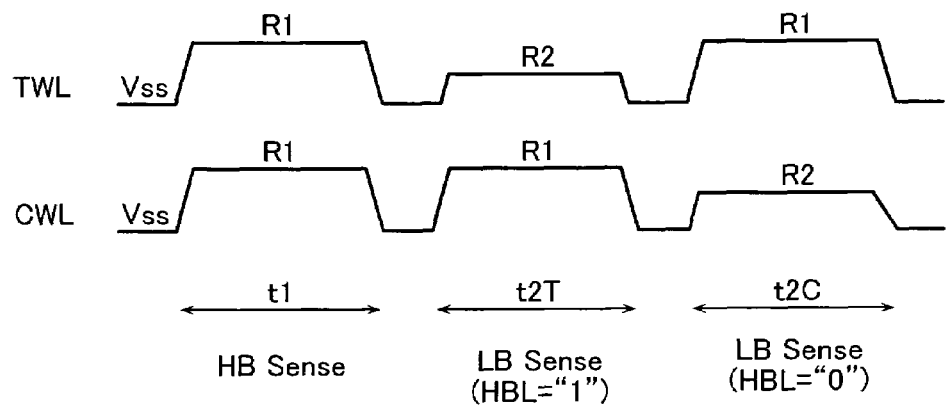
FIG. 35 shows data transition states through read cycles.
FIG. 36 shows word line read voltage change through read cycles.
FIG. 37 shows the relationship between the stored data and erase cell array at the erase time.

To read all two bits of four-value data, as described above, data read is performed with three steps t1, t2T and t2C. FIG. 35 shows data determination states of the higher bit HB and lower bit LB through the three read cycles. FIG. 36 shows read voltage changes of the word lines TWL and CWL through the three cycles. To read only the higher bit HB, only step t1 will be used.

At a first cycle t1, read voltage R1 shown in FIG. 6 is applied to both of the word lines TWL and CWL of T-cell and C-cell sides. As apparent from FIG. 6, when HB="0", C-cell current is larger than T-cell current while when HB="H", cell currents will be reversed.

Therefore, in the sense amplifier SA, HB="0" is sensed with CBL="L", and TBL="H" while HB="1" is sensed with CBL="H", and TBL="L". This sense result will be transferred to and held in data latch HBL via the transfer circuit 303.

At the step t2T, lower bit LB is sensed with respect to a pair cell of HB="1". As shown in FIG. 36, read voltages R2 and R1 are applied to the word lines TWL and CWL, respectively. At this time, with respect to the pair cell of HB="1", if lower bit LB is "1", TBL becomes lower than CBL (data "11")

while if LB="0", the levels of CBL and TBL will be reversed (data "10"). This lower bit data is transferred to and held in data latch LBL via the transfer circuit 304, which is turned on with HB="1".

At the step t2C, lower bit LB is sensed with respect to a pair cell of HB="0". As shown in FIG. 36, read voltages R1 and R2 are applied to the word lines TWL and CWL, respectively. At this time, with respect to the pair cell of HB="0", if lower bit LB is "1", CBL becomes lower than TBL (data "00") while if LB="0", the levels of CBL and TBL will be reversed (data "01"). This lower bit data is transferred to and held in data latch LBL via the transfer circuit 305, which is turned on with /HB="1".

As described above and as shown in FIG. 35, the upper bit HB is determined as "0" or "1" at the step t1; the lower bit LB is determined as "0" or "1" with respect to a pair cell of HB="11" at the step t2T; and the lower bit LB is determined as "0" or "1" with respect to a pair cell of HB="0" at the step t2C.

With the data bit assignment shown in FIG. 6 and the sense unit shown in FIG. 30, it is necessary that the upper bit HB is read out before reading the lower bit LB. That is, the lower bit data stored in a pair cell is not able to be read independently from the upper bit, but the memory system may be simplified. It should be appreciated that it is permitted to reverse the steps t2T and t2C.

According to the read method in accordance with this embodiment, cell current difference in a pair cell is detected, so that it becomes possible to read data with a high rate. For example, in the write-verify mode as described later, each cell current of a pair cell is compared with a reference cell current. In this case, since only one of differential input nodes of the sense amplifier is coupled to a bit line, load capacitances of the differential input nodes have a large unbalance. Therefore, to sense data, it is in need of comparing DC currents after waiting a bit line capacitance charging time.

By contrast, in the normal read mode, cell current difference is detected between a pair of bit lines, to which a pair cell is coupled, the loads of the differential input nodes of the sense amplifier are balanced. Therefore, without waiting a bit line charging time, data is sensed in a short time. Even if it is in need of using three cycles, it becomes possible to read data with a higher rate than the conventional NAND-type flash memory.

(Verify-Erase)

Data erase (verify-erase) is performed by repeat of an erase voltage application operation for applying an erase voltage to the entire cell in an erase unit and a verify operation for verifying the erase state. For example, with respect to the page banks disposed as shown in FIG. 3, a block including a certain plural page banks is made to be an erase unit. Alternatively, one page bank may be used as an erase unit.

The erase operation is for setting the cells to be in the state with the lowest level L0. For the purpose, the entire word lines in a selected block are applied with Vss; and a p-type well, on which the cell array is formed, is applied with erase voltage Vera, so that electrons in the floating gates of the entire cells will be discharged.

Data erase is performed for all cells coupled to bit lines disposed at both sides of the sense amplifier unit 30. By contrast, it is required for the erase verify to compare the cell current with the reference current carried from the reference source 301 in the sense unit 30. Therefore, T-cell array and C-cell array in a page bank are subjected to verify-read operations at different timings from each other.

For the purpose, two data latches HBL and LBL store complementary data so that T-cell array and C-cell array are sequentially selected. For example, as shown in FIG. 37, erase step vp0 shown in FIG. 29 is divided into two verify-erase steps vp0(1) and vp0(2).

At the step vp0(1), in accordance with data "1" stored in the data latch HBL, T-cell array is subjected to verify-erase. At the step vp0(2), in accordance with data "0" stored in the data latch LBL, C-cell array is subjected to verify-erase.

Note here that the selection order of the cell arrays may be reversed. That is, with HBL="0" and LBL="1", C-cell array is selected at the step vp0(1); and T-cell array at the step vp0(2).

Figure 38:
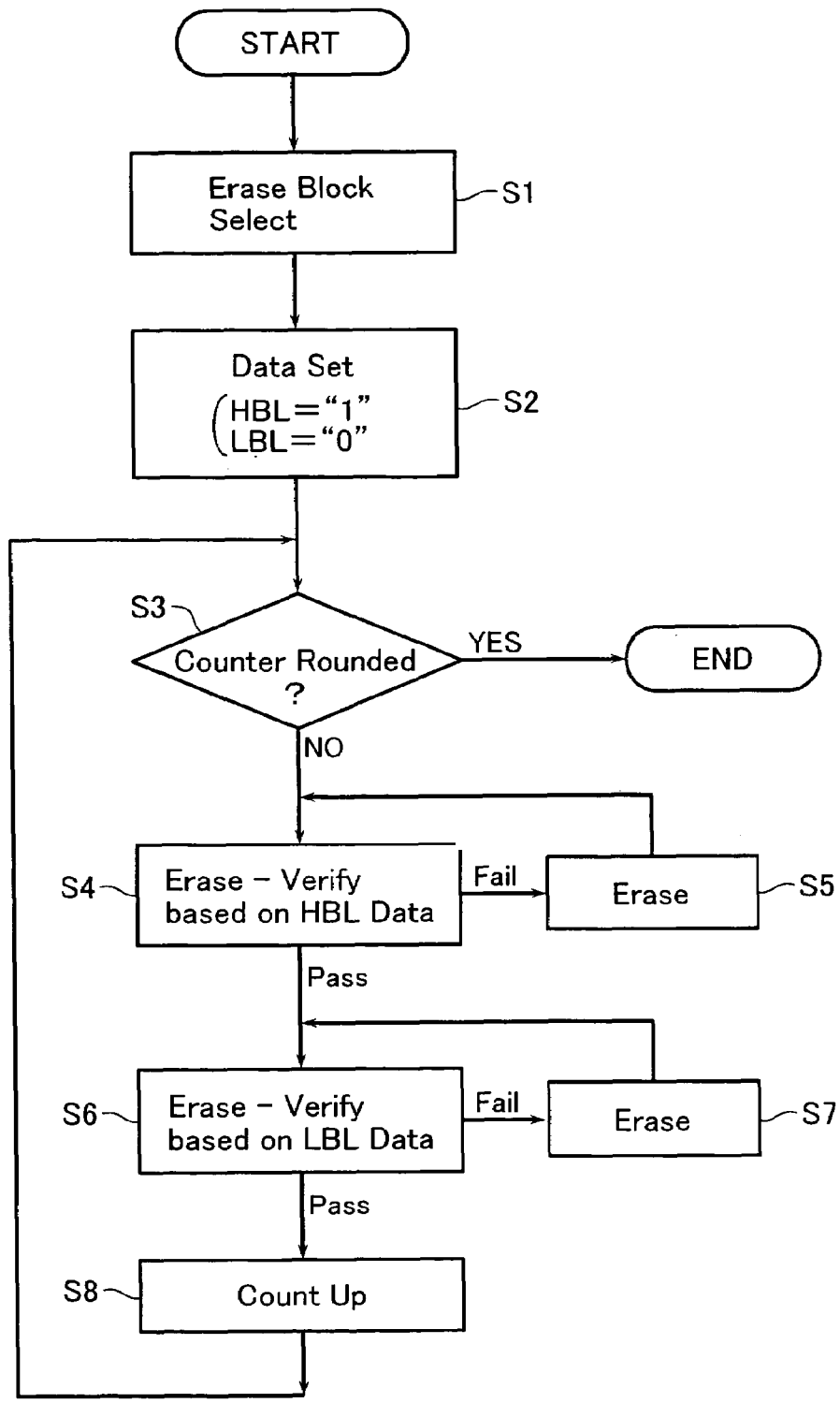
FIG. 38 shows an erase flow for one block erase.

The verify-erase operation will be explained in detail below with reference to FIGS. 38 and 39. Input command, and successively input address, and a to-be erased block is selected (step S1). Next, data "1" and "0" are set in data latches HBL and LBL, respectively, in the sense unit 30 (step S2).

To set such the data, there is prepared a certain reset circuit in the data latch system in the sense unit 30, which is not shown in FIG. 30. For example, there is disposed such a reset circuit that data latch LBL is set to be in a "0" state, and in response to it, data latch HBL is set to be in a "1" state.

In the chip, an address counter is prepared, which is able to sequentially select the entire page banks in a blocks and NAND blocks therein. The erase-verify is controlled based on this address counter. It is detected whether the address counter made a round or not (step S3). If "NO", verify-erase operations are sequentially performed in accordance with data stored in data latches HBL and LBL.

At the erase step vp0(1), the transfer circuit 303 is turned on. If data "1" is stored in data latch HBL, T-cell array is selected based on the data of data nodes B and /B. That is, one bit line TBL is coupled to input node IN of the sense amplifier SA; and the other bit line CBL is separated from the sense amplifier SA while reference cell N10 is coupled to input /IN of the sense amplifier.

Under this condition, erase-verify is performed (step S4). In case there is an insufficiently erased cell, the erase voltage is applied to the entire cells in a block (step S5).

If the erase of T-cell array is passed, go to the erase step vp0(2), in which transfer circuit 304 is turned on. In accordance with data stored in data latch LBL, C-ell array is selected. In case of HBL="0", LBL="1", transfer circuit 305 is selected in place of transfer circuit 304.

Erase-verify is performed as similar as the above-described (step S6). In case there is an insufficiently erased cell, the erase-voltage is applied to the entire cells in a block (step S7).

Erase-verify in one page bank is performed for NAND block unit shown in FIG. 2 on the condition that Vss (i.e., verify-voltage P0) is applied to the entire word lines in the NAND block 8. In case that all cell in the selected NAND block becomes to be in a negative threshold state lower than the verify voltage P0, a cell current larger than the reference current flows, and an erased state will be verified.

Erase-verify checks at steps S4 and S6 are, as described above, performed with the verify-check circuit VCK. If erase is confirmed in the entire sense units simultaneously operated, FINn−1="H" (pass flag) is output.

If NAND block erase is confirmed for T-cell array and C-cell array, address counter is counted up (step S8), and then the following NAND block pairs are successively selected, and subjected to verify-erase as described above until the entire page banks in the selected block are erased.

Figures 39, 40:
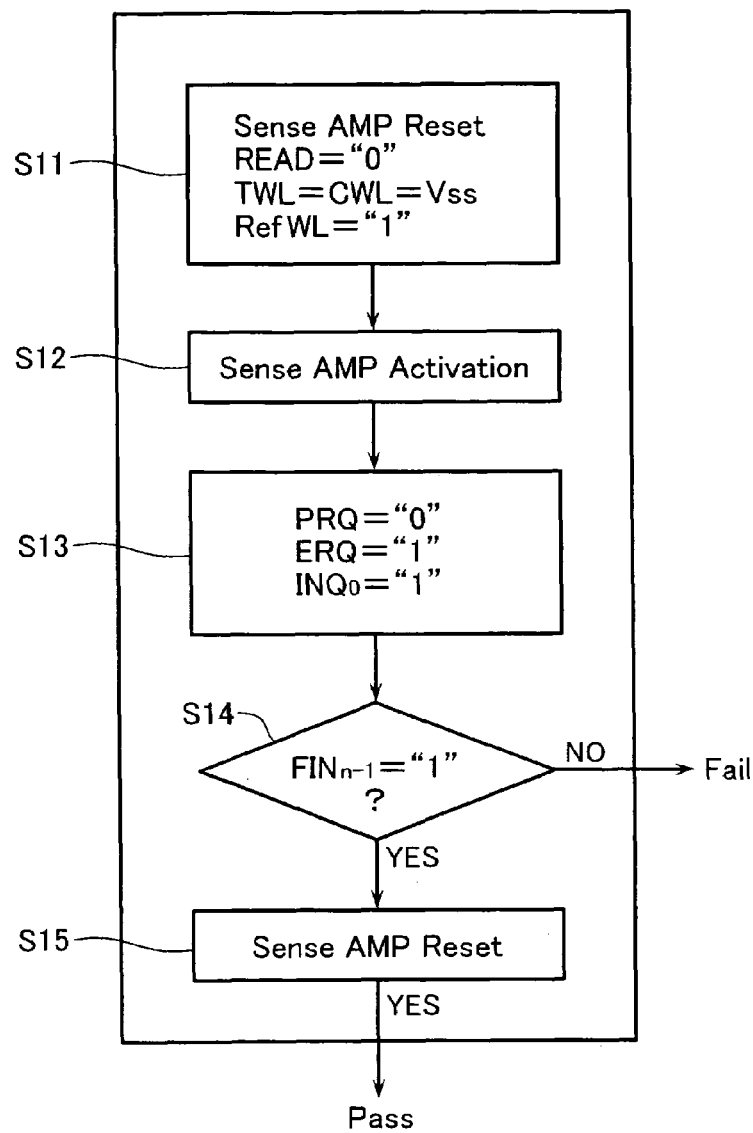
FIG. 39 shows a detailed flow of the verify steps S4 and S6 shown in FIG. 38.
FIG. 40 shows data transition states through write steps.

FIG. 39 shows a detailed flow of the erase-verify steps S4 and S6. Firstly, the sense amplifier is reset; read control signal READ is set to be "0"; the entire word lines (e.g., TWL) in a selected NAND block and the entire word line (e.g., CWL), which constitute pairs, are set to be Vss; and the reference word line RefWL is set to be "1" (step S11). As a result, a bit line is coupled to one of input nodes IN and /IN of the sense amplifier; and the reference cell to the other.

Then, the sense amplifier SA is activated (step S12). Following it PRQ="1", ERQ="1" and INQ0="1" are set, so that the verify-check circuit VCK is made operable in an erase-verify mode (step S13). Detect whether FINn−1 has become "1" or not, and the erase-verify is judged as passed or failed (step S14). If "FAIL", erase is performed while if "PASS", the sense amplifier SA is reset (step S15).

(Verify-Write)

Data write (verify-write) is, as shown in FIG. 29, performed with two steps of: verify-write step vp1 for the upper bit; and verify-write step vp2 for the lower bit. FIG. 40 shows that the upper bit HB is determined as "0" or "1" at the write step vp1; and the lower bit LB is determined as "0" or "1" with regard to the upper bit "0" and "1", respectively, at the write step vp2.

Data write is performed in such a way that a set of pair cells simultaneously coupled to the entire sense units in a page bank (i.e., a set of pair cells selected by a pair of word line TWL and CWL, and plural pairs of bit lines TBL and CBL simultaneously selected by the bit line select circuits 31t and 31c) serves as a write unit (one page).

The upper bit write and the lower bit write are the same in principle, and performed in such a way that a write operation for applying write voltage Vpgm to the selected word lines TWL and CWL and a verify-read operation for verifying the write states are repeatedly performed.

At the write voltage application time, selected NAND cell channels are set in certain potential levels in accordance with write data for aiming that electron injection into floating gates occurs in a selected cell with "0" data applied. Non-selected word lines in the selected NAND block are applied with a certain write-pass voltage, which is selected to prevent the non-selected cells from being written.

Figure 41:
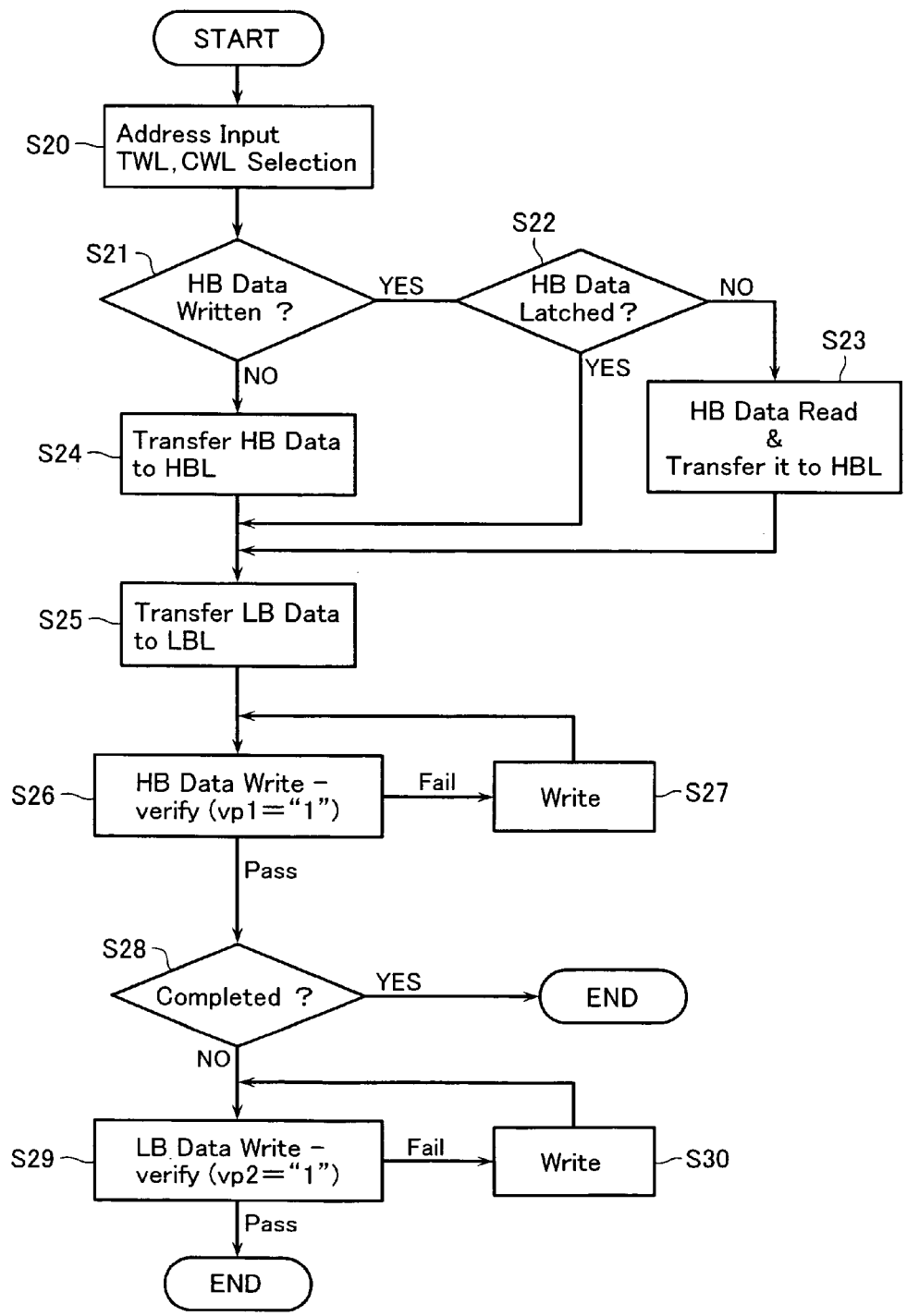
FIG. 41 shows a write flow for one page.

FIG. 41 shows a data write sequence for a write unit. Following command input select address is input, whereby a pair of word lines TWL and CWL is selected in correspondence with a selected page (step S20). It is necessary for data write to keep such an order that the upper bit HB is written, and then the lower bit LB is written. Therefore, it is in need of loading firstly the upper bit data (HB data) in data latch HBL (step S24).

In this example, it is considered such a case where the write sequence may be suspended by a read access for the same page bank. Therefore, it is judged whether the HB data has been written or not (step S21). If "NO", HB data is input from the external and loaded in the data latch HBL (step S24).

In case HB data has already been written, it is judged whether it is stored in the data latch HBL or not (step S22). If "NO", HB data is read out the cell array, and transferred to the data latch HBL (step S23).

Following it the lower bit (LB) data is externally loaded in the data latch LBL (step S25). So far, write data is ready.

Next, write-verify is performed for the HB data (step S26). At this time, in response to a write timing signal vp1="1", transfer circuit 303 is turned on, so that HB data in the data latch HBL is output to the nodes B and /B. Under the control of nodes B and /B, a bit line is coupled to one of the input nodes IN and /IN of the sense amplifier SA; and the reference cell N10 to the other, whereby verify-read is performed.

In accordance with the verify-read result, pull-up circuits 302T and 302C are controlled, and in response to the control signal /PRG="0"(="L"), one of the bit lines TBL and CBL is set to be Vdd; and the other to be Vss via reset transistor N15 or N16.

If write-verify is "FAIL", data write is performed (step S27). Data write is performed with write voltage Vpgm applied to the word lines TWL and CWL. In a cell, the channel of which is set to be Vss in accordance with HB data, electron injection into the floating gate is generated, thereby increasing the threshold voltage ("0" write). In another cell, the channel of which is set in a high potential floating state, electron injection into the floating gate will not occur ("1" write or write-inhibiting).

The same operation is repeated until the write-verify becomes "PASS". Note here there is a case where data write should be performed for only the upper bit HB. Therefore, it is judged whether the data write is completed or not (step S28).

In case it is required to do data write of the lower bit LB, LB data write-verify is successively performed (step S29). At this time, in accordance with write timing signal vp2="1" and the HB data, transfer circuit 304 or 305 is selected, and the LB data is output to the nodes B and /B.

Under the control of the nodes B and /B, a bit line is coupled to one of the input nodes IN and /IN; and the reference cell N10 to the other, and verify-read is performed. If write-verify is "FAIL", data write is performed (step S30). The same operation will be repeated until the write-verify is "PASS". When the write-verify is passed, one page data write ends.

Figure 42:
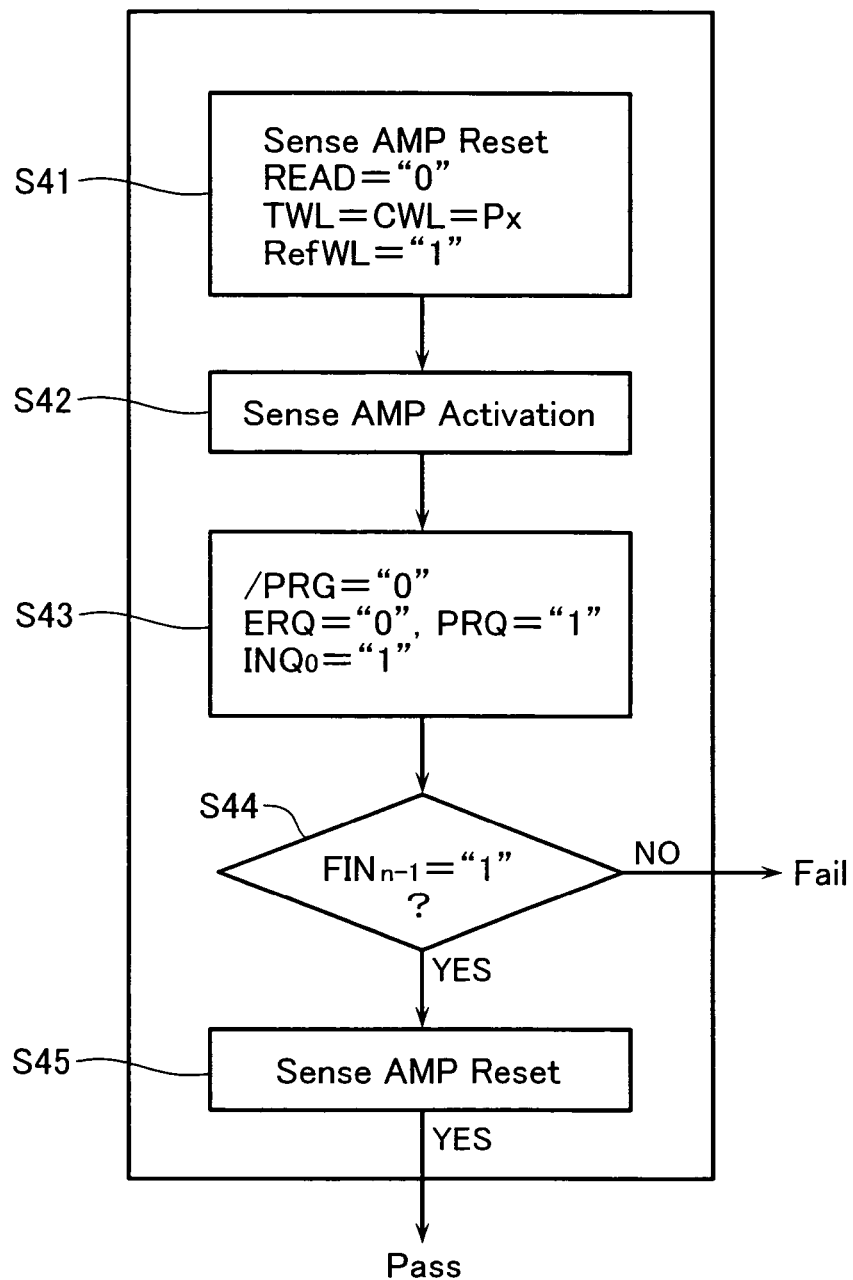
FIG. 42 shows a detailed flow of the verify steps S26 and S29 shown in FIG. 41.

FIG. 42 shows a detailed flow of the write-verify steps S26 and S29. At step S41, the sense amplifier is reset; sense amplifier and data latch are separated from each other with the read control signal READ="0"; verify voltage Px is applied to word lines TWL, CWL; and "1"(="H") is applied to the reference word line RefWL.

The verify voltage Px is, as shown in FIG. 6, selected as follows: P1 selected in case of HB bit writing for verifying that the cell threshold has been increased to level L2; and P2 selected in case of LB bit writing for verifying that the cell threshold has been increased to level L1. Each of these verify voltages P1 and P2 is defined as a word line voltage, with which the cell current becomes smaller than the reference current. Therefore, P1 and P2 are set as being slightly higher than the upper limits of the threshold voltage distributions of levels L2 and L1, respectively.

Thereafter, the sense amplifier SA is activated, and sense data (step S42). After sensing, /PRG is set to be "0", and one of bit lines TBL and CBL is set to be Vdd; and the other to Vss. Further, PRQ="1", ERQ="0", INQ0="1" are applied, so that the verify-check circuit VCK is operated in a write-verify mode (step S43). "PASS" or "FAIL" is judged whether FINn−1 has become "1" or not (step S44). If "FAIL", data write is performed. If "PASS", the sense amplifier SA is reset (step S45).

Note here that verify the read data is inverted in logic to the write data held in the data latch HBL or LBL. The reason of this is as follows. Write data for increasing the cell threshold voltage is supplied as to set a selected bit line to be in a "L"(=Vss) level; and when the desirable cell threshold voltage is written, it is read in such a manner that the selected bit line becomes "H". In consideration of this, it is required of constituting a suitable interface circuit for read data/write data transfer.

[Detail of the Five Levels/Cell-Eight Values/Pair Cell Scheme (Part 1)]

The detailed system of the five levels/cell-eight values/pair cell scheme shown in FIG. 14 will be explained below. The sense amplifier and latch system of the 4-value data storage scheme is easily expanded to that of 8-value data storage scheme. As bit data stored in a pair cell is increased, in is required to increase the number of data latches and the number of changing control signal steps. In detail, in case of 8-value/pair cell scheme, three bits, i.e., the upper bit HB, middle bit MB and lower bit LB, are used, and three data latches are used for storing the three bits data.

(Read)

Figure 43:
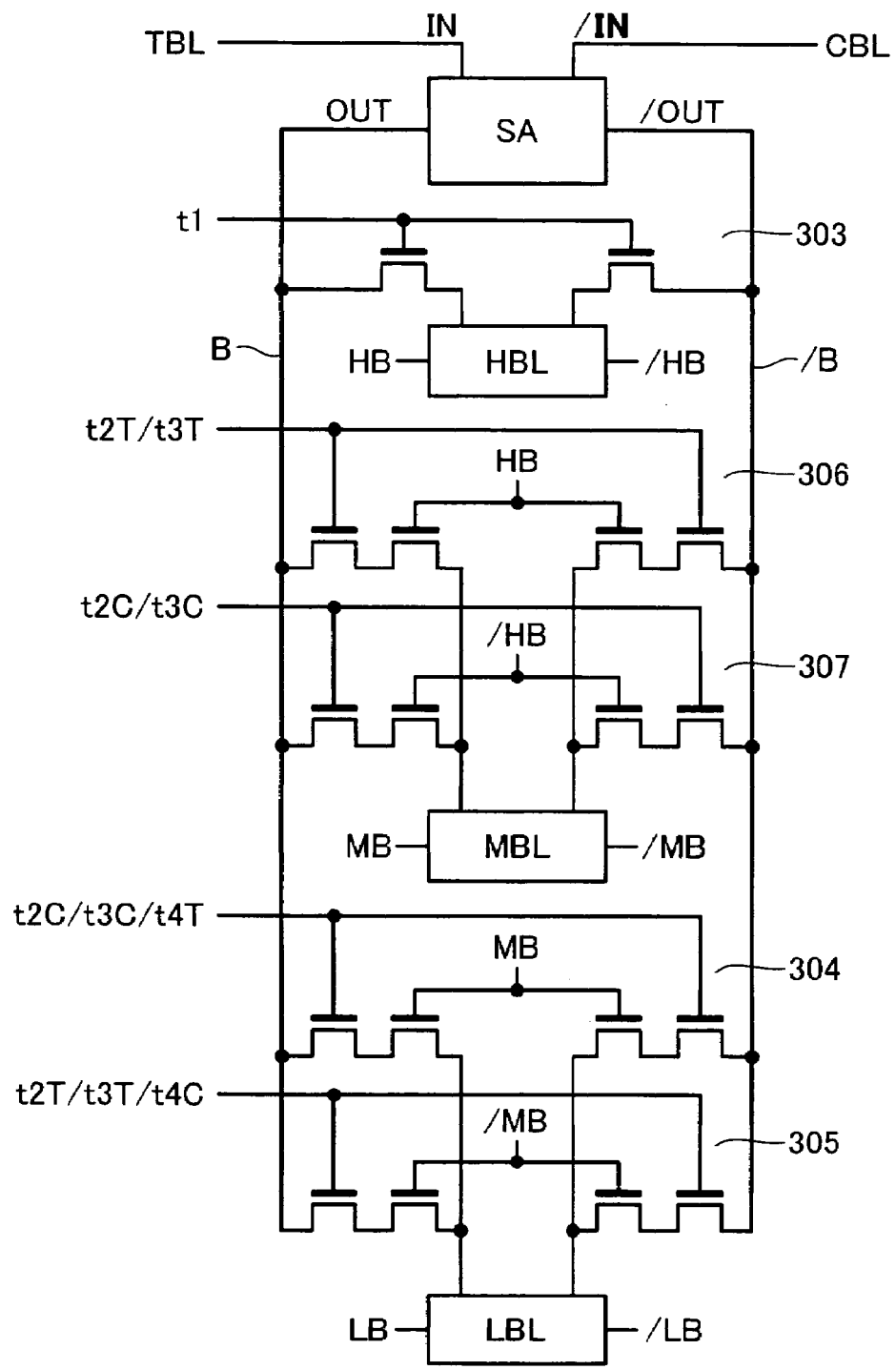
FIG. 43 shows a read system in the sense unit used in the five levels/cell-eight values/pair cell scheme (part 1).

FIG. 43 shows a sense unit configuration necessary for data read. The sense amplifier SA is the same current detection type of differential amplifier as that used in the above-described 4-value/pair cell scheme. To store the read data of upper bit HB, middle bit MB and lower bit LB, data latches HBL, MBL and LBL are prepared, respectively.

As having described above, it is required of data read to use seven steps. The operations at the steps are as follows. The read voltages R1-R4 used in the steps are shown in FIG. 14.

Step t1: read voltage R1 higher than the uppermost level L4 is applied to a selected word line pair, and the upper bit data HB of a selected pair cell is sensed. The sensed data "0" or "1" is transferred to and held in data latch HBL.

Step t2T: read voltage R2 is applied to the word line TWL on the T-cell side, which is set between levels L3 and L4; and read voltage R1 to the word line CWL of the C-cell side, and data is sensed. In case data held in the data latch HBL is "1" (i.e., HB="H"), the sensed data is transferred to and held in the data latch MBL via transfer circuit 306. Further, in case data stored in the data latch MBL is "0" (i.e., /MB="H"), the sensed data is transferred to and held in the data latch LBL via transfer circuit 305.

At this step, the middle bit MB and lower bit LB of a part of pair cells with the upper bit HB is "1" are determined. In detail, within data (111), (110), (101) and (100), data (100) is separated from the remaining to be determined.

Step t2C: read voltage R1 is applied to the word line TWL on the T-cell side; and read voltage R2 to the word line CWL of the C-cell side, and data is sensed. In case data held in the data latch HBL is "0" (i.e., /HB="H"), the sensed data is transferred to and held in the data latch MBL via transfer circuit 307. Further, in case data stored in the data latch MBL is "1" (i.e., MB="H"), the sense data is transferred to and held in the data latch LBL via transfer circuit 304.

At this step, the middle bit MB and lower bit LB of a part of pair cells with the upper bit HB is "0" are determined. In detail, within data (000), (001), (010) and (011), data (011) is separated from the remaining to be determined.

Step t3T: read voltage R3 is applied to the word line TWL, which is set between levels L2 and L3; and read voltage R1 to the word line CWL, and data is sensed. In case data held in the data latch HBL is "1" (i.e., HB="H"), the sensed data is transferred to and held in the data latch MBL via transfer circuit 306. Further, in case data stored in the data latch MBL is "0" (i.e., /MB="H"), the same data is transferred to and held in the data latch LBL. At this step, data (101) is determined.

Step t3C: read voltage R1 is applied to the word line TWL; and read voltage R3 to the word line CWL, and data is sensed. In case data held in the data latch HBL is "0" (i.e., /HB="H"), the sensed data is transferred to and held in the data latch MBL via transfer circuit 307. Further, in case data stored in the data latch MBL is "1" (i.e., MB="H"), the same data is transferred to and held in the data latch LBL via transfer circuit 304. At this step, data (010) is determined. With the above-described steps, the entire middle bit data will be determined.

Step t4T: read voltage R4 is applied to the word line TWL, which is set between levels L3 and L4; and read voltage R1 to the word line CWL, and data is sensed. In case data held in the data latch MBL is "1" (i.e., MB="H"), the sensed data is transferred to and held in the data latch LBL via transfer circuit 304. At this step, data (110) is determined.

Step t4C: read voltage R1 is applied to the word line TWL; and read voltage R4 to the word line CWL, and data is sensed. In case data held in the data latch MBL is "0" (i.e., /MB="H"), the sensed data is transferred to and held in the data latch LBL via transfer circuit 305. At this step, data (001) is determined, and data (000) is determined simultaneously.

Figure 46:
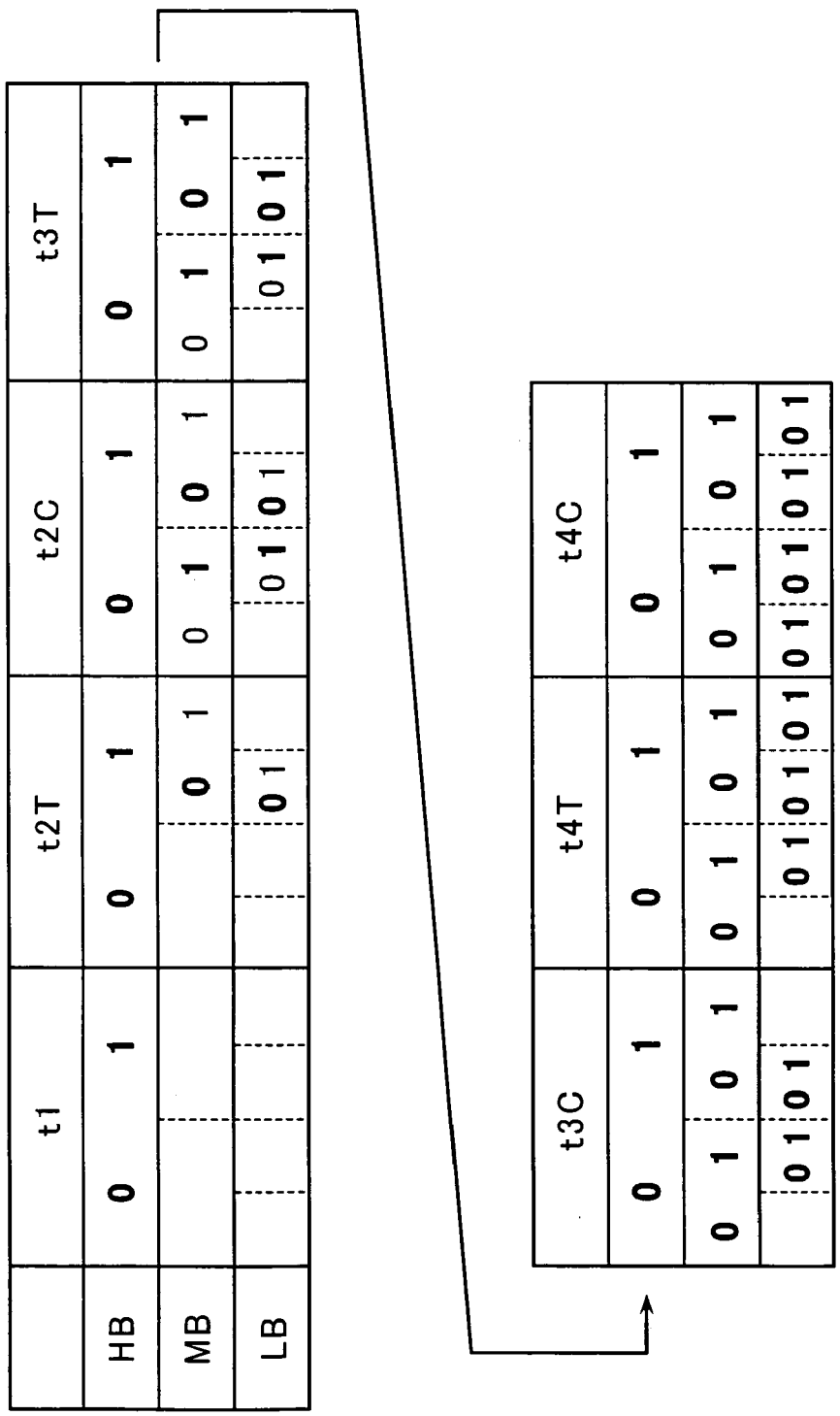
FIG. 46 shows data transition states in the read mode.

FIG. 46 shows the data determination state of 8-value data with the above-described seven steps. The determined bit data are shown by bold strokes. The upper bit HB is determined at the first step t1. The middle bit MB and part of the lower bit LB are determined through the second and third steps t2T and t2C. It is permissible that the order of the second and third steps is revered. Further, part of the remaining lower bits LB are determined through the fourth and fifth steps t3T and t3C; and the entire remaining lower bits LB are determined through sixth and seventh steps t4T and t4C. The order of the fourth and fifth steps t3T and t3C is reversible; and the order of the sixth and seventh steps t4T and t4C also is reversible.

(Verify-Erase)

Figure 44:
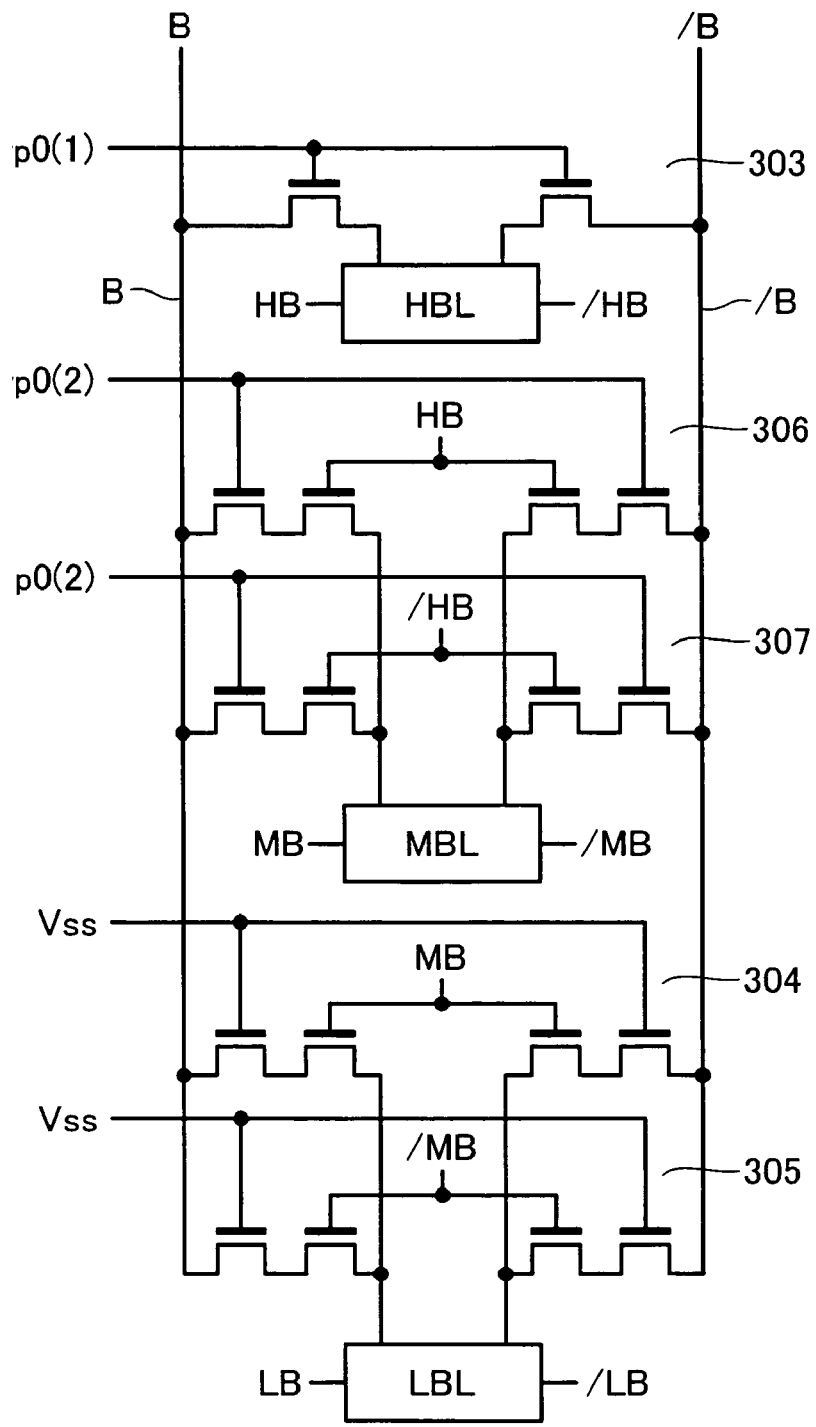
FIG. 44 shows the verify-erase system thereof.

The sense amplifier SA and verify-check circuit VCK are the same as in the case of the above-described 4-value/pair cell scheme. Therefore, the verify-erase operation will be explained with reference to FIG. 44, in which only the data latch portion in the sense unit is shown.

In the data erase mode, as similar to the above-described 4-value/paie cell scheme, T-cell array and C-cell array are sequentially erased; and for the purpose of this, complementary data are stored in two data latches. In this case, in FIG. 44, two data latches, HBL and MBL, are used.

Data latches HBL and MBL store "0" and "1", respectively. The complementary data are sequentially read in response to timing control signals vp0(1) and vp0(2), thereby sequentially selecting T-cell array and C-cell array. Since data latch LBL is not used, transfer circuits 304 and 305 are kept off.

The erase operation is performed for the entire cells in a selected region at a time. The erase-verify is performed for NAND blocks one by one in T-cell array or C-cell array. The entire word lines are applied with Vss, and the reference cell is made active with the reference word line RefWL raised, whereby the sense amplifier compares the cell current with the reference current to verify whether the cell threshold voltage is lowered to the lowest level L0 or not.

The NAND block, in which there is an insufficiently erased cell, is sensed as a cell current insufficiency state. At this time, the "PASS" flag, FINn−1="H", is not generated. The erase and erase-verify are repeatedly performed until the erase state is detected in the entire sense amplifiers.

(Verify-Write)

Write is so performed as to boost the threshold voltages of the erased cells through four steps vp1-vp3. To perform data write, write data are loaded in the data latches HBL, MBL and LBL. At the first step, there is no need of loading data in the data latches MBL and LBL because only the upper bit HB in the data latch HBL is used.

Figure 45:
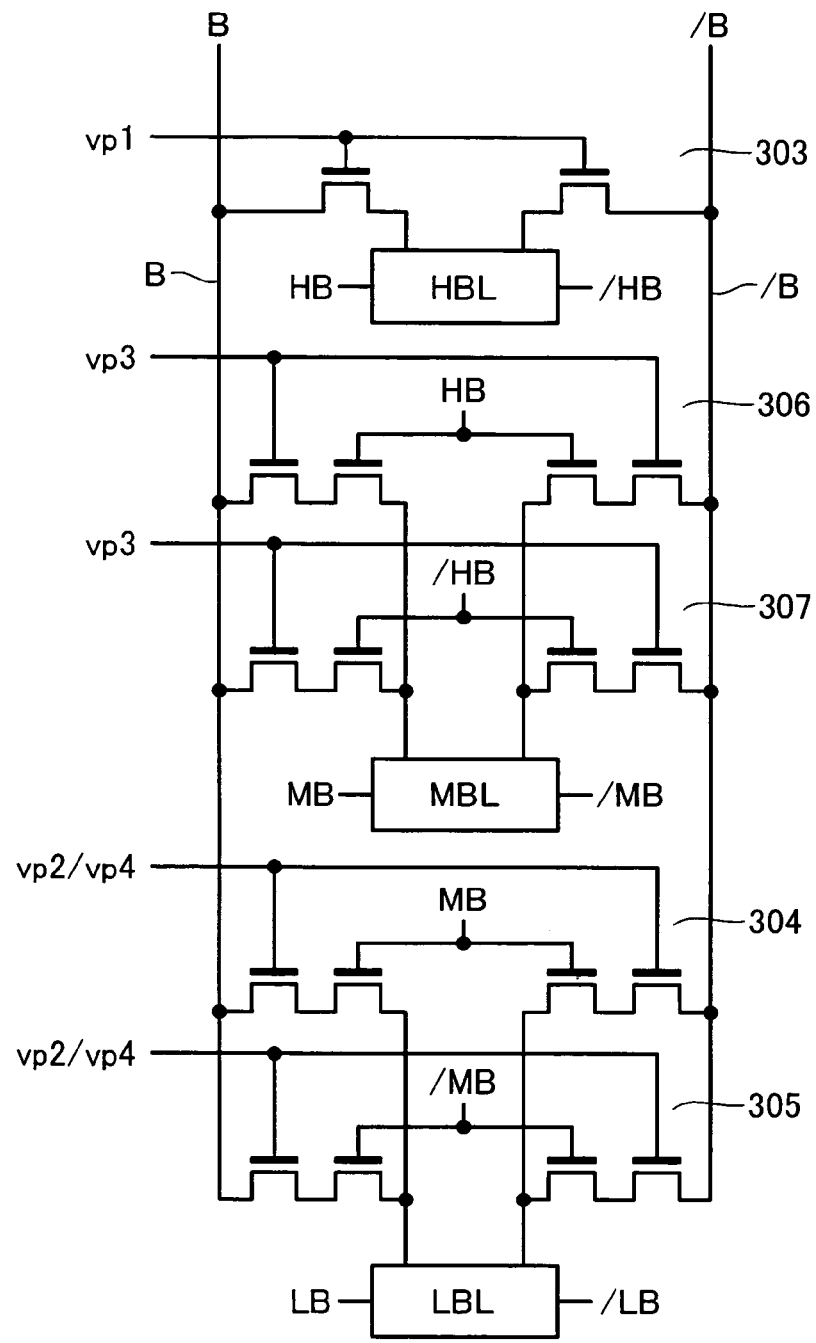
FIG. 45 shows the verify-write system thereof.

The main portion of the sense unit is the same as that in case of 4-value/pair cell scheme shown in FIG. 30. Therefore, in FIG. 45, there is shown only the data latch portion used in the write mode. Data of the data latch HBL is read to data nodes B and /B, and a bit line on "1" data side thereof is coupled to one input node of the sense amplifier SA; and the reference cell to the other input. A bit line coupled to the sense amplifier is discharged to Vss; and another bit line is charged-up to Vdd.

A certain verify voltage Px is applied to the word lines of selected pair cells; reference word line RefWL is set to be "H"; and the sense amplifier is activated, whereby verify operation is performed. After sensing, bit line levels are determined with signal /PRG="L".

Next, apply the write voltage Vpgm to the word lines TWL and CWL of the pair cell, and electron injection into the floating gate occurs in a cell coupled to the bit line, which is set to be Vss in accordance with write data, thereby boosting the threshold voltage.

The write-verify operation is performed as follows: Word lines TWL and CWL of the pair cell are applied with a certain verify voltage Px; and the reference word line RefWL is set to be "H", thereby activating the sense amplifier. As a result, a bit line is coupled to one input node of the sense amplifier in accordance with write data; and the reference cell is coupled to the other input, whereby the sense operation is performed in such a way that the cell current is compared with the reference current.

After the sensed data is determined, the control signal /PRG is set to be "L". If cell's threshold is insufficiently boosted, the sensed result makes the bit line be discharged; and the other bit line is pulled-up to Vdd.

If cell's threshold is sufficiently boosted, the bit line becomes Vdd while the other bit line also becomes Vdd in accordance with the latched data. With respect to the cell, the threshold voltage of which is sufficiently boosted, logic levels of the node B and OUT or the node /B and /OUT become complementary after sensing, and this state will be used for judging the write completion.

In case it is judged that the threshold voltage is insufficiently boosted, the sense amplifier state is kept as it is, and the write voltage Vpgm is applied to the word lines TWL and CWL of the pair cell, whereby the cell, which is coupled to the bit line set at Vss in accordance with the sensed data, will be written again.

The above-described operation will be repeatedly performed until the data write is completed in the entire sense amplifiers.

FIG. 47 shows write data determination processes through write steps. At the step vp1, based on HB data stored data latch HBL, T-cells and C-cells are selectively written into level L4 with the verify voltage P1. At the step vp2, level L1 is written into T-cells and C-cells to be written into levels L1-L3 with verify voltage P2. At this step vp2, data (1,1,1) and (0,0,0) are determined.

At the step vp3, level L2 is written into T-cells and C-cells to be written into levels L2-L3 with verify voltage P3. At this step vp3, data (1,1,0) and (0,0,1) are determined.

At the step vp4, T-cells and C-cells with level L2 are written in part into level L3 with verify voltage P4. At this step, data (0,1,0), (0,1,1), (1,0,1), (1,0,0) are determined.

The above-described verify voltages P1, P2, P3 and P4 are read voltages necessary for verifying the write states of levels L4, L1, L2 and L3, respectively. These verify voltages are set to be slightly higher than the upper limits of the data threshold distributions, respectively. It is the same as above-described 4-value/pair cell scheme that the read data is reversed to write data in logic. Therefore, it is required to constitute a suitable interface circuit for data transfer.

In the above-described five levels/cell-eight values/pair cell scheme, it is necessary for data read to be performed in order from the uppermost bit. In other words, while HB data is not read, it is impossible to read MB data. Similarly, while MB data is not read, it is impossible to read LB data. Therefore, there will be generated some restrictions for data read in an application system while the system configuration will be simplified.

On the other hand, it is often preferable for some systems that it is possible to read bit data in an optionally selected order. In case the read order is fixed as in the above-described system, if data storage is performed without consideration of the read order, data access time may be elongated. Data properties are not always predetermined. Therefore, the restriction of the read order may limit the memory application area.

In consideration of the above-described situations, other multi-value storage systems, in which there are no restrictions of the data read order, will be explained below with respect to 4-value/pair cell and 8-value/pair cell schemes.

[Three Levels/Cell-Four Values/Pair Cell Scheme (Part 3)]

Figure 48:
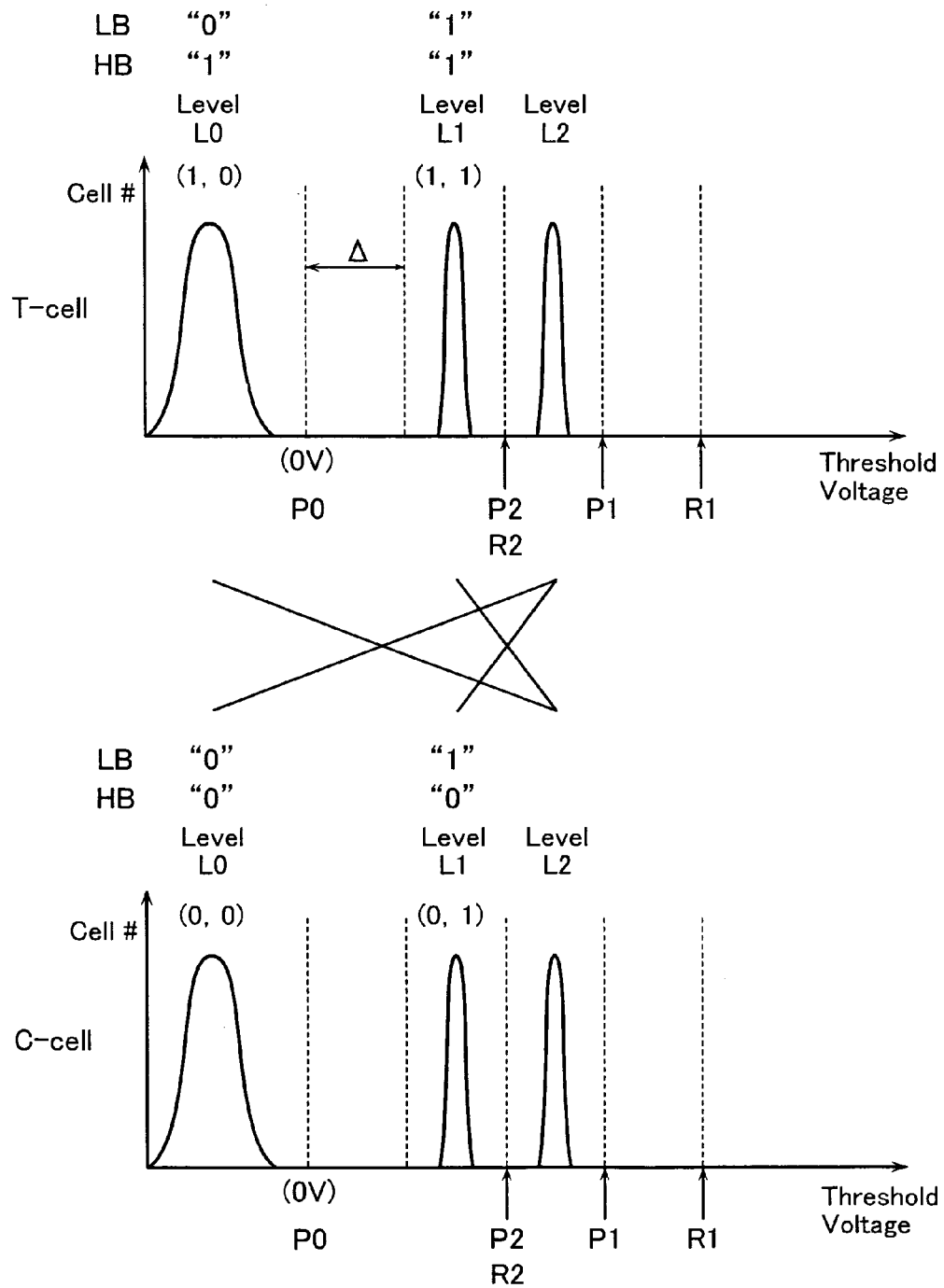
FIG. 48 shows data bit assignment in the three levels/cell-four values/pair cell scheme (part 3).

FIG. 48 shows a data bit assignment in the three levels/cell-four values/pair cell scheme (part 3), in which HB data and LB data may be read independently from each other. This is different from the data bit assignment in the above-described three levels/cell-four values/pair cell scheme (part 1) shown in FIG. 6 as follows:

The combination between the erase state of T-cell (level L0) and the uppermost level L2 of C-cell is defined as data (1,0); the combination between the middle level L1 T-cell and the uppermost level L2 of C-cell is defined as data (1,1); the combination between the erase state of C-cell (level L0) and the uppermost level L2 of T-cell is defined as data (0,0); and the combination between the middle level L1 of C-cell and the uppermost level L2 of T-cell is defined as data (0,1).

Suppose that data read is performed with three cycles t1, t2T and t2C on the same condition as in the above-described three levels/cell-four values/pair cell scheme (part 1). FIG. 49 shows read data in this case.

What is used in the data bits shown in FIG. 49 for reading the upper bit data HB and the lower bit data LB independently from each other is the number of data "1" or data "0". HB data, "1" or "0", is identical with the read data at the step t1. LB data is defined by evenness/oddness of the number of "1" data obtained through steps t2T and t2C. Therefore, HB data may be determined only with the step t1; and LB data may be determined only with the steps t2T and t2C.

Although the bit assignment of this three levels/cell-four values/pair cell scheme (part 3) is different from that in the above-described three levels/cell-four values/pair cell scheme (part 1), the data write sequence is the same as shown in FIG. 29, in which three steps vp0, vp1 and vp2 are used. At the first step vp0, all cells are set to be in the erased state (level L0). At the step vp1, T-cell and C-cell are partially written into the uppermost level L2, and at the step vp2, the remaining cells are partially written into the level L1.

[Five Levels/Cell-Eight Values/Pair Cell Scheme (Part 3)]

Figure 50:
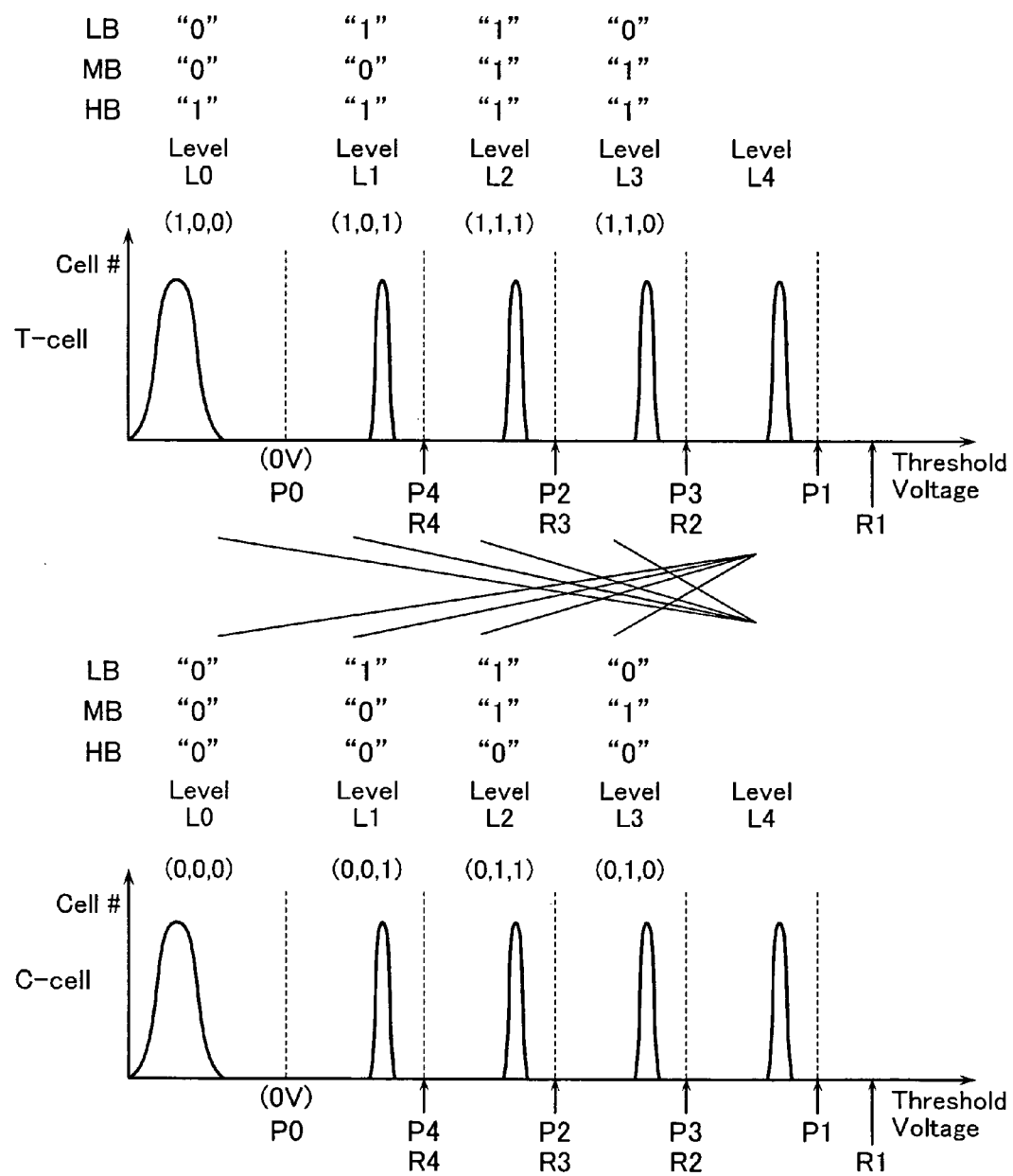
FIG. 50 shows data bit assignment in the five-levels/cell-eight values/pair cell scheme (part 3).

FIG. 50 shows a data bit assignment of the five levels/cell-eight values/pair cell scheme (part 3), in which HB, MB and LB data may be read independently from each other. This is different from the data bit assignment in the above-described five levels/cell-eight values/pair cell scheme (part 1) shown in FIG. 14 as follows:

The combinations between the uppermost level L4 of C-cell and levels L0, L1, L2 and L3 of T-cell are defined as data (1,0,0), (1,0,1), (1,1,1) and (1,1,0), respectively; the combinations between the uppermost level L4 of T-cell and levels L0, L1, L2 and L3 of C-cell are defined as data (0,0,0), (0,0,1), (0,1,1) and (0,1,0), respectively.

Suppose that data read is performed with seven cycles on the same condition as in the above-described five levels/cell-eight values/pair cell scheme (part 1). FIG. 51 shows read data in this case. In this case also, to read HB, MB and LB data independently from each other, the number of "1" data or "0" data is used.

"1" or "0" of HB data is identical with read data at the cycle t1. MB data is defined by evenness/oddness of the number of "1" data obtained through steps t3T and t3C. LB data is defined by evenness/oddness of the number of "1" data obtained through steps t2T, t2C, t4T and t4C. Therefore, HB data may be determined only with the step t1; MB data only with steps t3T and t3C; and LB data only with the steps t2T, t2C, t4T and t4C.

Figure 52:
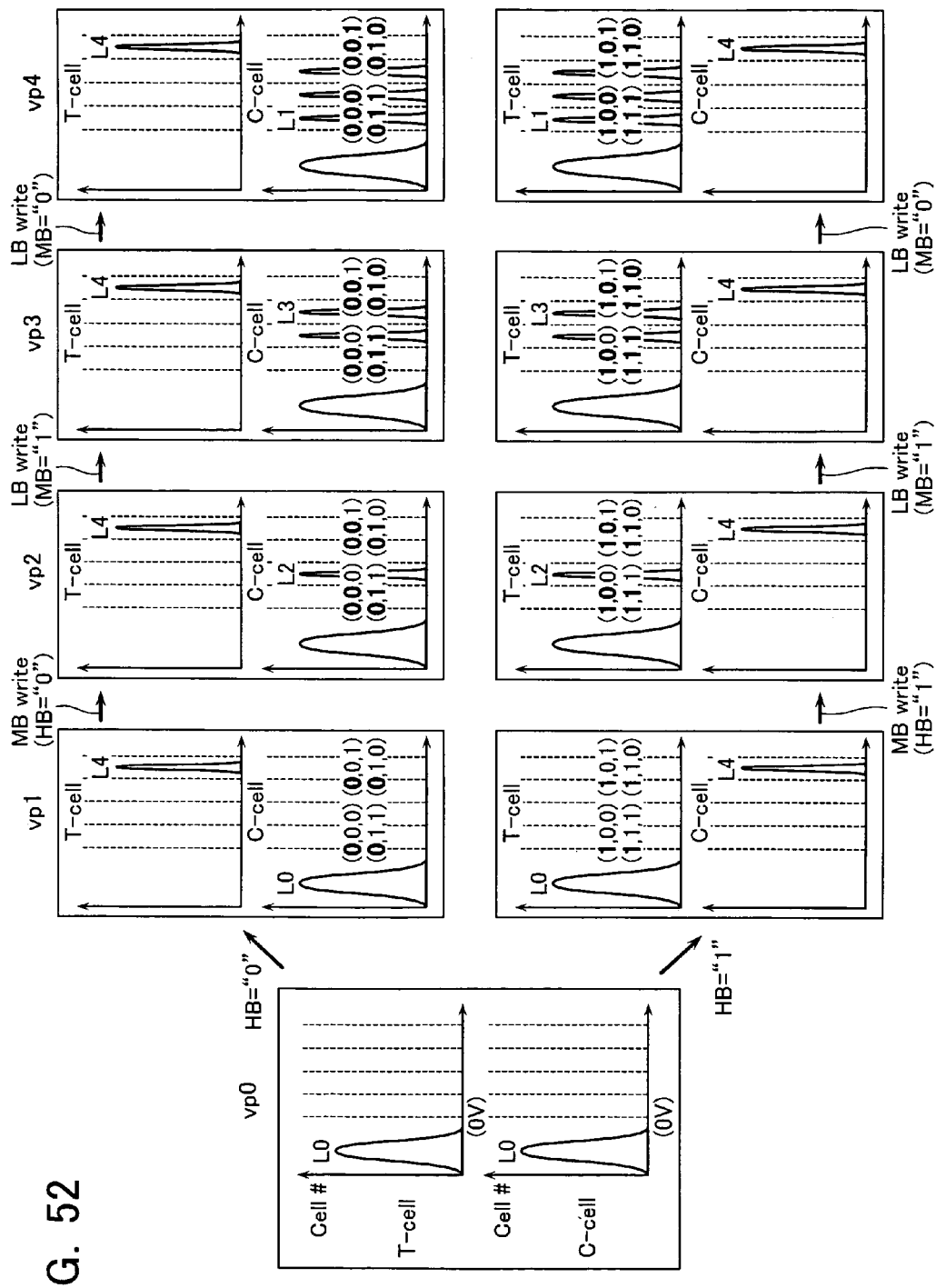
FIG. 52 shows the write sequence in the five-levels/cell-eight values/pair cell scheme (part 3).

The write sequence in this five levels/cell-eight values/pair cell scheme will be explained in brief with reference to FIG. 52.

Step vp0: At this verify-erase step, all cells constituting pair cells are set to be in the level L0. The erase method is the same as in the above-described 4-value/pair cell scheme, in which T-cell array and C-cell array are sequentially erased.

Step vp1: In accordance with loaded upper bit (HB) data, part of erased cells (i.e., T-cells in pair cells to be in HB="0" state; and C-cells in pair cells to be in HB="1"), are set to be in a threshold state of the uppermost level L4 serving as a basic level.

Step vp2: In accordance with HB data and the loaded middle bit (MB) data, part of cells with data level L0 are boosted in threshold to the third level L2 from the bottom, whereby MB data will be determined.

It is possible to put a read mode between the steps vp1 and vp2. Note here that the HB data stored the data latch is lost. Therefore, to restart the interrupted write step vp2, it is in need of: reading HB data, which has already been written in the cell array, from the cell array to store it in the data latch; and the MB data being externally loaded.

Step vp3: In accordance with HB and MB data and the loaded lower bit (LB) data, part of cells with the third data level L2 are boosted in threshold to the fourth level L3, so that LB data will be written into pair cells with MB="1".

It is possible to put a read mode between the steps vp2 and vp3. To restart the interrupted write step vp3, it is in need of: reading HB and MB data, which have already been written in the cell array, from the cell array to store them in the data latch; and the LB data being externally loaded.

Step vp4: In accordance with HB and MB data and the loaded lower bit (LB) data, part of cells with the erased level L0 are boosted in threshold to the level L1, so that LB data will be written into pair cells with MB="0".

It is possible to put a read mode between the steps vp3 and vp4. To restart the interrupted write step vp4, it is in need of: reading HB and MB data, which have already been written in the cell array, from the cell array to store them in the data latch; and the LB data being externally loaded.

[Data Latch System of the Three Levels/Cell-Four Values/Pair Cell Scheme (Part 3)]

Figure 53:
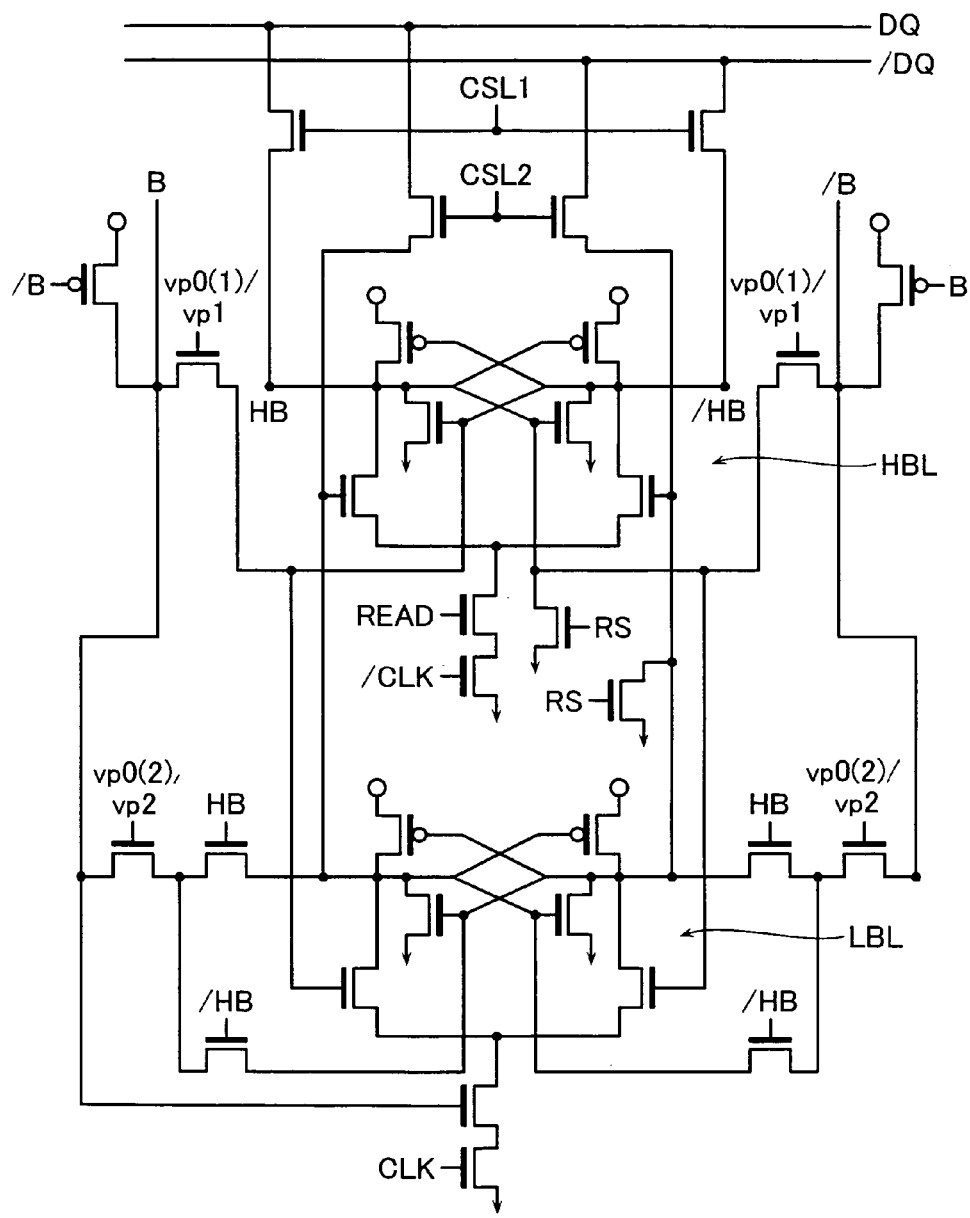
FIG. 53 shows the sense unit used in the three levels/cell-four values/pair cell scheme (part 3).

FIG. 53 shows a data latch system applied to the three levels/cell-four values/pair cell scheme (part 3), with which LB data may be read independently from the HB data by use of evenness/oddness of the number of data "1". The sense amplifier, output nodes of which are coupled to data nodes B and /B, and the reference current source coupled to it are the same as the above-described 4-value/pair cell scheme (part 1), so that they are omitted here.

As similar to the above-described 4-value/pair cell scheme (part 1), data latches HBL and LBL are prepared for loading HB and LB data, respectively. These data latches HBL and LBL are able to receive/transmit data from/to data lines DQ and /DQ in response to select signals CSL1 and CSL2.

These two data latches HBL and LBL are connected in subjection to each other to constitute a two-bit shift resister controlled with clocks CLK and /CLK for judging evenness/oddness of the number of "1" read data in a read mode. Data read operations through the read cycles t1, t2T and t2C will be explained below.

Data latches HBL and LBL are initialized with reset signal RS. Sensed data at the cycle t1 is loaded in data latch LBL with complementary clocks CLK="H" and /CLK="L" synchronized with the cycle t1, and then shifted to data latch HBL in response to /CLK="H". As a result, data in HBL is made identical with that in LBL.

That is, data in the data latch HBL becomes "0" or "1" in accordance with data "0" or "1" at the node B, and it becomes HB data as it is. This HB data may be output to data lines DQ, /DQ with the select signal CSL1.

Successively sensed data at cycles t2T and t2C are controlled with clocks CLK and /CLK, as similar as above-described, to be loaded in data latch LBL, and then transferred to data latch HBL. Therefore, when data "1" is sensed at either one of cycles t2T and t2C (i.e., the number of data "1" is odd), data latch HBL finally stores data "1". This designates LB="1".

When data "1" or data "0" is continuously sensed through cycles t2T and t2C (i.e., the number of data "1" is even), data in the data latch HBL becomes finally "0". This designates LB="0".

As described above, and as shown in FIG. 55, the upper bit (HB) data may be read at cycle t1; and the lower bit (LB) data may be read at cycles t2T and t2C independently from the HB data.

At the verify-erase time, data latches HBL and LBL store the same data. At a timing of timing signal vp0(1), data in the data latch HBL is output to data nodes B and /B. At a timing of the following timing signal vp0(2), in accordance with data held in data latch HBL, complementary data is output from the data latch LBL to the nodes B and /B. With these complementary data, T-cell array and C-cell array are sequentially selected to be subjected to erase-verify. This is the same as in the above-described three levels/cell-four values/pair cell (part 1) scheme.

Verify-write is performed based on HB data and LB data stored in data latches HBL and LBL, respectively, as basically the same as shown in FIG. 29 in such a manner that HB data write and LB data write are performed at steps vp1 and vp2, respectively, after the step vp0.

HB data write at timing vp1 is the same as in the 4-value/pair cell (part 1) scheme. LB data write at timing vp2 is different from the 4-value/pair cell (part 1) scheme with respect to data transferring from data latch LBL to data nodes B and /B.

The detail will be explained below. In the data bit assignment of the 4-value/pair cell (part 1) shown in FIG. 6, LB="0" write and LB="1" write are for boosting the threshold voltage of T-cell and C-cell to level L1, respectively. By contrast, in the data bit assignment shown in FIG. 48, LB data write at timing vp2 is for boosting the threshold voltage of both of T-cell and C-cell to level L2 with LB="1". At this time, what distinguishes T-cell from C-cell is HB data.

Therefore, at the LB data write time, to invert the data state set at the nodes B and /B in accordance with HB data, data transferring from the data latch LBL to the data nodes B, /B is controlled in accordance with HB data determined in the data latch. With this transfer control, data (1,1) write and (0,1) write are simultaneously performed at the step vp2.

FIG. 56 shows that HB data and LB data are determined at steps vp1 and vp1, respectively, as shown in bold strokes.

Although HB data and LB data may be, as described above, read independently from each other, data write must be complied with the order of HB data and LB data. In the write mode, it is able to interrupt the data write sequence with a read operation after HB data write ends. In this case, if read out HB data is that of the suspended page, it will be stored in the data latch LBL as it is, and the suspended LB write may be restarted.

In case the data write sequence is interrupted with a different page read operation, it is required for data write restart to perform such a dummy read operation that HB data of the suspended write page is read from the cell array to be held in the data latch HBL.

[Data Latch System of the Five Levels/Cell-Eight Values/Pair Cell Scheme (Part 3)]

Figure 54:
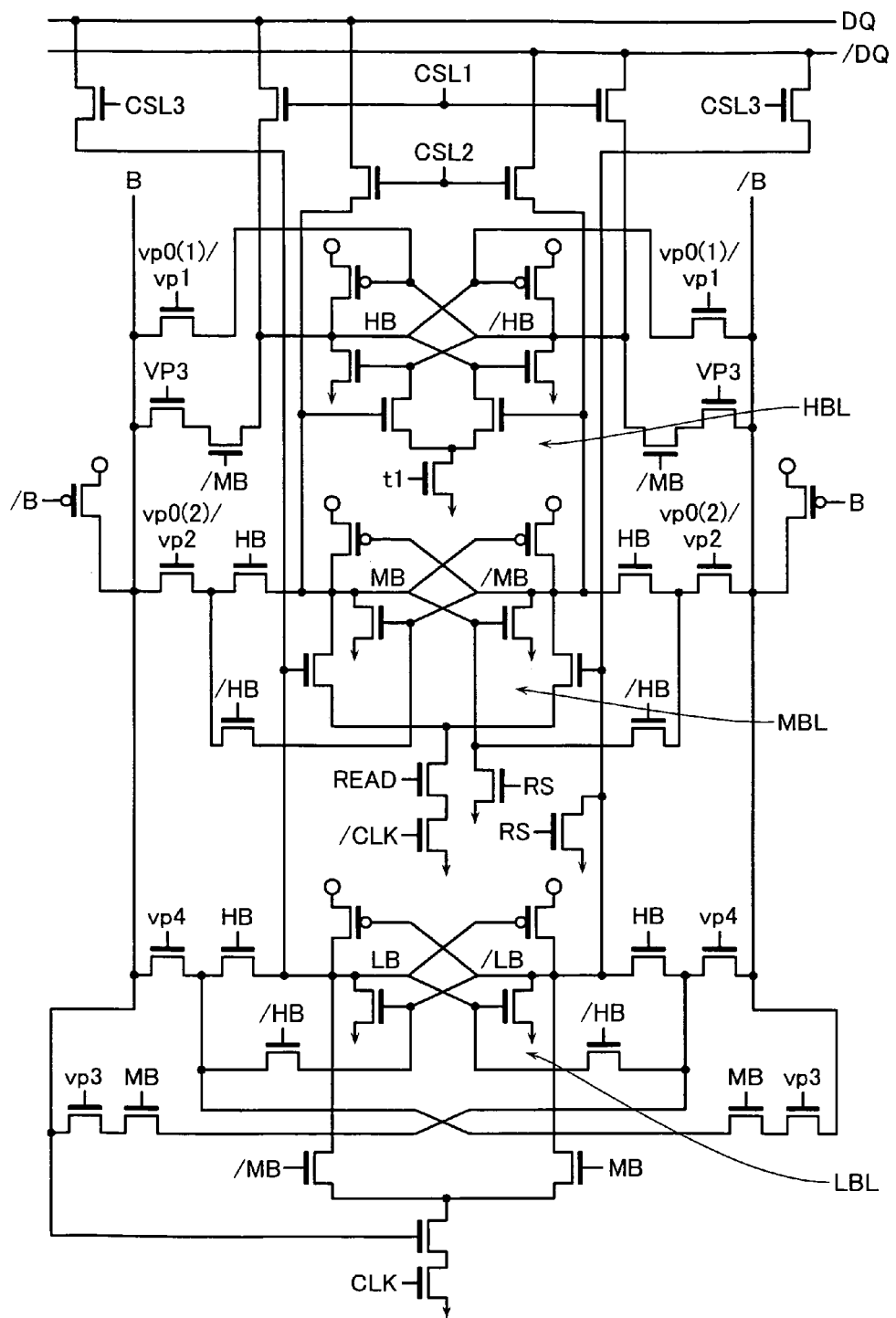
FIG. 54 shows the sense unit used in the five levels/cell-eight values/pair cell scheme (part 3).

FIG. 54 shows the data latch system in the five levels/cell-eight values/pair cell scheme (part 3). Three data latches HBL, MBL and LBL are prepared because it is in need of storing three bit data in the write mode. These data latches HBL, MBL and LBL are able to receive/transmit data from/to data lines DQ and /DQ in response to select signals CSL1, CSL2 and CSL3, respectively.

To perform HB data read, for example, data latch HBL is used. That is, clock signal CLK is generated once at the read step t1, HB data is sensed and stored in data latch HBL.

To read MB data and LB data, two data latches are, as similar to the above-described three levels/cell-four values/pair cell scheme (part 3), connected to constitute a shift resister for judging evenness/oddness of the number of "1" data. In the example shown in FIG. 54, two lower data latches are used to constitute the shift register.

To read MB data, data latches MBL and LBL are initialized. In case the number of "1" data obtained through steps t3T and t3C is even, MBL="0" is obtained while in case the number of "1" data is odd, MBL="1" is obtained. Data of this data latch MBL becomes MB data as it is.

To do LB data read, data latches MBL and LBL are initialized, and it is detected whether the number of data "1" obtained through steps t2T, t2C, t4T and t4C is even or odd. In case of evenness, MBL="0" while in case of oddness, MB="1", and these become LB data "0" and "1", respectively, as it is.

In FIG. 55, the above-described data read operation is shown together with that in the three levels/cell-four values/pair cell scheme (part 3).

In the data write mode, HB, MB and LB data are loaded in data latches HBL, MBL and LBL, respectively. HB data write at step vp1 is, as the same as in the 4-value data/pair cell scheme (part 1 or 3), is performed based on the HB data held in data latch HBL.

At MB data write timing, as similar to the case of the 4-value data/pair cell scheme (part 3), it is required to invert the data state set at data nodes B and /B in accordance with HB data held in data latch HBL. For this purpose, HB data must be predetermined. LB data write is performed, as described above, as follows: LB data in case of MB="1" is written at step vp3; and LB data in case of MB="0" is written at step vp4.

MB data and LB data are for obtaining the same threshold voltage levels in T-cell and C-cell, and bit data thereof also are the same. Therefore, data transfer circuits are configured in such a manner that data in data latch MBL or LBL may be transferred to nodes B and /B as it is or as reversed in logic.

Data "1" cell at step vp4 has a threshold level higher than verify level P4 just after the data write at step vp3, so that write completion will be judged at the verify time. Therefore, there is no need of preparing a data path for transferring data inverted in accordance with MB data.

FIG. 57 shows data determined states through the above-described write steps, in which determined data are designated in bold strokes.

In the verify-erase mode, the same data are stored in data latches HBL and MBL, and the cell array selection is performed based on these data as similar to the above-described 4-value/pair cell scheme (part 3). That is, T-cell array and C-cell array are sequentially selected to be subjected to erase at steps vp0(1) and vp0(2), respectively.

As described above, according to the data latch system shown in FIG. 54, two data latches constitutes a shift register for judging evenness/oddness of the number of data "1" in the read mode so that MB data and LB data may be read out independently from each other. Further, with three data latches, data write may be performed in the order of HB, MB and LB data.

After HB data write completion or MB data write completion, it will be permitted that a read operation of the written data interrupts the write sequence. After the read operation, the suspended data write may be restarted. Note here that in case the interrupting read operation is for a page different from the write page, it is required to read HB data or MB data from the cell array for restarting the data write.

[Application Devices]

As an embodiment, an electric card using the non-volatile semiconductor memory devices according to the above-described embodiments of the present invention and an electric device using the card will be described bellow.

Figure 58:
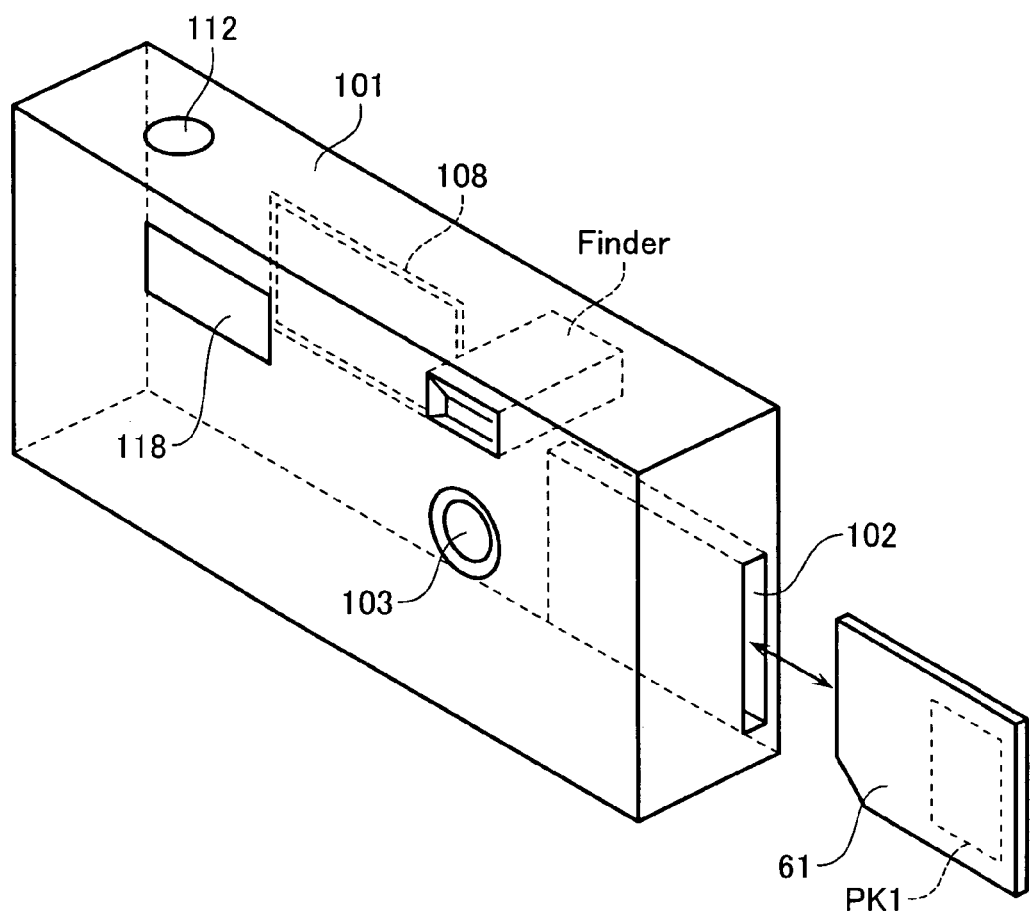
FIG. 58 shows another embodiment applied to a digital still camera.

FIG. 58 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 59:
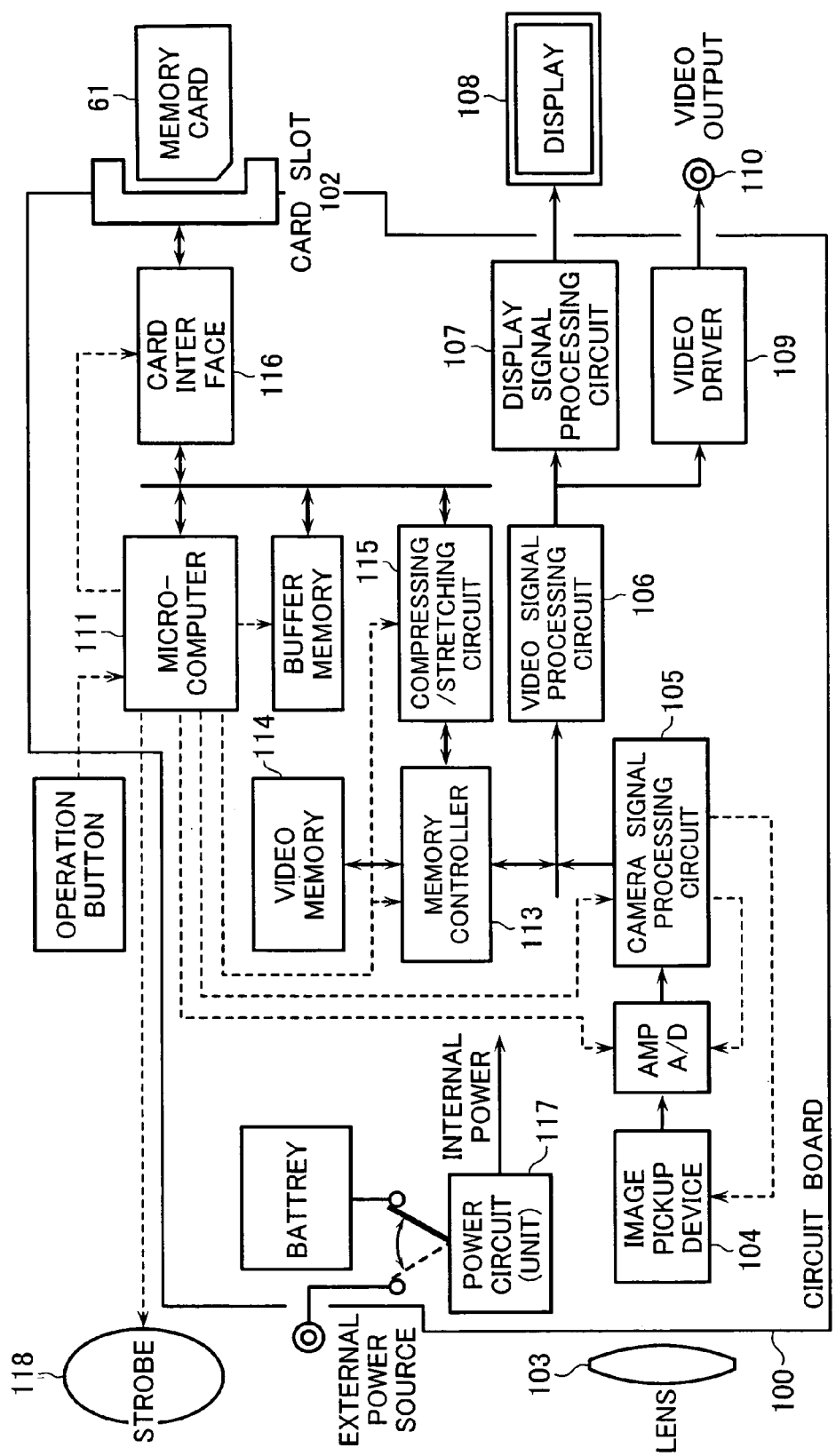
FIG. 59 shows the internal configuration of the digital still camera.
Figure 60A:
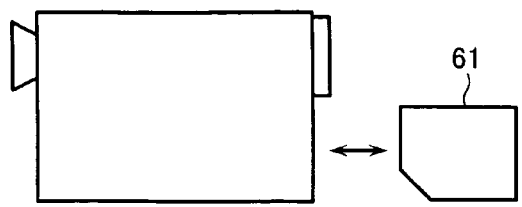
FIGS. 60A to 60J show other electric devices to which the embodiment is applied.
Figure 60F:
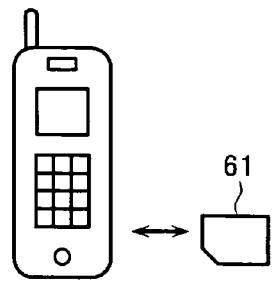
Figure 60B:
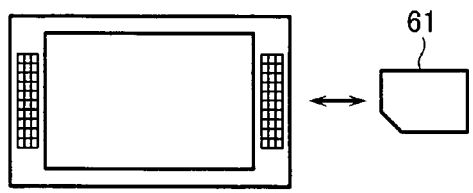
Figure 60G:
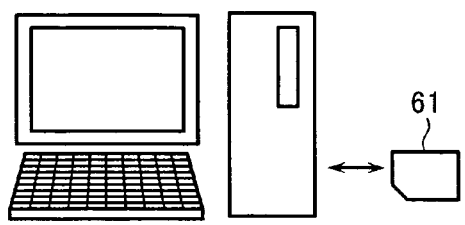
Figure 60C:
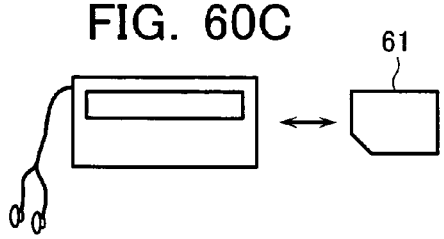
Figure 60H:
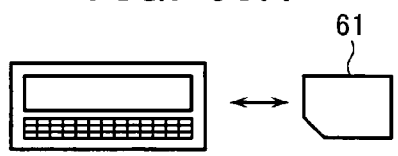
Figure 60D:
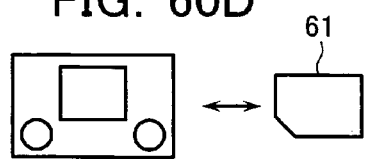
Figure 60I:
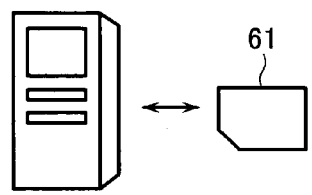
Figure 60E:
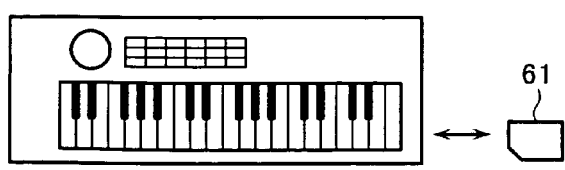
Figure 60J:
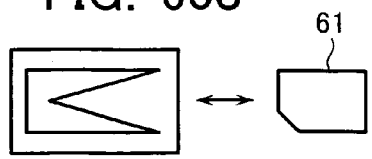

FIG. 59 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 60A to 60J, as well as in portable electric devices. That is, the electric card can also be used in a video camera shown in FIG. 60A, a television set shown in FIG. 60B, an audio apparatus shown in FIG. 60C, a game apparatus shown in FIG. 60D, an electric musical instrument shown in FIG. 60E, a cell phone shown in FIG. 60F, a personal computer shown in FIG. 60G, a personal digital assistant (PDA) shown in FIG. 60H, a voice recorder shown in FIG. 60I, and a PC card shown in FIG. 60J.

This invention is not limited to the above-described embodiments. For example, while it has been explained that the memory cell has a stacked gate structure of a floating gate and a control gate, other memory cells may be used such as SONOS (Silicon Oxide Nitride Oxide Silicon) structure, MONOS (Metal Oxide Nitride Oxide Silicon) structure and the like. Further, the present invention is adapted to other non-volatile memories, each of which stores physical quantity levels rather than threshold levels based on charge quantities, such as phase change memory PRAM (Phase Change RAM), resistance memory RRAM (Resistance RAM), ovonic memory OUM (Ovonic Unified Memory), magnetoresistive memory MRAM (Magnetoresistive RAM), ferroelectric memory and the like. Further, it will be understood by those skilled in the art that various changes in form and detail may be made without departing from the spirit, scope, and teaching of the invention.

What is claimed is:

1. A semiconductor memory device comprising:
a memory cell array with memory cells arranged therein, each memory cell being settable to have one of plural physical quantity levels, simultaneously selected two memory cells constituting a pair cell serving as a data storage unit; and
a read/write circuit for reading data from the memory cell array and writing data into the memory cell array, wherein
each memory cell is set to have one in N (where N is an integer equal to three or more) physical quantity levels, a highest or a lowest level of the N physical quantity levels is defined as a base level, and a first of the cells of the pair cell is set to the base level and a second of the cells of the pair cell is set to a different level than the base level in two memory cells therein, thereby storing M-value data defined by $M=2^n$ (where $M=2(N-1)$ and "n" is an integer equal to two or more), the M-value data being defined by such M combination states that differences of the base level of the first of the cells and plural other levels of the second of the cells are different from each other.

2. The semiconductor memory device according to claim 1, wherein
each memory cell is an electrically rewritable and non-volatile memory cell, in which one selected in three threshold levels is set, and
each pair cell has different threshold levels in two memory cells therein, and stores 4-value data defined by such four combination states that the differences between threshold levels are different from each other.

3. The semiconductor memory device according to claim 2, wherein
when the three threshold levels are L0, L1 and L2 (where L0<L1<L2), and the 4-value data is expressed as (HB, LB) with an upper bit HB and a lower bit LB,
the pair cell stores one of data (1,1) defined by that first and second memory cells therein are written to have the threshold levels L0 and L2, respectively; data (1,0) defined by that first and second memory cells therein are written to have the threshold levels L1 and L2, respectively; data (0,1) defined by that first and second memory cells therein are written to have the threshold levels L2 and L1, respectively; and data (0,0) defined by that first and second memory cells therein are written to have the threshold levels L2 and L0, respectively.

4. The semiconductor memory device according to claim 3, wherein
the read/write circuit for reading the 4-value data read comprises:
first means for applying a first read voltage higher than threshold level L2 to the first and second memory cells, thereby reading out the upper bit data based on the cell current difference;

second means for applying the first read voltage to one of the first and second memory cells and a second read voltage to the other, the second read voltage being set between threshold levels L1 and L2, thereby reading out the lower bit data based on the cell current difference in case of the upper bit data is in a first logic state; and third means for applying read voltages to the first and second memory cells as reversed to those in the second means, and reading out the lower bit data based on the cell current difference in case of the upper bit data is in a second logic state.

5. The semiconductor memory device according to claim 3, wherein the read/write circuit for writing the 4-value data write comprises:

first means for selectively making memory cells with threshold level L0 have threshold level L2 based on the upper bit data; and second means for selectively making memory cells with threshold level L0 have threshold level L1 based on the upper and lower bit data.

6. The semiconductor memory device according to claim 1, wherein each memory cell is an electrically rewritable and nonvolatile memory cell, in which one selected in five threshold levels is set, and each pair cell has different threshold levels in two memory cells therein, and stores 8-value data defined by such eight combination states that the differences between the threshold levels are different from each other.

7. The semiconductor memory device according to claim 6, wherein when the five threshold levels are L0, L1, L2, L3 and L4 (where L0<L1<L2<L3<L4), and the 8-value data is expressed as (HB,MB,LB) with an upper bit HB, a middle bit MB and a lower bit LB, the pair cell stores one of data (1,1,1) defined by that first and second memory cells therein are written to have threshold levels L0 and L4, respectively; data (1,1,0) defined by that first and second memory cells therein are written to have threshold levels L1 and L4, respectively; data (1,0,1) defined by that first and second memory cells therein are written to have threshold levels L2 and L4, respectively; data (1,0,0) defined by that first and second memory cells therein are written to have threshold levels L3 and L4, respectively; data (0,0,0) defined by that first and second memory cells therein are written to have threshold levels L4 and L0, respectively; data (0,0,1) defined by that first and second memory cells therein are written to have threshold levels L4 and L1, respectively; data (0,1,0) defined by that first and second memory cells therein are written to have threshold levels L4 and L2, respectively; and data (0,1,1) defined by that first and second memory cells therein are written to have threshold levels L4 and L3, respectively.

8. The semiconductor memory device according to claim 7, wherein the read/write circuit for reading the 8-value data read comprises:

first means for applying a first read voltage higher than threshold level L4 to the first and second memory cells, and reading out the upper bit data based on the cell current difference;

second means for applying the first read voltage to one of the first and second memory cells and a second read voltage to the other, the second read voltage being set between threshold levels L3 and L4, and reading out one of data (1,0,0) and (0,1,1) based on the cell current difference;

third means for applying read voltages to the first and second memory cells as reversed to those in the second means, and reading out the other of data (1,0,0) and (0,1,1) based on the cell current difference;

fourth means for applying the first read voltage to one of the first and second memory cells and a third read voltage to the other, the third read voltage being set between threshold levels L2 and L3, and reading out one of data (1,0,1) and (0,1,0) based on the cell current difference;

fifth means for applying read voltages to the first and second memory cells as reversed to those in the fourth means, and reading out the other of data (1,0,1) and (0,1,0) based on the cell current difference;

sixth means for applying the first read voltage to one of the first and second memory cells and a fourth read voltage to the other, the fourth read voltage being set between threshold levels L1 and L2, and reading out one of data (1,1,1), (1,1,0) and data (0,0,0), (0,0,1) based on the cell current difference; and seventh means for applying read voltages to the first and second memory cells as reversed to those in the sixth means, and reading out the other of data (1,1,1), (1,1,0) and data (0,0,0), (0,0,1) based on the cell current difference.

9. The semiconductor memory device according to claim 7, wherein the read/write circuit for writing the 8-value data write comprises:

first means for selectively making erased memory cells with threshold level L0 have threshold level L4 in accordance with the upper bit data;

second means for selectively making the erased memory cells with threshold level L0 have threshold level L1 in accordance with the upper, middle and lower bit data;

third means for selectively making the memory cells with threshold level L1 have threshold level L2 in accordance with the upper, middle and lower bit data; and fourth means for selectively making the memory cells with threshold level L1 have threshold level L3 in accordance with the upper, middle and lower bit data.

10. The semiconductor memory device according to claim 1, wherein the memory cell array includes first and second cell arrays, in each of which bit lines and word lines are disposed as intersected each other, and memory cells are disposed at crossings thereof, two memory cell selected from the first and second cell arrays, respectively, with a pair of bit lines and a pair of word lines selected in the first and second cell arrays, respectively, constituting a pair cell, and a plurality of sense units are disposed between the first and second cell arrays, each of which includes a current detecting type of differential amplifier for detecting a cell current difference of a pair cell to sense data thereof.

11. The semiconductor memory device according to claim 10, wherein each of the sense units includes a reference cell, which is coupled to one input node of the differential amplifier to drain a reference current serving for detecting that one memory cell in a pair cell becomes to have a certain physical quantity level.

12. The semiconductor memory device according to claim 11, wherein each of the sense units includes "n" data latches, which are selectively coupled to the differential amplifier or the bit lines and store n-bit data of M-value data ($M=2^n$).

13. The semiconductor memory device according to claim 12, wherein at a verify-write time, externally supplied write data are loaded in the corresponding data latches, and a bit line selected in the first and second cell arrays is coupled to one input node of the differential amplifier in accordance with the bit data stored in the data latches; and the reference cell to the other input node.

14. The semiconductor memory device according to claim 12, wherein at a verify-erase time, the first and second cell arrays are sequentially selected in accordance with complementary data loaded in two data latches, a bit line in the selected cell array being coupled to one input node of the differential amplifier; and the reference cell to the other input node.

* * * * *